United States Patent
Yamazaki et al.

(10) Patent No.: US 7,465,647 B2
(45) Date of Patent: Dec. 16, 2008

(54) MANUFACTURING METHOD OF THIN FILM INTEGRATED CIRCUIT DEVICE AND MANUFACTURING METHOD OF NON-CONTACT TYPE THIN FILM INTEGRATED CIRCUIT DEVICE

(75) Inventors: Shunpei Yamazaki, Setagaya (JP); Toru Takayama, Atsugi (JP); Yohei Kanno, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/896,509

(22) Filed: Sep. 4, 2007

(65) Prior Publication Data

US 2008/0009125 A1    Jan. 10, 2008

Related U.S. Application Data

(62) Division of application No. 11/007,645, filed on Dec. 9, 2004, now Pat. No. 7,271,076.

(30) Foreign Application Priority Data

Dec. 19, 2003    (JP) .............................. 2003-423888

(51) Int. Cl.
    *H01L 21/46* (2006.01)
    *H01L 21/30* (2006.01)
    *H01L 21/762* (2006.01)
(52) U.S. Cl. ................. 438/458; 438/459; 438/455; 438/464; 438/149; 257/E21.568; 257/E21.569; 257/E21.57
(58) Field of Classification Search ............. 438/455, 438/458, 459, 464, 149; 257/E21.568, E21.569, 257/E21.57
See application file for complete search history.

(56) References Cited

U.S. PATENT DOCUMENTS 5,206,749 A    4/1993    Zavracky et al.
(Continued)

FOREIGN PATENT DOCUMENTS

EP    0 607 709 A1    7/1994
(Continued)

OTHER PUBLICATIONS

"Sense of Crisis" is a Trigger: Ignited Evolution of a Sesame-Grain Sized Chip, Nikkei Electronics, Nov. 18, 2002, p. 67-76.
(Continued)

*Primary Examiner*—Luan Thai
(74) *Attorney, Agent, or Firm*—Eric J. Robinson; Robinson Intellectual Property Law Office, P. C.

(57) ABSTRACT

With non-contact and contact IC chips becoming common, it is necessary to mass-produce enormous amount of IC chips, which are utilizable for human beings, animals and plants, commercial products, banknotes, and the like, at low cost. For example, it is necessary to manufacture IC chips to be applied to commercial products, banknotes, and the like at a cost of 1 to several yen per IC chip, preferably, at a cost less than 1 yen, and it is desired to realize a structure of an IC chip that can be mass-produced at low cost and a manufacturing process of the IC chip.

A method of manufacturing a thin film integrated circuit device according to the present invention includes steps of forming a peel-off layer over a thermally oxidized silicon substrate, forming a plurality of thin film integrated circuit devices over the peel-off layer with a base film interposed therebetween, forming a groove between the plurality of thin film integrated circuit devices, and separating the plurality of thin film integrated circuit devices by introducing one of a gas and a liquid including halogen fluoride into the groove to remove the peel-off layer.

28 Claims, 35 Drawing Sheets

U.S. PATENT DOCUMENTS

| | | | |
|---|---|---|---|
| 5,317,236 | A | 5/1994 | Zavracky et al. |
| 5,376,561 | A | 12/1994 | Vu et al. |
| 5,378,536 | A | 1/1995 | Miller et al. |
| 5,389,438 | A | 2/1995 | Miller et al. |
| 5,757,456 | A | 5/1998 | Yamazaki et al. |
| 5,821,138 | A | 10/1998 | Yamazaki et al. |
| 5,834,327 | A | 11/1998 | Yamazaki et al. |
| 5,888,858 | A | 3/1999 | Yamazaki et al. |
| 5,985,740 | A | 11/1999 | Yamazaki et al. |
| 6,043,800 | A | 3/2000 | Sptizer et al. |
| 6,063,654 | A | 5/2000 | Ohtani |
| 6,100,562 | A | 8/2000 | Yamazaki et al. |
| 6,118,502 | A | 9/2000 | Yamazaki et al. |
| 6,127,199 | A | 10/2000 | Inoue et al. |
| 6,165,824 | A | 12/2000 | Takano et al. |
| 6,168,829 | B1 | 1/2001 | Russ et al. |
| 6,180,439 | B1 | 1/2001 | Yamazaki et al. |
| 6,348,368 | B1 | 2/2002 | Yamazaki et al. |
| 6,376,333 | B1 | 4/2002 | Yamazaki et al. |
| 6,465,287 | B1 | 10/2002 | Yamazaki et al. |
| 6,479,333 | B1 | 11/2002 | Takano et al. |
| 6,521,511 | B1 | 2/2003 | Inoue et al. |
| 6,627,518 | B1 | 9/2003 | Inoue et al. |
| 6,700,631 | B1 | 3/2004 | Inoue et al. |
| 6,781,152 | B2 | 8/2004 | Yamazaki |
| 6,814,832 | B2 | 11/2004 | Utsunomiya |
| 6,821,553 | B2 | 11/2004 | Miyashita et al. |
| 6,825,072 | B2 | 11/2004 | Yamazaki et al. |
| 6,858,518 | B2 | 2/2005 | Kondo |
| 6,887,650 | B2 | 5/2005 | Shimoda et al. |
| 6,893,503 | B1 | 5/2005 | Ohnuma et al. |
| 6,911,358 | B2 * | 6/2005 | Azami et al. ............... 438/150 |
| 7,045,438 | B2 | 5/2006 | Yamazaki et al. |
| 7,056,381 | B1 | 6/2006 | Yamazaki et al. |
| 7,060,153 | B2 | 6/2006 | Yamazaki et al. |
| 7,091,070 | B2 | 8/2006 | Imai et al. |
| 7,122,445 | B2 | 10/2006 | Takayama et al. |
| 7,129,145 | B2 | 10/2006 | Kawamura et al. |
| 7,166,500 | B2 | 1/2007 | Yamazaki et al. |
| 7,244,662 | B2 | 7/2007 | Kondo |
| 2001/0053559 | A1 | 12/2001 | Nagao et al. |
| 2003/0032210 | A1 | 2/2003 | Takayama et al. |
| 2005/0037529 | A1 | 2/2005 | Nagao et al. |
| 2005/0042798 | A1 | 2/2005 | Nagao et al. |
| 2005/0148121 | A1 | 7/2005 | Yamazaki et al. |
| 2005/0287846 | A1 | 12/2005 | Dozen et al. |
| 2007/0161159 | A1 | 7/2007 | Yamazaki et al. |
| 2007/0166954 | A1 | 7/2007 | Yamazaki et al. |

FOREIGN PATENT DOCUMENTS

| | | |
|---|---|---|
| EP | 0 607 709 B1 | 6/1998 |
| EP | 1 193 759 | 4/2002 |
| JP | 0 443 263 | 8/1991 |
| JP | 04-351685 | 12/1992 |
| JP | 06-299127 | 10/1994 |
| JP | 07-030209 | 1/1995 |
| JP | 08-096959 | 4/1996 |
| JP | 09-063770 | 3/1997 |
| JP | 2992092 | 12/1999 |
| JP | 2001-030403 | 2/2001 |
| JP | 2001-260580 | 9/2001 |
| JP | 2001-272923 | 10/2001 |
| JP | 2003-203898 | 7/2003 |
| JP | 2003-209073 | 7/2003 |
| WO | WO 03/010825 | 2/2003 |
| WO | WO 2005/057658 | 6/2005 |

OTHER PUBLICATIONS

Search Report of Mar. 15, 2005, European Patent Office for PCT/JP2004/018978.

Written Opinion of Mar. 15, 2005, European Patent Office for PCT/JP2004/018978.

Search Report of Mar. 22, 2005, European Patent Office for PCT/JP2005/001541.

Written Opinion of Mar. 22, 2005, European Patent Office for PCT/JP2005/001541.

T. Shimoda et al., *Surface Free Technology by Laser Annealing (SUFTLA)*, IEDM 99: Technical Digest of Intrenational Electron Devices Meeting, 1999, pp. 289-292.

\* cited by examiner

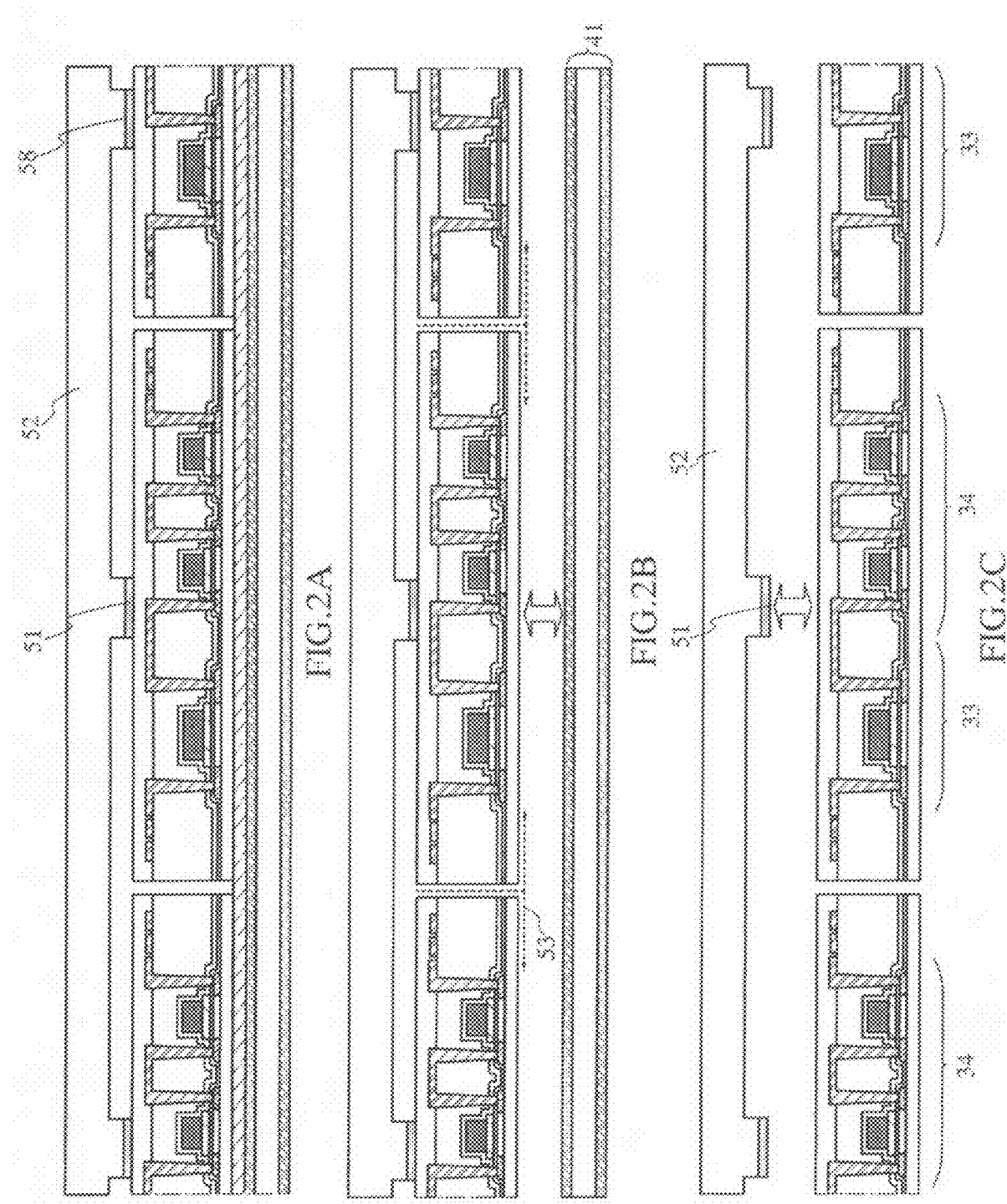

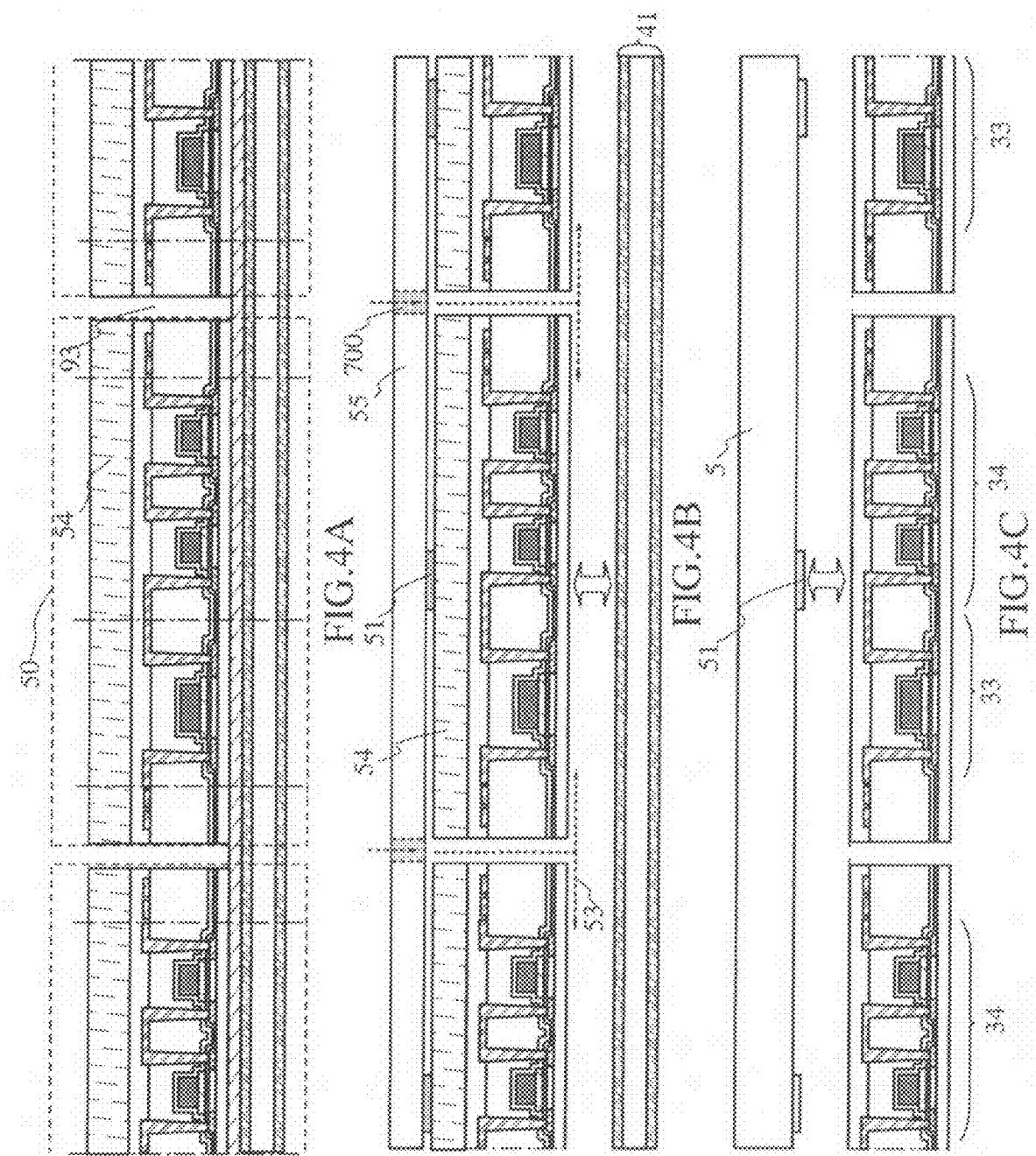

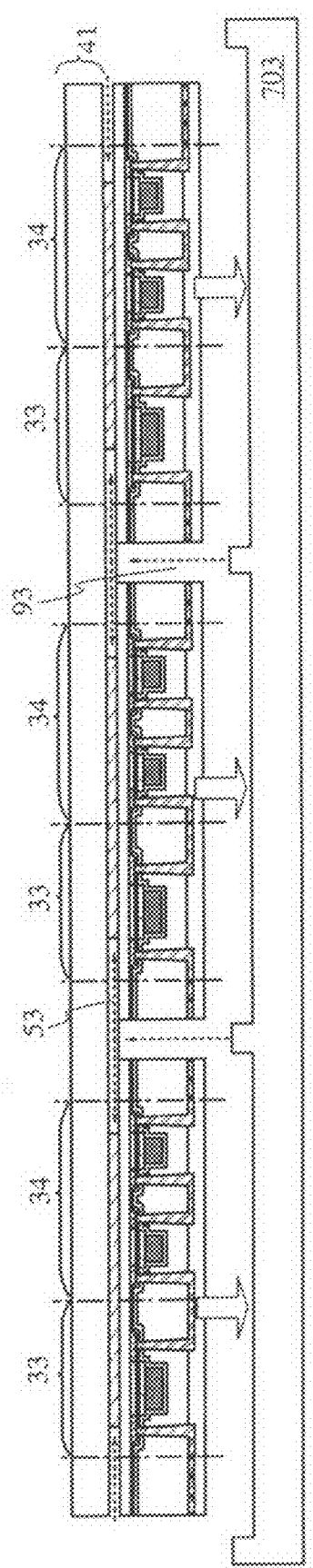
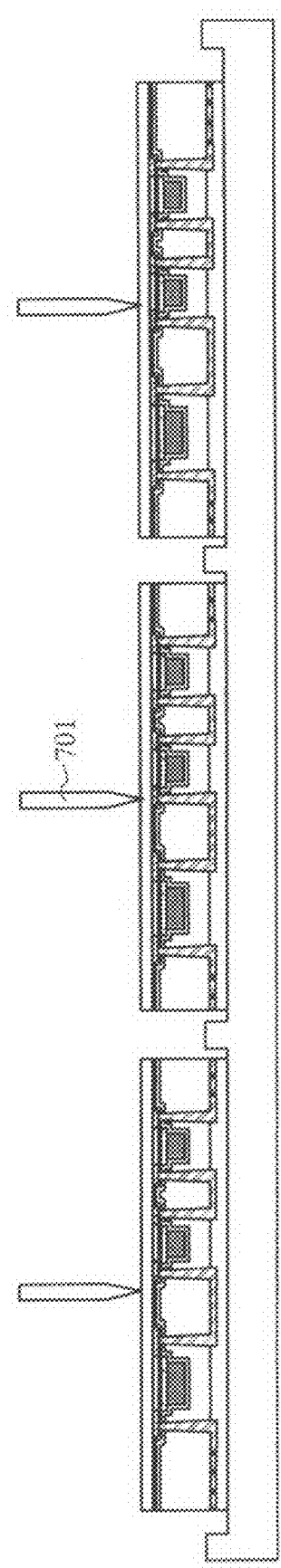
FIG.34A
FIG.34B

MANUFACTURING METHOD OF THIN FILM INTEGRATED CIRCUIT DEVICE AND MANUFACTURING METHOD OF NON-CONTACT TYPE THIN FILM INTEGRATED CIRCUIT DEVICE

BACKGROUND OF THE INVENTION

1. Field of the Invention

The present invention relates to a method of manufacturing a thin film integrated circuit device carrying a thin film integrated circuit that has an element such as a memory and a microprocessor (CPU: Central Processing Unit) and is thin and flexible like paper, and to a non-contact type thin film integrated circuit device including the thin film integrated circuit and an antenna, which is used mainly for a card, a tag, a label, or the like for identifying human beings, animals and plants, commercial products, banknotes, and the like.

2. Description of the Related Art

Recently, in all kinds of industrial worlds such as food industry and manufacturing industry, calls have been heightened for strengthening safety and management systems of commercial products, and therewith, the amount of information on the commercial products are increasing. However, the current information on a commercial product is just information such as a country of manufacture, a manufacturer, or an item number, mainly provided by ten and several figures of a bar cord, and the mount of information is quite small. Further, in the case of using a bar-code, carrying out by hand item by item makes reading of the bar-code require long time. Consequently, instead of the bar-code system, an automatic recognition technique by a non-contact IC type tag utilizing an electromagnetic wave, referred to as RFID (Radio Frequency Identification), has been attracting attention.

In addition, in order to ensure safety (for example, a place of origin, or whether infected with an infectious disease or not) of animals and plants, a system is becoming common, in which IC chips are directly implanted into bodies of the animals and plants to obtain and manage information on the animals and plants by an information reading device (reader) outside the bodies.

In addition, the number of cards being carried per person has been recently growing, and above all, a non-contact IC card communicating by utilizing electromagnetic field is becoming common, for example, in forms of electronic money and electronic tickets. Further, in the fact of an increasing number of cases such as heinous crimes and disappearances, an ID (identification) card or the like is becoming common, with which whereabouts of an individual particularly such as an infant, a pupil, an old man, or a tourist can be exactly grasped constantly so that the individual can be recognized to reduce possibility of getting involved in an accident.

Furthermore, in order to prevent duplication or abuse when banknotes, coins, securities, tickets, or the like are forged or stolen, a technique of implanting IC chips into them is becoming common (Non-Patent Document 1).

(Non-Patent Reference 1) Nikkei Electronics (Nikkei Business Publications, Inc.) published on Nov. 18, 2002, pp. 67-76

SUMMARY OF THE INVENTION

However, with non-contact type and contact type IC chips becoming common, it is necessary to mass-produce enormous amount of IC chips, which are utilizable for human beings, animals and plants, commercial products, banknotes, and the like, at the lowest cost. For example, it is necessary to manufacture IC chips to be applied to commercial products, banknotes, and the like at a cost of 1 to several yen per IC chip, preferably, at a cost less than 1 yen, and it is desired to realize a structure and a manufacturing process of an IC chip that can be mass-produced at low cost.

As far as it goes, in order to manufacture an IC chip, a method is used, in which a plurality of thin film integrated circuits are formed on a silicon wafer, and the thin film integrated circuits are separated by polishing and removing the silicon wafer (referred to as backgrinding). However, since the silicon wafer is all polished and removed in spite of its expensive price, the increase in manufacturing cost is unavoidable. Further, since the integrated circuit using the silicon wafer is thick, depressions and projections are produced in a surface to limit the range of choice for designing in the case of mounting into a product container.

Alternatively, as a method in which a substrate is not polished or removed, there is a method in which a substrate on which a plurality of thin film integrated circuits are formed is stressed to separate the substrate physically. However, this method has a possibility that the substrate is not completely separated due to a factor such as stress distribution of a thin film formed on the substrate.

In consideration of these situations, it is an object of the present invention to provide a structure of a thin film integrated circuit and an IC chip, which can be mass-produced at low cost and has a quite thin thickness unlike the conventional silicon wafer, and a manufacturing process of the thin film integrated circuit device or an IC chip.

1) A method of manufacturing a thin film integrated circuit device according to the present invention includes steps of forming a peel-off layer over a semiconductor substrate with an oxide surface, forming a plurality of thin film integrated circuit devices on the peel-off layer with a base film interposed therebetween, forming a groove in a boundary region between the plurality of thin film integrated circuit devices, and separating the plurality of thin film integrated circuit devices by introducing one of a gas and a liquid including halogen fluoride into the groove to remove the peel-off layer.

The thin film integrated circuit device in the specification has a function of identifying human beings, animals and plants, commercial products, banknotes, and the like or storing information on them, which is also referred to as an ID chip (Identification Chip), an IDF (ID Flexible) chip, an IC chip, simply an IC, or a semiconductor device.

Above all, the thin film integrated circuit device communicating with an external reading/writing device (reader/writer) through a transmitting and receiving portion (an antenna or an antenna circuit) incorporated into the thin film integrated circuit device by utilizing electromagnetic field is referred to as a non-contact type thin film integrated circuit device or a radio-frequency chip. By communicating between the thin film integrated circuit device and the reader/writer, information on a commercial product or the like into which the thin film integrated circuit device is incorporated can be recognized, updated, or managed, for example.

On the other hand, the thin film integrated circuit device sending and receiving data by electrically connecting a connecting terminal provided with an IC card and a reader/writer of a terminal device is referred to as a contact type thin film integrated circuit device, for example, according to a method such as a magnetic stripe type or an IC module contact type. In the case of a contact type IC, a structure that has no antenna provided may be employed. The thin film integrated circuit devices include a thin film integrated circuit device that has a structure in which the magnetic stripe type or IC module contact type thin film integrated circuit device and the non-contact type thin film integrated circuit device are combined.

The semiconductor substrate with an oxide surface indicates a substrate such as a single-crystal silicon substrate or a silicon wafer with silicon oxide formed at a surface thereof. By a thermal treatment for the silicon wafer, silicon oxide can be formed at the surface. Hereinafter, the substrate with silicon oxide formed at the surface is referred to as a thermally oxidized silicon substrate or a thermally oxidized silicon wafer. Although all surfaces or at least one surface of the semiconductor substrate may be oxidized, it is preferable that all of the surfaces are oxidized to form silicon oxide, in order not to damage the semiconductor substrate when halogen fluoride such as $ClF_3$ is used to separate the thin film integrated circuit device from the substrate later. This is because silicon oxide, silicon nitride, silicon oxynitride or silicon nitride oxide (SiOxNy or SiNxOy (x>y)) is hardly etched by halogen fluoride such as $ClF_3$ while silicon is selectively etched. The semiconductor forming the semiconductor substrate is not limited to silicon.

The peel-off layer is a layer provided between the semiconductor substrate and the thin film integrated circuit device, and the thin film integrated circuit device can be separated from the substrate by later removing the peel-off layer. As the peel-off layer, a layer including silicon (Si) as its main component, such as amorphous silicon, polycrystalline silicon, single-crystal silicon, SAS (semi-amorphous silicon (also referred to as micro-crystalline silicon)), can be used. Since silicon is selectively etched by halogen fluoride such as $ClF_3$ (chlorine trifluoride) or the like, the use of the including silicon as its main component as the peel-off layer makes it easily possible to remove the peel-off layer by the gas or liquid including $ClF_3$.

The base film is provide between the peel-off layer and the thin film integrated circuit device, and has a role of protecting the thin film integrated circuit device from etching by halogen fluoride such as $ClF_3$. As described above, silicon oxide, silicon nitride, or silicon oxynitride is hardly etched by halogen fluoride such as $ClF_3$ while silicon is selectively etched. Accordingly, since the base film including silicon oxide, silicon nitride, or silicon oxynitride is hardly etched while the peel-off layer is etched with time, damage to the thin film integrated circuit device can be prevented.

As long as a material that is etched by halogen fluoride such as $ClF_3$ is used for the peel-off layer and a material that is not etched by halogen fluoride such as $ClF_3$ is used for the base film, the combination of the peel-off layer and the base film is not limited to the above-mentioned materials, and can be appropriately selected.

As the halogen fluoride, a gas of the $ClF_3$ or the like mixed with nitrogen may be used. $ClF_3$ (boiling point: 11.75° C.) can be liquid depending on a temperature of a reaction field, and wet etching can also be employed in such a case. $ClF_3$ can be produced through a process of $Cl_2\ (g)+3F_2\ (g)\rightarrow 2ClF_3\ (g)$ by reacting chlorine with fluorine at a temperature of 200° C. or more. As long as the above-mentioned peel-off layer is etched and the above-mentioned base film is not etched, the etchant is not limited to $ClF_3$.

The groove in a boundary region between the thin film integrated circuit devices can be formed by a method such as dicing, scribing, or etching with the use of a mask. In the case of dicing, a blade dicing method using a dicing system (dicer) is commonly used. The blade is a grinding stone into which a diamond abrasive is implanted, which has a width of about 30 to 50 μm. By rapidly spinning this blade, the thin film integrated circuit devices are separated from each other. In the case of scribing, diamond scribing or laser scribing is typically used. In the case of etching, after forming a mask pattern according to processes of exposure and development, the devices can be separated from each other by etching such as dry etching or wet etching. In dry etching, an atmospheric plasma method may be used.

As the mask for forming the groove by etching, an insulating film such as polyimide, acrylic, polyamide, a resist, benzocyclobutene, or a material that has a skeleton formed by a bond of silicon (Si) and oxygen (O) and includes at least hydrogen as a substituent or at least one selected from the group consisting of fluoride, an alkyl group, and aromatic hydrocarbon as the substituent. The insulating film may be removed after etching, or may be left as a protective film of a semiconductor element.

2) A method of manufacturing a thin film integrated circuit device according to the present invention includes steps of forming a peel-off layer over a semiconductor substrate with an oxide surface, forming a plurality of thin film integrated circuit devices on the peel-off layer with a base film interposed therebetween, forming a groove in a boundary region between the plurality of thin film integrated circuit devices, temporarily bonding a jig to upper portions of the plurality of thin film integrated circuit devices, separating the plurality of thin film integrated circuit devices by introducing a gas and a liquid including halogen fluoride into the groove to remove the peel-off layer, and removing the jig bonded to the plurality of thin film integrated circuit devices.

The jig indicates a supporting substrate for temporarily fixing the plurality of thin film integrated circuit devices in order to prevent thin film integrated circuit devices from separating discretely after removing the peel-off layer. The jig is formed for each of the elements in which a plurality of the thin film integrated circuit devices are accumulated in the horizontal or vertical direction. It is preferable that the jig has a structure with projecting portions provided like a comb in order to make it easier to introduce the gas or liquid including halogen fluoride later. However, a flat jig may be used. As the jig, for example, a glass substrate, a quartz substrate, and a stainless (SUS) substrate including silicon oxide, which is not damaged by halogen fluoride, as its main component can be used. As long as a material that is not damaged by halogen fluoride is used, the jig is not limited to these substrates. In addition, an adhesive material for temporary bonding is provided between the jig and the thin film integrated circuit device.

The jig may have an opening provided for introducing halogen fluoride such as $ClF_3$ may be provided such that the thin film integrated circuit devices can be prevented from dropping. This shortens tact time when the peel-off layer is removed.

As the adhesive material, a material that has adhesive force (adhesion) to be reduced or lost by UV light irradiation can be used. Alternatively, an adhesive material that can be attached and detached repeatedly, which is used for products such as "Post-it"™ manufactured by THREE M INNOVATIVE PROPERTIES and "NOTESTIX"™ manufactured by MOORE BUSINESS FORMS INC., may be used. Of course, as long as the jig can be easily removed, the adhesive material is not limited to these materials. Alternatively, an adsorption method such as electrostatic chuck or vacuum chuck can also be employed appropriately.

The structure except the jig and the adhesive material is based on the above-mentioned method 1) according to the present invention.

3) A method of manufacturing a thin film integrated circuit device according to the present invention includes steps of forming a plurality of thin film integrated circuit devices on a SOI substrate including an upper single-crystal silicon layer, a layer including one of silicon oxide and silicon nitride, and a lower single-crystal silicon layer, forming a groove in a boundary region between the plurality of thin film integrated circuit devices, and separating the plurality of thin film integrated circuit devices by introducing one of a gas and a liquid including halogen fluoride into the groove to etch at least a surface of the lower single-crystal silicon layer near the thin film integrated circuit devices.

The SOI (Silicon On Insulator) substrate is a substrate that has single-crystal silicon formed on an insulating film. A SOI substrate including an upper single-crystal silicon layer, a layer including one of silicon oxide and silicon nitride, and a lower single-crystal silicon layer is used here. For example, a substrate such as a SIMOX substrate formed by a technique of "SIMOX (Separation by Implantation of Oxygen)" (a technique of forming an oxide insulating layer and a silicon crystal thin film thereon by implanting an oxygen molecule into a slightly deeper portion from the surface of silicon crystal and oxidizing the silicon crystal at high temperatures) or a laminated substrate can be used. Of course, in addition, various kinds of SOI substrates, such as substrates manufactured by recrystallization, epitaxial growth, and FIPOS, can be used.

The method 3) according to the present invention also has a feature that it is unnecessary to form a peel-off layer or a base film unlike the method 1) or 2) according to the present invention. It can be daringly said that the single-crystal silicon substrate (that is, the lower single-crystal silicon layer that is far from the side where a semiconductor element such as a TFT (thin film transistor) is manufactured) functions as a peel-off layer and the layer including one of silicon oxide and silicon nitride functions as a base film. The upper single-crystal silicon layer (the single-crystal silicon layer near the side where the semiconductor element such as a TFT is manufactured) is subjected to patterning into an island shape to form the semiconductor element. As the semiconductor element, in addition to a TFT, a memory, a diode, a photoelectric conversion device, a resistor element, a coil, a capacitor, and an inductor, for example, can be cited as typical examples.

The lower single-crystal silicon layer (This layer is also referred to as "a single-crystal silicon substrate".) has a thickness on the order of several tens to several hundreds μm, which is quite thick as a peel-off layer. Therefore, before introducing the halogen fluoride such as $ClF_3$, the rear surface of the lower single-crystal silicon layer may be polished (backgrinding) to make the substrate thinner. Alternatively, when the substrate is separated only by the halogen fluoride without the polishing of the rear surface, a large part of the substrate is left without being etched by the halogen fluoride. This substrate can be used again by polishing a surface thereof by a method such as CMP shown in FIG. 6A.

In the case of the method 3) according to the present invention, it is preferable to provide a jig for temporarily fixing the thin film integrated circuit devices in the same way as in the method 2) described above in order to prevent thin film integrated circuit devices from separating discretely after removing the peel-off layer (the whole of the single-crystal silicon substrate or the surface near the thin film integrated circuit devices). The method for providing the jig is based on the method 2) described above. In addition, a method of manufacturing a thin film integrated circuit incorporated into the thin film integrated circuit device is based on any of the methods 1) and 2) described above.

In any of the methods 1) to 3) described above, after forming the thin film integrated circuit devices, a heat-resistant insulating film or tape may be formed, or an insulating film or tape may be formed for protecting the plurality of thin film integrated circuit devices when the groove is formed. The insulating film or tape is effective particularly in the case of heating halogen fluoride gas to perform etching like low pressure CVD. As a material for the insulating film or tape, for example, a material that has a skeleton formed by a bond of silicon and oxygen and includes at least hydrogen as a substituent or at least one selected from the group consisting of fluoride, an alkyl group, and aromatic hydrocarbon as the substituent, that is, heat-resistant organic resins such as siloxane resin and heat-resistant inorganic materials can be used. In addition, materials such as polyimide resins and acrylic resins, which have heat resistance, can be used. As the insulating film or tape for protecting the plurality of thin film integrated circuit devices, for example, a material that can be removed easily by a method such as UV (ultraviolet) irradiation can be used.

4) A method of manufacturing a non-contact thin film integrated circuit device according to the present invention includes steps of forming a peel-off layer on a semiconductor substrate with an oxide surface, forming a plurality of thin film integrated circuit devices over the peel-off layer with a base film interposed therebetween, forming a groove in a boundary region between the plurality of thin film integrated circuit devices, separating the plurality of thin film integrated circuit devices by introducing one of a gas and a liquid including halogen fluoride into the groove to remove the peel-off layer, forming an antenna around the separated thin film integrated circuit device.

The antenna communicates, that is, exchanges radio waves, with a reader/writer, and is connected to an integrated circuit such as a thin film integrated circuit. The antenna may be formed before or after a process of forming a thin film integrated circuit such as a TFT, or in the process. Alternatively, the antenna formed separately may be connected to the thin film integrated circuit. For example, the antenna can be formed with forming a gate electrode layer of a TFT. As the antenna, there are a coiled (spiral) antenna shown in FIGS. 7A to 7B and a closed-loop coil shown in FIGS. 24A to 24C, or the like.

As a material to be used for the antenna, an element selected from the group consisting of Ag, Au, Al, Cu, Zn, Sn, Ni, Cr, Fe, Co, and Ti, and an alloy including the element can be used. However, the material is not limited to these. In the case of separately forming the antenna, the antenna may be formed so that a part or whole of the thin film integrated circuit is wrapped by a substrate on which the antenna is formed. In this case, it is preferable to use a material that has flexibility such as plastics, that is a flexible material as the substrate. In this case, an anisotropic conductive material and a known bonding method may be used to connect the antenna with the thin film integrated circuit.

When the thin film integrated circuit such as a TFT, which is incorporated into the thin film integrated circuit device, is formed, it is preferable to provide a jig for temporarily fixing the thin film integrated circuit devices in order to prevent thin film integrated circuit devices from separating discretely after removing the peel-off layer. The method for providing the jig is based on the method 2) described above. In addition, the rest of the method of manufacturing non-contact type the thin film integrated circuit device is based on any of the methods 1) to 3) described above.

Further, a SOI substrate such as a SIMOX substrate may be used as a substrate to omit forming the peel-off layer and the base film. This method is based on the method 3) described above. In addition, the rest of the method of manufacturing non-contact type the thin film integrated circuit device is based on any of the methods 1) to 3) described above.

The thin film integrated circuit device and the non-contact type thin film integrated circuit device manufactured according to the present invention can be incorporated into, for example, ID tags, ID cards, various commercial products, banknotes, and coins. In the case of incorporating the thin film integrated circuit device into an object such as a coin or a medal, one of components of the coin may also have a function as an antenna. In this case, as a material for forming the antenna or the coin, an element selected from the group consisting of Ag, Au, Al, Cu, Zn, Sn, Ni, Cr, Fe, Co, and Ti, and an alloy including the element can be used. However, the material is not limited to these.

While a method of forming a plurality of thin film integrated circuit devices on a silicon wafer and separating the thin film integrated circuit devices by polishing and removing the silicon wafer is conventionally used, the present invention, by employing a chemical method using halogen fluoride when a plurality of thin film integrated circuit devices are separated from a substrate over which the thin film integrated circuit devices are formed, makes it possible to manufacture thin film integrated circuit devices at low cost. When a plurality of thin film integrated circuit devices are formed on a silicon wafer and separated by the chemical method according to the present invention, the silicon wafer is damaged. However, by oxidizing a surface of a silicon wafer in advance for insulation, the substrate to be peeled (thermally oxidized silicon substrate) is not damaged, but can be used again, which leads to reduction in cost.

Of SOI substrates according to the present invention, a SIMOX substrate, for example, is generally more expensive than a silicon wafer. However, when the present invention is applied, the number of processes can be reduced since it is unnecessary to form a peel-off layer or a base film. In addition, since a single-crystal silicon substrate to serve as a peel-off layer is thick, the single-crystal silicon substrate can be used again after separating thin film integrated circuit devices by halogen fluoride.

Also as compared with a physical method in which a substrate on which a plurality of thin film integrated circuit devices are formed is stressed to peel the substrate physically, since a chemical method using halogen fluoride is employed when a plurality of thin film integrated circuit devices are separated from a substrate over which the thin film integrated circuit devices are formed, the separation can be surely performed the according to the present invention.

Further, in the case of forming a base film or a heat-resistant insulating film (protective film) to cover the thin film integrated circuit devices, the thin film integrated circuit devices can be protected in the process of peeling the substrate with halogen fluoride. Then, thin film integrated circuit devices showing stable characteristics can be formed.

Further, by bonding a jig temporarily to fix each of the thin film integrated circuit devices in the process of peeling the substrate with halogen fluoride, the thin film integrated circuit devices can be prevented from separating discretely after removing the peel-off layer In this case, when a material that has adhesive force (adhesion) to be reduced or lost by UV light irradiation is used as a temporary adhesive material, the jig can be removed easily from the thin film integrated circuit devices after peeling the substrate.

Further, by using laser scribing or dicing for forming the groove, the groove can be formed with accuracy of about 10 μm in the case of laser scribing or 80 μm in the case of dicing, and thus, the substrate can be utilize effectively. Alternatively, in the case of etching with an insulating as a mask, the thin film integrated circuit devices can be protected later in a process by leaving the insulating film.

As described above, according to the present invention, a thin film integrated circuit to be used for a thin film integrated circuit device, and thus a thin film integrated circuit device and commercial products using the thin film integrated circuit device can be mass-produced at low cost with a higher yield and throughput.

BRIEF DESCRIPTION OF THE DRAWINGS

In the accompanying drawings:

FIGS. 2A to 2C are diagrams for describing the manufacturing process of the thin film integrated circuit device according to the present invention (thermally oxidized silicon substrate);

FIGS. 4A to 4C are diagrams for describing a manufacturing process of a thin film integrated circuit device according to the present invention (resist residue);

FIGS. 34A and 34B are diagrams for describing a manufacturing process of a thin film integrated circuit device according to the present invention (using a tray)

DETAILED DESCRIPTION OF THE INVENTION

Embodiment modes and embodiments of the present invention will be described below with reference to the drawings. However, the present invention can be implemented in various different conditions, and it is to be understood that various changes and modifications will be apparent to those skilled in the art. Therefore, unless otherwise such changes and modifications depart from the scope of the present invention, they should be construed as being included therein. For example, any of the embodiment modes and embodiments can be appropriately combined to implement the present invention. Therefore, the embodiment modes and embodiments are not intended as a definition of the limits of the invention. In addition, through the drawings, like portions are denoted by like numerals and will not be further explained.

Embodiment Mode 1

Figure 1A:
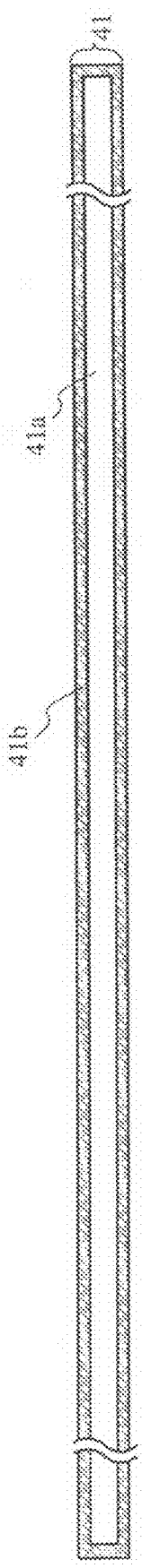
FIGS. 1A to 1C are diagrams for describing a manufacturing process of a thin film integrated circuit device according to the present invention (thermally oxidized silicon substrate)

A thin film integrated circuit device and manufacturing method thereof according to the present invention will be described with reference to mainly FIGS. 1A to 1C, FIGS. 2A to 2C, and FIGS. 3A and 3B. First, a silicon wafer 41a is prepared, and an oxide film 41b (silicon oxide film) is formed at a surface of the silicon wafer 41a by performing a thermal treatment to obtain a thermally oxidized silicon substrate 41 (FIG. 1A). As a method for the thermal treatment, a thermal treatment at 800 to 1200° C. (preferably at about 900° C. or 1150° C.) may be performed, which, however, is not limited to these temperatures.

Although all surfaces or at least one surface of the semiconductor substrate may be oxidized, it is preferable that all of the surfaces are oxidized to form silicon oxide, in order not to damage the semiconductor substrate when halogen fluoride such as $ClF_3$ is used to separate a thin film integrated circuit device from the substrate later. This is because silicon oxide, silicon nitride, silicon oxynitride is hardly etched by halogen fluoride such as $ClF_3$ while silicon is selectively etched. The semiconductor forming the semiconductor substrate is not limited to silicon.

Instead of the semiconductor substrate with the oxide surface, a substrate with a nitride or oxynitride surface may be used. For example, a substrate such as a single-crystal silicon substrate or thermally oxidized silicon substrate with a surface into which a nitride ion is implanted may be used. Also, a substrate including a metal such as a stainless substrate (SUS substrate), which has a surface on which an insulating film such as silicon oxide or silicon nitride is formed, may be used.

Next, a peel-off layer 43 is formed on the thermally oxidized silicon substrate 41. Here, an a-Si film (amorphous silicon film) with a film thickness of 500 nm is formed by sputtering. As the peel-off layer, in addition to amorphous silicon, a layer including silicon as its main component, such as polycrystalline silicon, single-crystal silicon, or SAS, can be used. The peel-off layer may be formed by a method such as plasma CVD instead of sputtering. The peel-off layer may be formed to be thinner than 500 nm.

Next, a base film 44 is formed on the peel-off layer 43. Here, a $SiO_2$ film with a film thickness of 100 nm (1000 Å) is formed by sputtering. The base film 44 has a role of protecting a thin film integrated circuit from halogen fluoride such as $ClF_3$. Therefore, another material may be used as long as the material has this function. For example, materials such as silicon nitride and silicon oxynitride can be used. Alternatively, films respectively including the above-mentioned materials may be laminated to form the base film 44. Instead of sputtering, a method such as plasma CVD may be used to form the base film 44.

Figure 18:
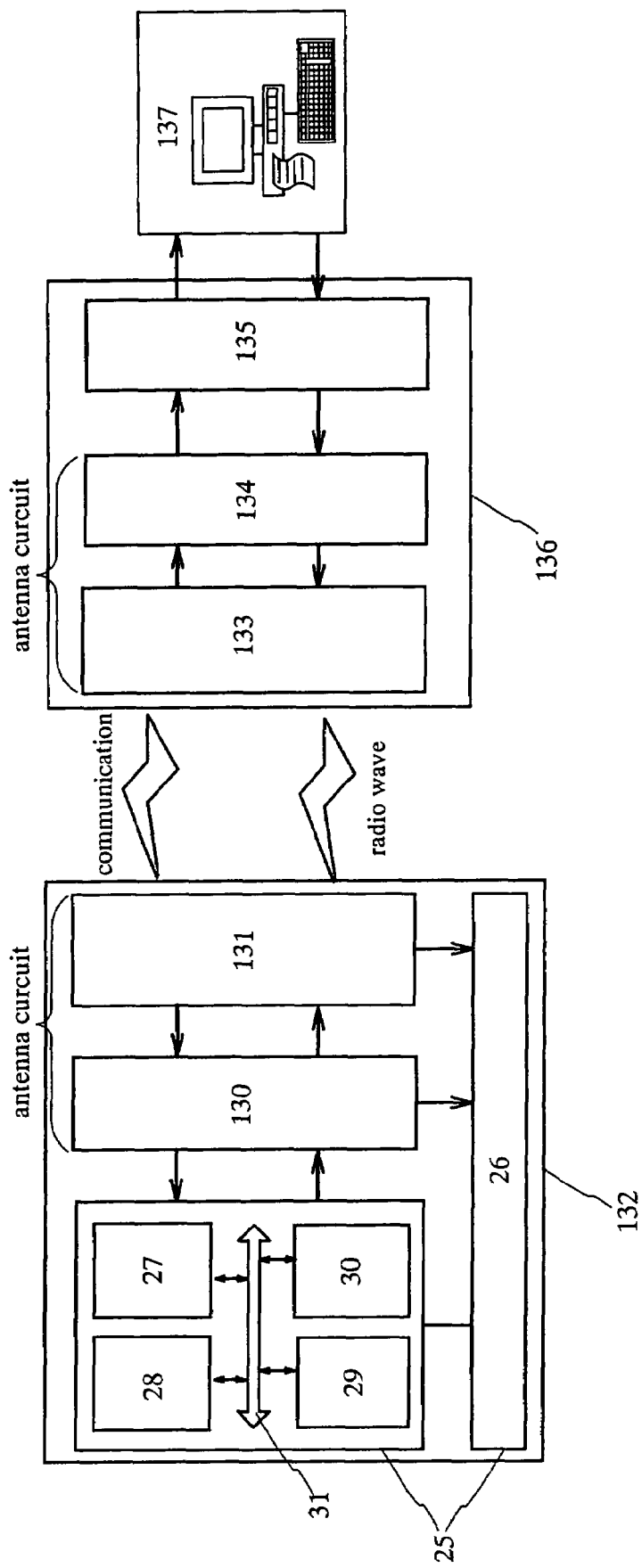
FIG. 18 is a diagram for describing a principle of a non-contact type thin film integrated circuit device according to the present invention.

Next, semiconductor elements 42 such as a thin film transistor (TFT), an organic TFT, or a thin film diode are formed on the base film 44. These semiconductor elements form a thin film integrated circuit, for example, a CPU and a memory. A specific example of a method of manufacturing a thin film integrated circuit such as a CPU and memory using a TFT will be described later. The thin film integrated circuit device includes a power supply circuit, an input/output circuit, a logic circuit, a CPU, and a memory, as shown in FIG. 18. However, only CPU 33 and memory 34 using TFTs are shown in the figure here.

Next, a first interlayer insulating film 46 is formed in order to protect the semiconductor devices elements. Although a silicon nitride film is formed by plasma CVD here, the first interlayer insulating film 46 is not limited to this film. Further, a second interlayer insulating film 47 is formed for planarization of unevenness due to the thin film integrated circuits. Polyimide, acrylic, polyamide, or al heat-resistant organic resin such as siloxane can be used to form the second interlayer insulating film 46 by a method such as spin coating, dipping, spraying, or droplet discharge. Alternatively, an inorganic material such as PSG (phosphosilicate glass), BPSG (borophosohposilicate glass), or alumina may be used.

Next, contact holes are formed by etching with a resist as a mask, and a wiring 45 connecting thin film integrated circuits to each other and an antenna 48 are formed. As a conductive material, an element selected from the group consisting of Ag, Au, Al, Cu, Zn, Sn, Ni, Cr, Fe, Co, and Ti, and an alloy including the element can be used. However, the conductive material is not limited to these. In addition, a material for the wiring may be different from that for the antenna. The wiring 45 and the antenna 48 are formed to have a metal material with malleability and ductility, and more preferably, the film thickness is made thicker to withstand stress due to a deformation.

As a method of forming the wiring 45 and the antenna 48, a resist mask may be used to perform patterning after overall deposition by sputtering, or the wiring 45 and the antenna 48 may be selectively formed of droplets from a nozzle by droplet discharge. The droplet discharge mentioned here includes not only inkjet but also methods such as offset printing and screen printing.

In the case where a commercial product to which the thin film integrated circuit device is to be incorporated includes a conductive material, the same conductive material may be used to form the antenna or the wiring. For example, a material included in a coin can be used to form an antenna inside the coin.

Next, a protective film 49 is formed on the antenna. As the protective film 49, a film including carbon such as a DLC (diamond-like carbon) or carbon nitride (CN), a silicon nitride film, or a silicon oxynitride film, for example, can be used. Alternatively, polyimide, acrylic, polyamide, or a heat-resistant organic resin such as siloxane can be used, or an inorganic material such as PSG (phosphosilicate glass), BPSG (borophosohposilicate glass), or alumina may be used. These insulating films may be laminated to form the protective film.

Figure 1B:
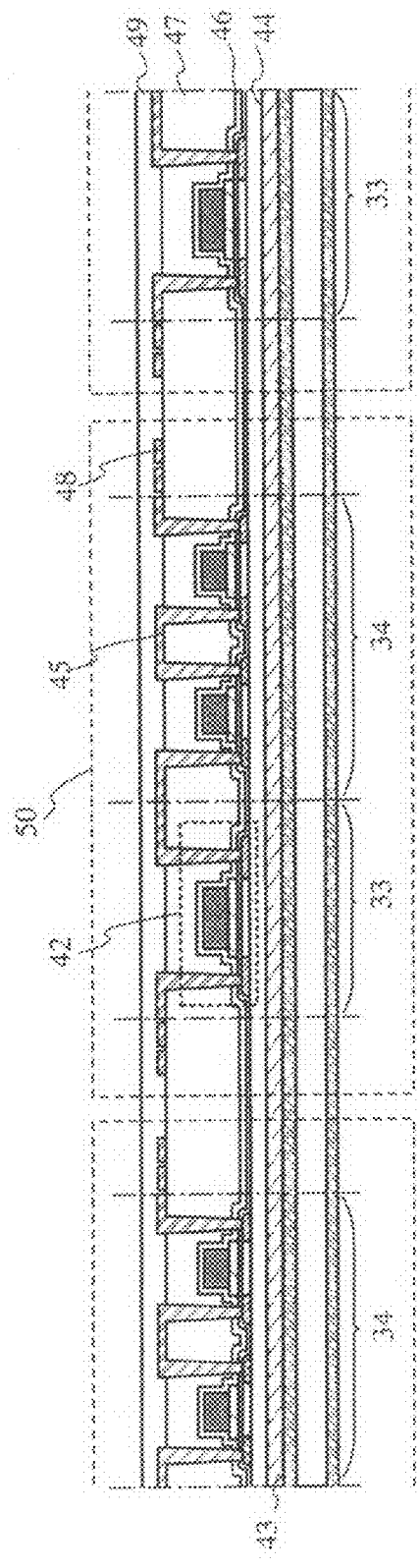

The three insulating films of the first interlayer insulating film 46, the second interlayer insulating film 47, and the protective film 49 are formed on the thin film integrated circuits here. Their films can be used while being replace with each other. Alternatively, a single-layered interlayer film may double as the first and second interlayer insulating films. In any case, it is preferable to use heat-resistant materials that are not damaged by etching with halogen fluoride such as $ClF_3$ as materials to be used for these insulating films. (FIG. 1B)

It is preferable to use a highly elastic organic material such as polyimide for the interlayer insulating films and the protective film. This concentrates stress due to a deformation on the insulating films and protective film including the organic material, and then these films are mainly deformed. Therefore, stress applied on the thin film integrated circuit is reduced. In addition, since a portion (such as an edge or a corner) on which stress is most applied when a deformation is caused is not an edge of a semiconductor film but an edge of the base film, stress concentration on an edge or interface of the semiconductor film can be suppressed.

Figure 1C:
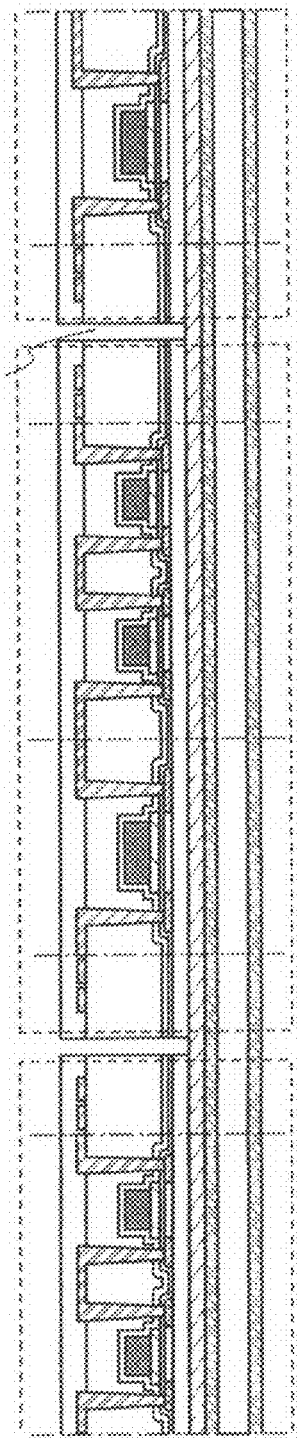

Next, a groove 93 is formed in a boundary region between thin film integrated circuit devices 50 by laser scribing (FIG. 1C). For example, a laser irradiation system shown in FIGS. 25A and 25B can be use to perform laser scribing (see Embodiment 7).

Alternatively, a blade dicing method using a dicing system (dicer) can be used. The blade is a grinding stone into which a diamond abrasive is implanted, which has a width of about 30 to 50 µm. By rapidly spinning this blade, the thin film integrated circuit devices are separated from each other. A necessary area for dicing is referred to as a street, which preferably has a width of 80 to 150 µm in consideration of damage to the devices. Alternatively, a method such as etching with the use of a mask or diamond scribing can also be used. In the case of etching, after forming a mask pattern according to processes of exposure and development, the devices may be separated from each other by etching such as dry etching or wet etching. In dry etching, an atmospheric plasma method may be used.

In the case of forming the groove, the groove may have a depth to the point that at least a surface of the peel-off layer is exposed, and it is preferable that the method such as dicing is appropriately controlled in order not to scratch the substrate so that the thermally oxidized silicon substrate 41 can be used repeatedly.

Next, a jig 52 with projecting portions 58 is attached to fix each of the thin film integrated circuits devices 50 with a temporary adhesive material 51. The jig has a role of temporarily fixing the plurality of thin film integrated circuit devices in order to prevent thin film integrated circuit devices from separating discretely after removing the peel-off layer. It is preferable that the jig has a structure with projecting portions provided like a comb, as shown in FIG. 2D, in order to make it easier to introduce the gas or liquid including halogen fluoride later. However, a flat jig 55 may be used as shown in FIG. 4C. In the case of using a jig (supporting substrate) with projecting portions, a patterned substrate may be used. As the jig, for example, a glass substrate, quartz substrate, and stainless (SUS) substrate including silicon oxide, which is not damaged by halogen fluoride, as its main component can be used. As long as a material that is not damaged by halogen fluoride is used, the jig is not limited to these substrates. In addition, an adhesive material for temporary bonding is provided between the jig and the thin film integrated circuit device.

As the adhesive material, a material that has adhesive force (adhesion) to be reduced or lost by UV light irradiation can be used. An UV-irradiation peeling tape manufactured by Nitto Denko is used here. In addition to this, an adhesive material that can be attached and detached repeatedly, which is used for products such as "Post-it"™ manufactured by THREE M INNOVATIVE PROPERTIES and "NOTESTIX"™ manufactured by MOORE BUSINESS FORMS INC., may be used. For example, an acrylic adhesive, a synthetic rubber adhesive, and a natural rubber adhesive, described in Japanese Patent Application Laid-Open No. 2001-30403, Japanese Patent No. 2992092, and Japanese Patent Application Laid-Open No. 6-299127, can be used. Of course, as long as the jig can be easily removed, the adhesive material is not limited to these materials.

Figure 26:
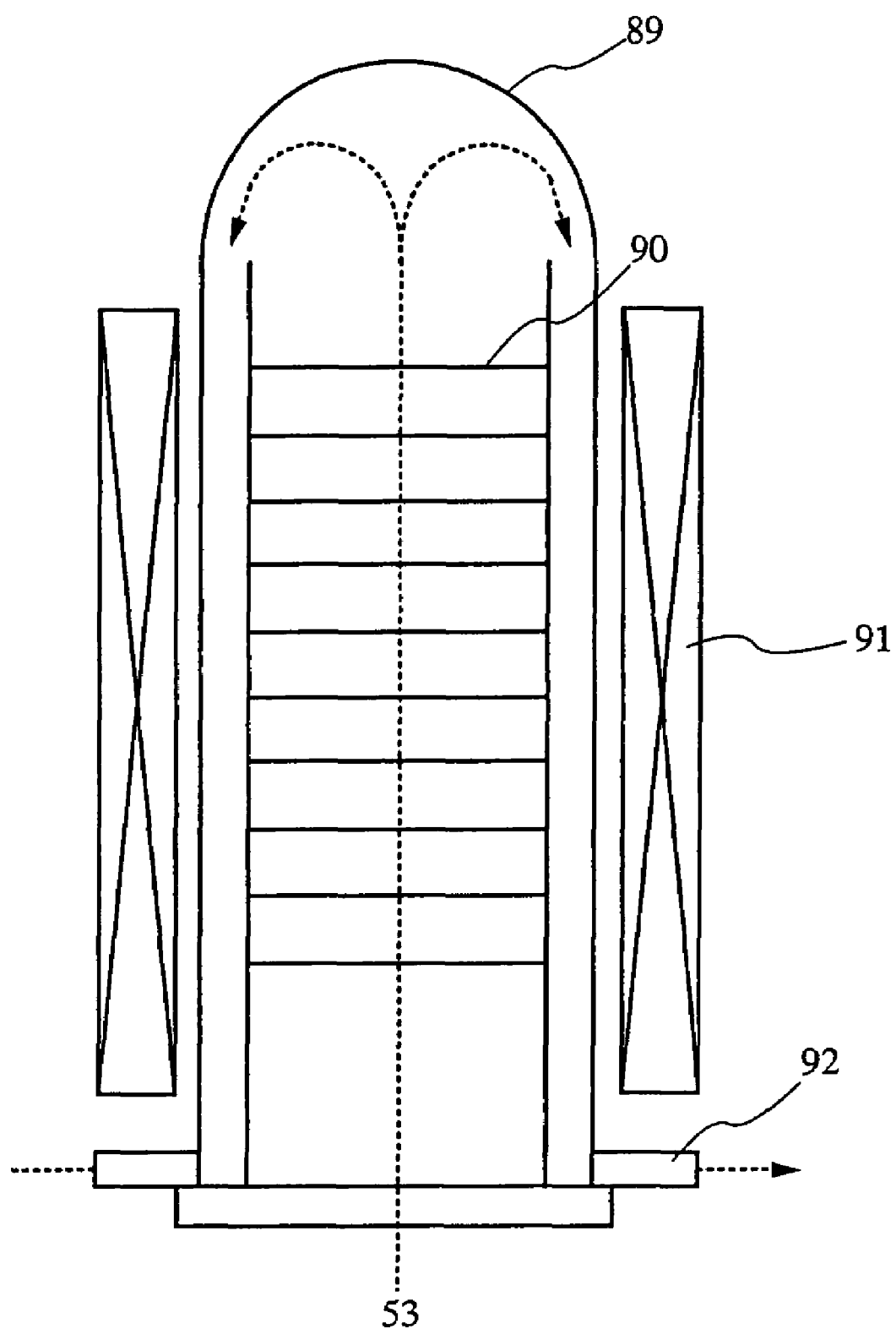
FIG. 26 is a schematic diagram of a low pressure CVD system that is used in the present invention.

Next, the a-Si film that is the peel-off layer is etched and removed by introducing a halogen fluoride gas into the groove 93 (FIG. 2A). A low pressure CVD system (FIG. 26) used here works in accordance with a mechanism that a halogen fluoride gas such as a $ClF_3$ gas 53 is introduced into a bell jar 89 that is a reaction field to circulate the gas to a substrate 90. In addition, a heater 91 is provided outside the bell jar, and remaining gas is exhausted from an exhaust pipe 92. The low pressure CVD system shown in FIG. 26 is used here to etch and remove the a-Si film under conditions of gas: $ClF_3$, temperature: 350° C., flow rate: 300 sccm, pressure: 6 Torr, and time: 3 hours. However, the conditions, which are not limited, may be appropriately changed. Alternatively, a gas of $ClF_3$ gas mixed with nitrogen may be used, where the flow rate of the both gases can be appropriately set.

Silicon oxide, silicon nitride, or silicon oxynitride is hardly etched by halogen fluoride such as ClF$_3$ while silicon is selectively etched. Accordingly, the peel-off layer is etched with time so that the thermally oxidized silicon substrate 41 can finally be separated peeled (FIG. 2B). On the other hand, the base film, since interlayer insulating films, or protective film including a material such as silicon oxide, silicon nitride, silicon oxynitride, or a heat-resistant resin is hardly etched, damage to the thin film integrated circuits can be prevented. The separated thermally oxidized silicon substrate 41, which has the surface covered with the insulating film such as silicon oxide, can be used again without being damaged by halogen fluoride such as ClF$_3$, which leads to reduction in cost.

Next, the adhesion of the temporary adhesive material 51 is reduced or lost by UV light irradiation to separate the jig from the thin film integrated circuit devices (FIG. 2C). This makes it possible to mass-produce thin film integrated circuit devices. It is preferable to use the jig again for reduction in cost.

Figure 3A:
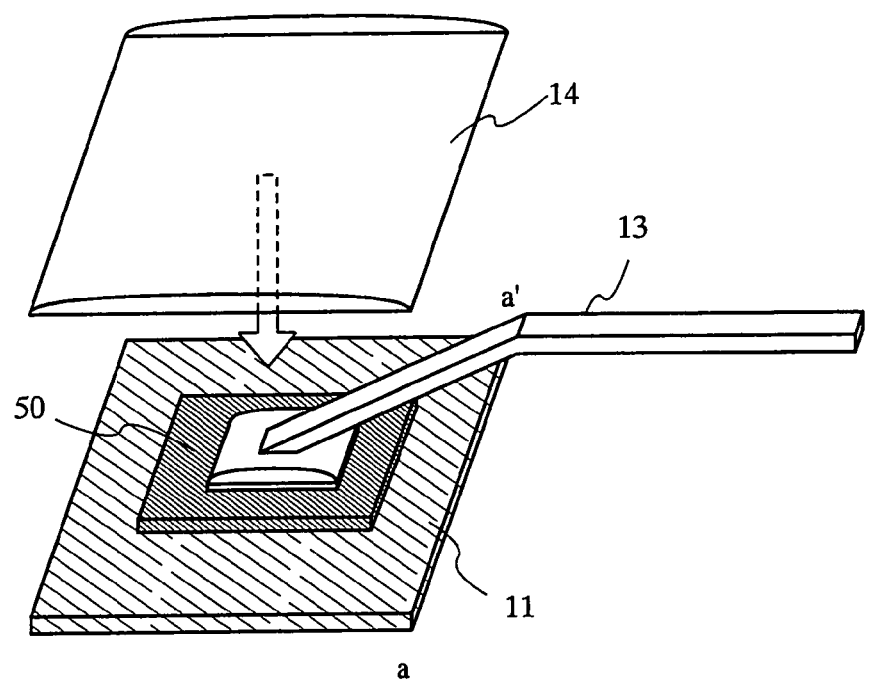
FIGS. 3A and 3B are diagrams for describing a method of attaching a thin film integrated circuit device to a commercial product.
Figure 3B:
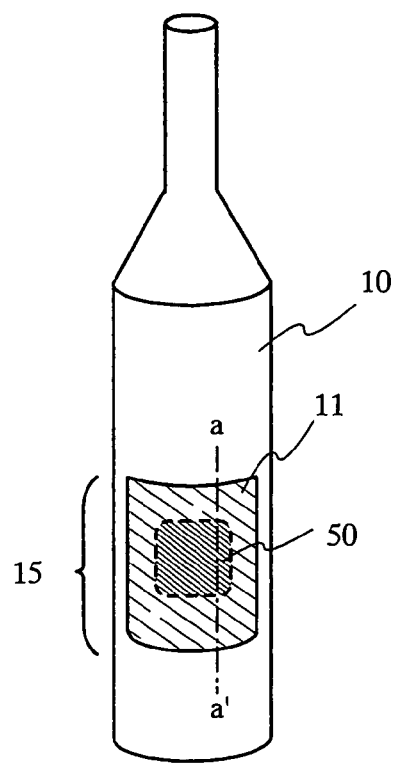

The thin film integrated circuit device 50 manufactured according to the method described above can be carried with the use of, for example, small vacuum tweezers 13, and attached to desired products. FIGS. 3A and 3B show a method of manufacturing an ID label 15 to be attached to a commercial product 10. The ID label 15 is completed by attaching the thin film integrated circuit device 50 to a label 11 with the small vacuum tweezers 13, and then sealing with an adhesive material 14. Further, the ID label 15 is attached to the commercial product 10 to complete a commercial product with information that can be recognized, updated, and managed by, for example, a reader/writer.

Figure 10A:
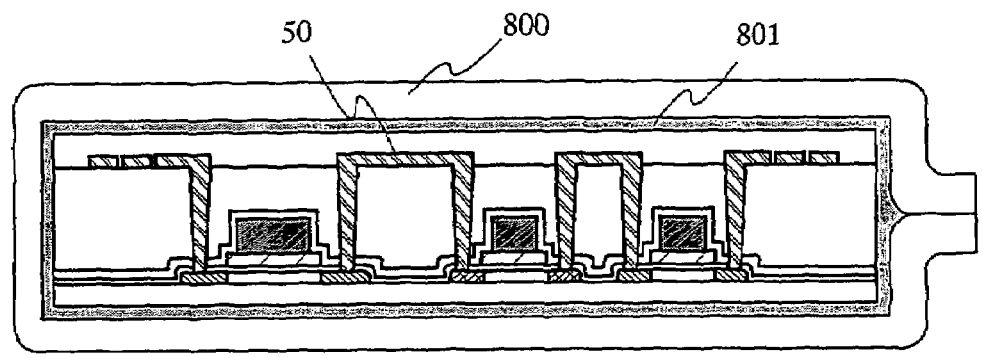
FIGS. 10A and 10B are diagrams for describing a sealing method of a thin film integrated circuit device according to the present invention.
Figure 10B:
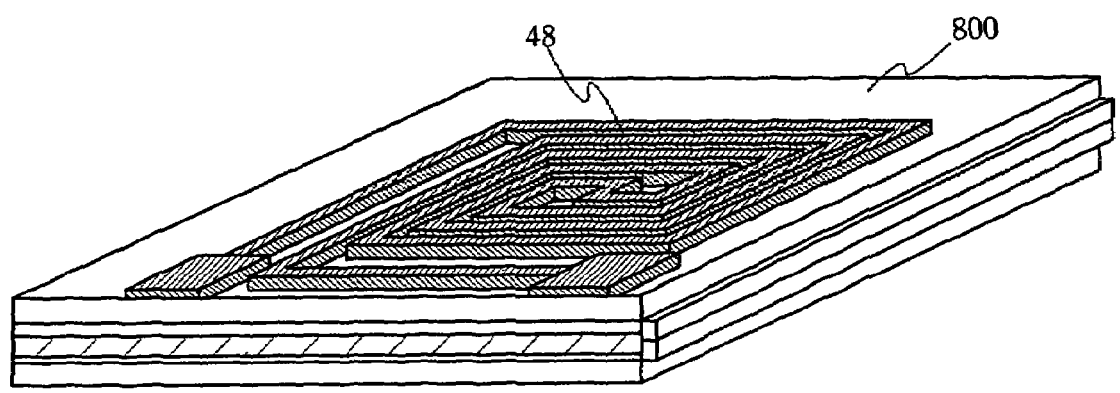

Alternatively, the thin film integrated circuit device 50 manufactured according to the method described above may be encapsulated by a cover 800 with an adhesive material 801, for example, as shown in FIG. 10A. FIG. 10B shows a perspective view of the encapsulation state.

Embodiment Mode 2

In the present embodiment mode, a case of using dry etching for forming the groove 93 will be described with reference to FIGS. 4A to 4C. FIG. 4A is the same as Embodiment Mode 1 up to the state of FIG. 1A. Thereafter, a resist 54 is formed over the substrate by processes of exposure and development, and a groove 93 is formed by dry etching with the resist 54 as a mask to separate devices (FIG. 4A). Plasma etching is employed here, and a chlorine-based gas typified by Cl$_2$, BCl$_3$, SiCl$_4$, CCl$_4$, or the like, a fluorine-based gas typified by CF$_4$, SF$_6$, NF$_3$, or CHF$_3$, or the like or O$_2$ is used as an etching gas, which is not limited to these. The etching can be performed by utilizing atmospheric pressure plasma. In this case, it is preferable to use a mixed gas of CF$_4$ and O$_2$ as an etching gas. Alternatively, etching with the use of a different kind of gas may be performed several times to form the groove 93.

After the etching, the resist 54 is left as it is, and made to function as a protective film for protecting the thin film integrated circuits devices (FIG. 4B). As the mask for forming the groove by etching, in addition to a resist, an insulating film such as polyimide, acrylic, polyamide, or benzocyclobutene, or a material that has a skeleton formed by a bond of silicon and oxygen and includes at least hydrogen as a substituent or at least one selected from the group consisting of fluoride, an alkyl group, and aromatic hydrocarbon as the substituent. Of course, the insulating film to be used as the mask may be removed by a method such as O$_2$ ashing after the etching.

Next, a jig 55 is attached to the thin film integrated circuits devices 50 with a temporary adhesive material 51, and the peel-off layer is removed by halogen fluoride such as a ClF$_3$ gas 53 to separate to thermally oxidized silicon substrate 41 finally (FIG. 4B). The specific method is the same as in Embodiment Mode 1. As the jig 55, a substrate with no particular projecting portion is used here. Of course, however, a substrate with projecting portions may be used. The jig in FIG. 4B has openings 700 provided in order to supply halogen fluoride such as a ClF$_3$ gas 53 easily to the peel-off layer. It is preferable that the openings 700 are provided in order not to interfere with support of the thin film integrated circuits devices by the jig.

Next, the adhesion of the temporary adhesive material 51 is reduced or lost by UV light irradiation to separate the jig 55 from the thin film integrated circuit devices 50. This makes it possible to mass-produce thin film integrated circuit devices. The thin film integrated circuit device 50 manufactured according to the method described above can be carried with the use of, for example, small vacuum tweezers, and attached to desired products.

Embodiment Mode 3

Figure 5A:
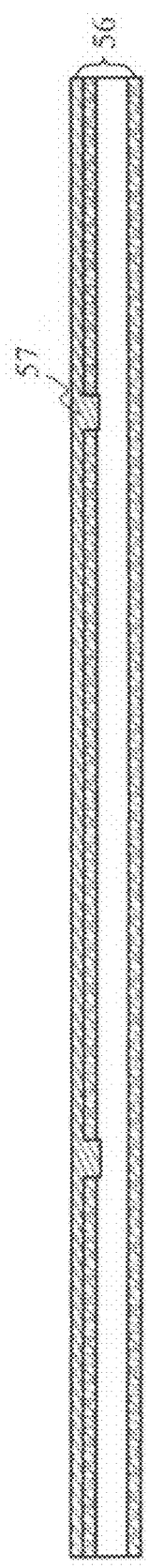
FIGS. 5A and 5B are diagrams for describing a case of using a used substrate again.
Figure 5B:
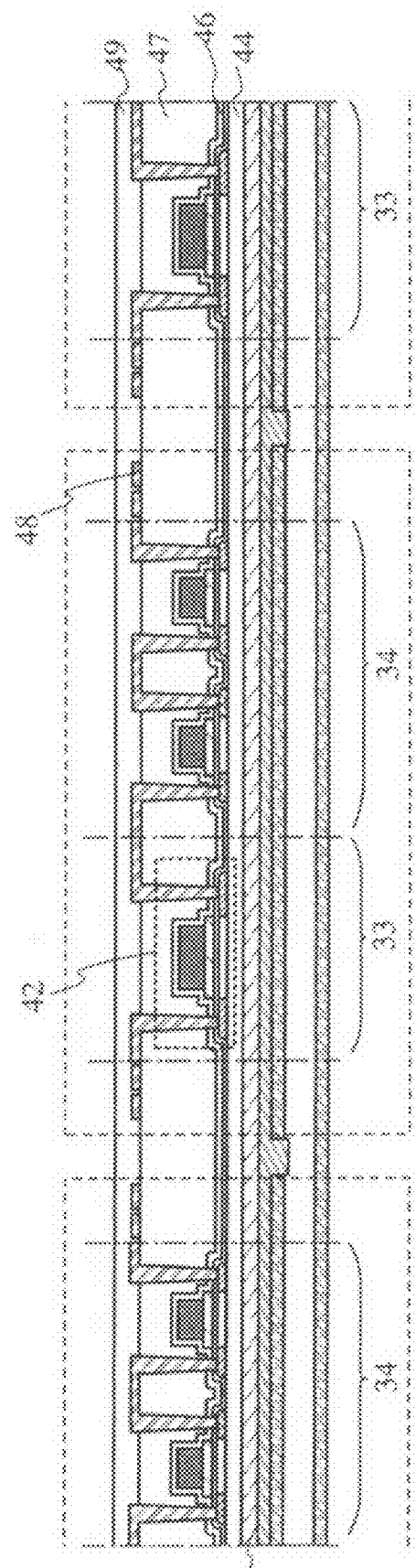

In the present embodiment mode, a case will be described, where the thermally oxidized silicon substrate 41 or a SOI substrate such as a SIMOX substrate is used again in the case of scratching the substrate on forming the groove 93 by a method such as dicing. As a first method, a planarization film 57 is formed on a used substrate 56 as shown in FIG. 5A. As the planarization film 57, polyimide, acrylic, polyamide, or a heat-resistant resin such as siloxane can be formed by a method such as spin coating, dipping, spraying, or droplet discharge (for example, inkjet). In consideration of thermal treatment of a post-process, it is preferable to use a heat-resistant resin such as siloxane. Alternatively, an inorganic material such as PSG (phosphosilicate glass), BPSG (borophosohposilicate glass), or alumina may be used. The following processes are the same as in Embodiment Mode 1 or 2.

As a second method, there is a method of using CMP (chemical mechanical polishing) for planarization of a surface of a substrate, which is particularly effective in the case where the used substrate 56 has minute scratches. In CMP, a polishing solvent referred to as slurry (307) is supplied in a pad 308 for polishing, and pressure is applied by spinning of a wafer carrier 306 and spinning of a turntable referred to as a platen at the same time as polishing by the pad 308 for polishing to conduct planarization. As the slurry 307, slurry mixed with alkali colloidal silica is commonly used. The following processes are the same as in Embodiment Mode 1 or 2.

Embodiment Mode 4

In the embodiment modes described above, the antenna is formed in the manufacturing process of a thin film integrated circuit. In the present embodiment mode, a method will be described with reference to FIGS. 7A to 12B, in which an antenna to be formed on a substrate and a plurality of thin film integrated circuits are separately formed, and thereafter, the both are connected to each other.

Figure 7A:
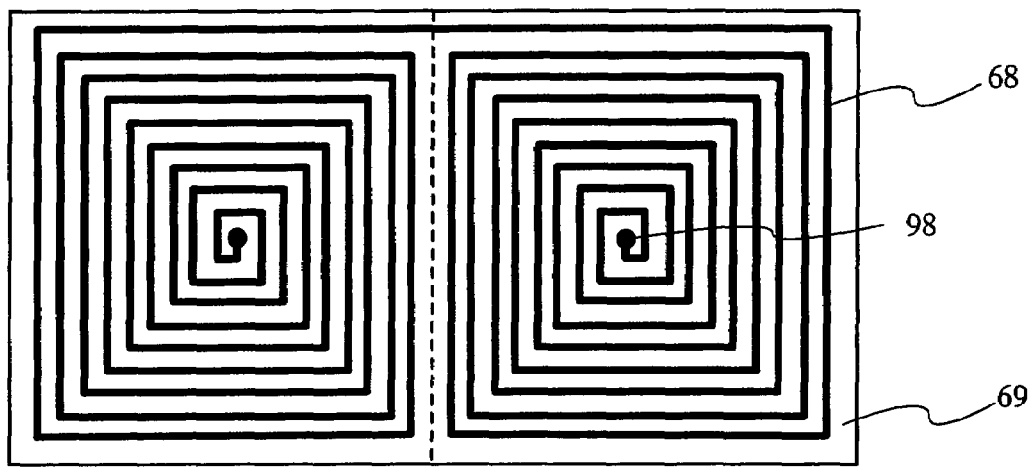
FIGS. 7A to 7C are diagrams for describing a manufacturing process of a thin film integrated circuit device according to the present invention (folding antenna)
Figure 7B:
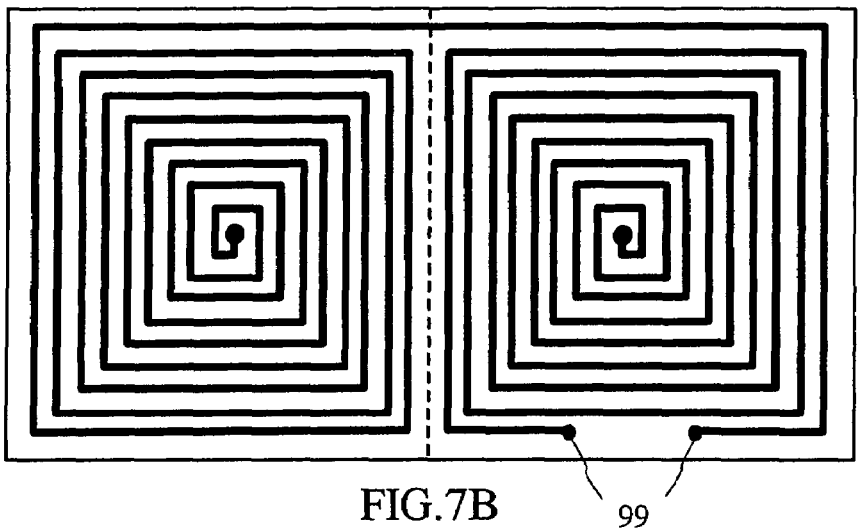
Figure 7C:
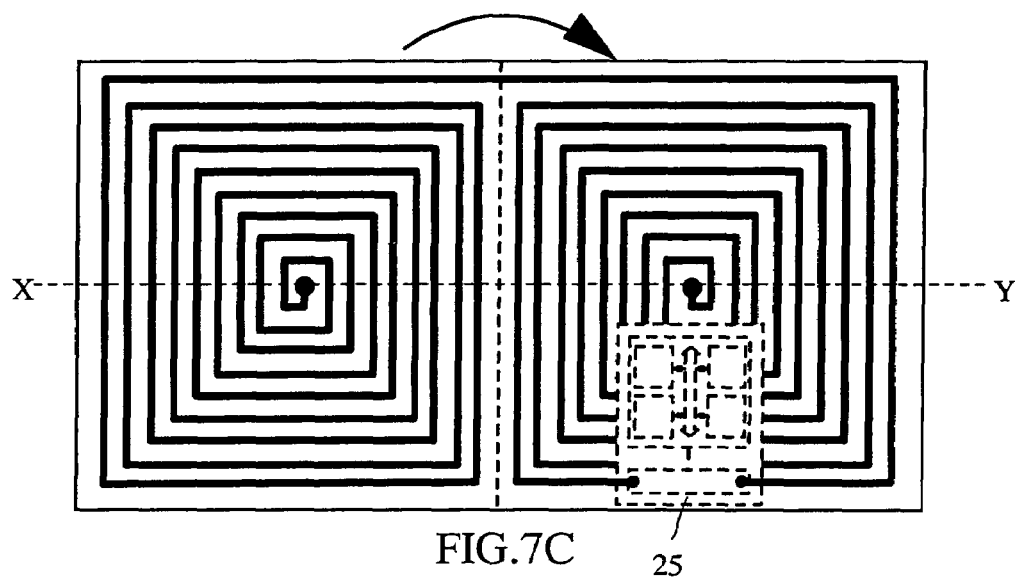
Figure 8A:
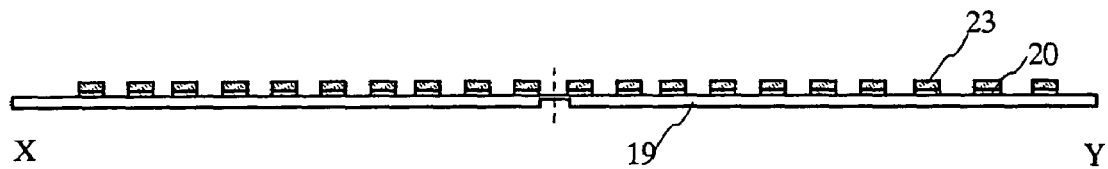
FIGS. 8A to 8E are diagrams for describing the manufacturing process of a thin film integrated circuit device according to the present invention (folding antenna)
Figure 8B:
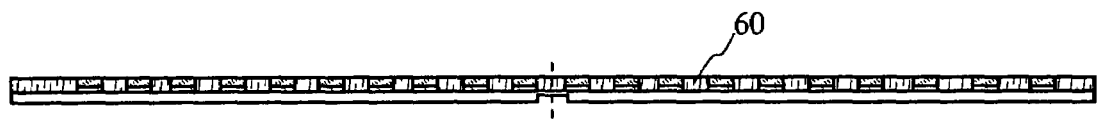
Figure 8C:
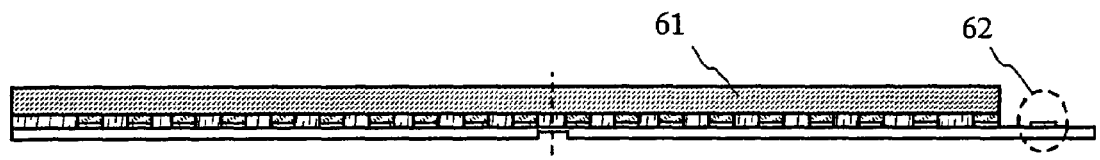
Figure 8D:
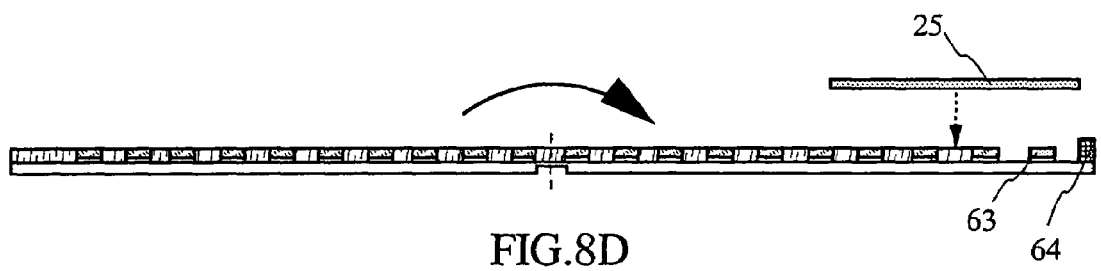
Figure 8E:

In a first method, as shown in FIGS. 7A to 7C, an antenna 68 is formed on a foldable flexible substrate 69, a thin film integrated circuit 25 formed separately is connected to the antenna, and then, the flexible substrate 69 is folded in half for sealing to manufacture a thin film integrated circuit device. The antenna 68 may be formed by patterning after deposition by a method such as sputtering, or by using droplet discharge to selectively discharge a composition including a conductive material, and then, drying and calcining the composition.

Figure 6A:
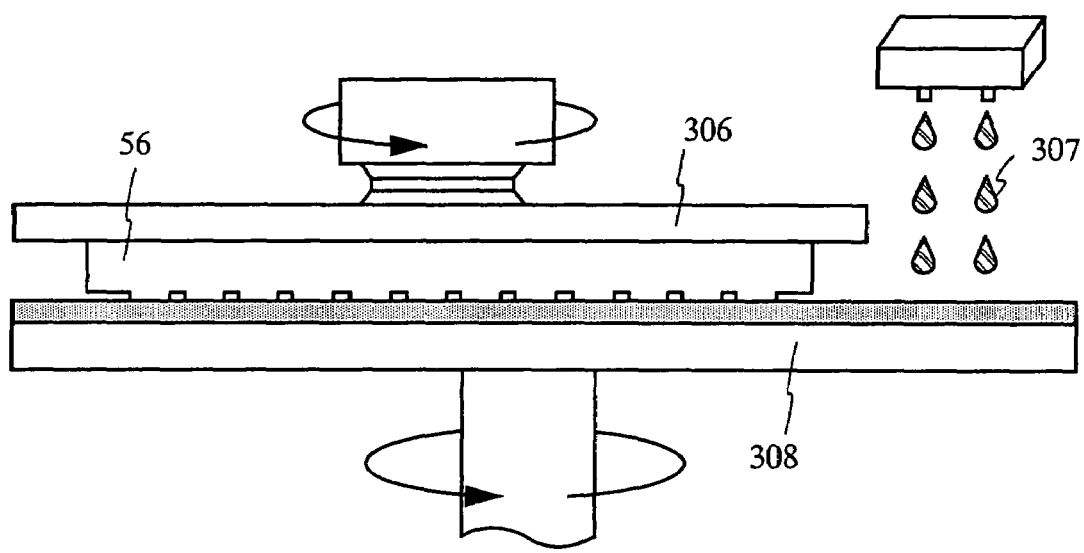
FIGS. 6A to 6C are diagrams for describing planarization.
Figure 6B:
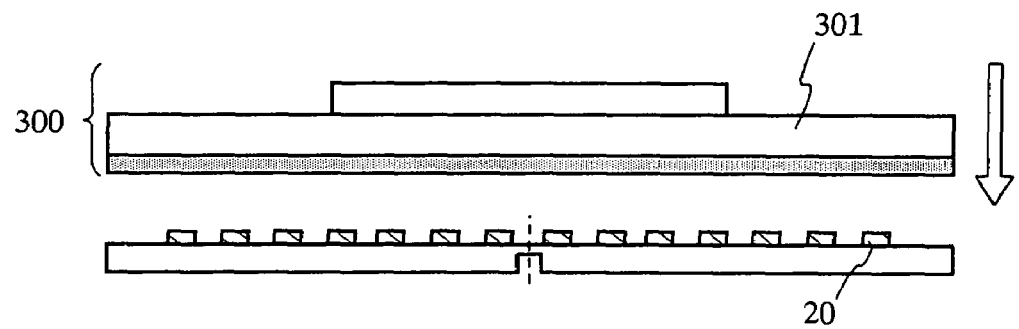
Figure 6C:
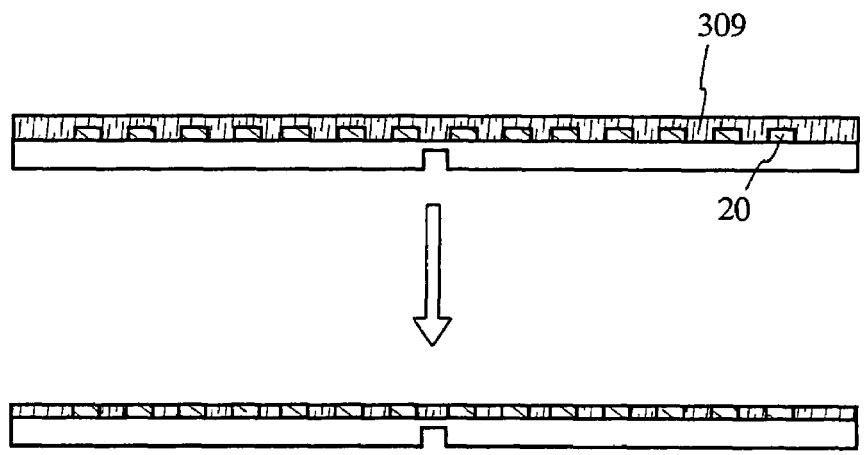

After forming the antenna, planarization may be enhanced by a method such as CMP, pressing, or etch back shown in FIGS. 6A to 6C. In the case of CMP, an acid solution mixed with alumina powder is preferably used as slurry since a conductive material is included in the antenna. In the case of pressing, a system equipped with a heating apparatus such as a heater 301 is preferably used to conduct pressing. In etch back, after forming a flat insulating film 309, etching is conducted for planarization. These processes for planarization can also be used in a manufacturing process of a thin film integrated circuit.

The antenna may have a connecting portion 98 connecting antennas to each other and a connecting portion 99 connecting the antenna to a thin film integrated circuit, which are formed when the antenna is formed. Alternatively, the connecting portion 99 connecting to a thin film integrated circuit may be formed by cutting a portion of the antenna after forming the antenna. The antenna can be connected to a thin film integrated circuit by using, for example, an anisotropic conductive film or a known bonding method. The shape of the antenna is not limited to the shape shown in FIGS. 7A to 7C as long as symmetric and coiled when the antenna is folded.

The thin film integrated circuit 25 enfolded by the antenna includes a power supply circuit 26, an input/output circuit 27, a logic circuit 28, a memory 29, a CPU 60, which are connected to an antenna circuit that exchanges radio waves with a reader/writer 136, as shown in FIG. 18.

FIGS. 8A to 8E are diagrams showing the foldable antenna substrate, viewed from a X-Y section of FIG. 7C. A resist 23 used for forming the antenna 20 by patterning is left without being removed by, for example, ashing. Further, a planarization film 60 is formed for planarization by a method such as spin coating, dipping, spraying, or droplet discharge. In order to obtain a portion connecting to the thin film integrated circuit 25 (IC chip), etching or ashing is performed with a resist 61 as a mask to form a contact portion 62. Further, the thin film integrated circuit 25 is formed with an anisotropic conductive film 63 in between, and the flexible substrate 19 on which the antenna 20 is formed is folded with a sealing material 64 to complete a thin film integrated circuit device (ID chip) 66. In this case, one side of the antenna may be connected to the other opposed side by providing, for example, a wiring between the sides of the antenna. The resist 23 and the planarization film 60 act as a buffer to protect the antenna and the thin film integrated circuit when the substrate is folded. One or both of the resist 23 and the planarization film 60 may be omitted.

Figure 9A:
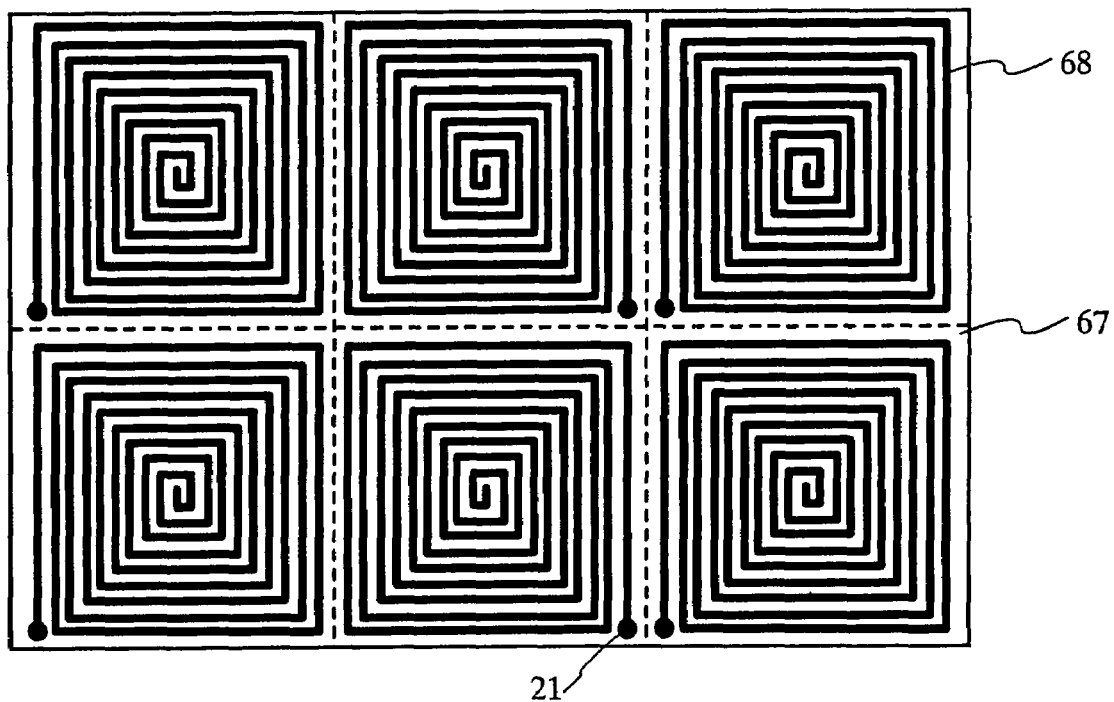
FIGS. 9A and 9B are diagrams for describing a manufacturing process of a thin film integrated circuit device according to the present invention (sandwich structure)
Figure 9B:
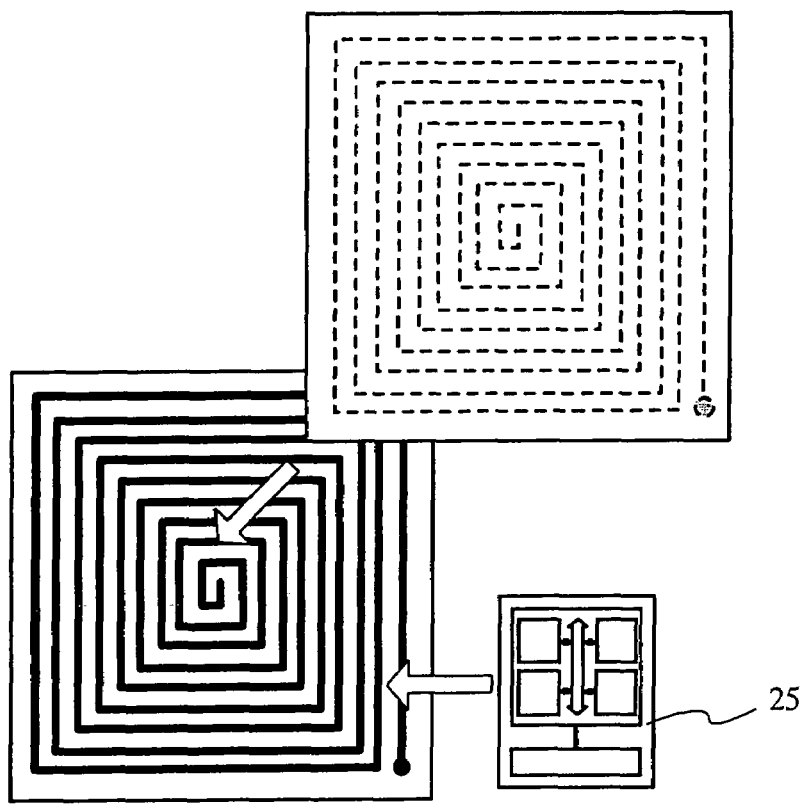

In a second method, as shown in FIGS. 9A and 9B, a plurality of antennas 68 is formed on a substrate 67, the substrate 67 is carved out by dicing or the like, and a thin film integrated circuit 25 is interposed between the antenna substrates. A connecting portion 21 may be used to connect the antennas to each other or connect the thin film integrated circuit to the antenna. In addition, the connecting portion 21 may be formed at another position of the antenna. Since it is necessary to provide an alignment mark when the substrates are bonded to each other, the connecting portion 21 may be used as a mark.

Figure 11A:
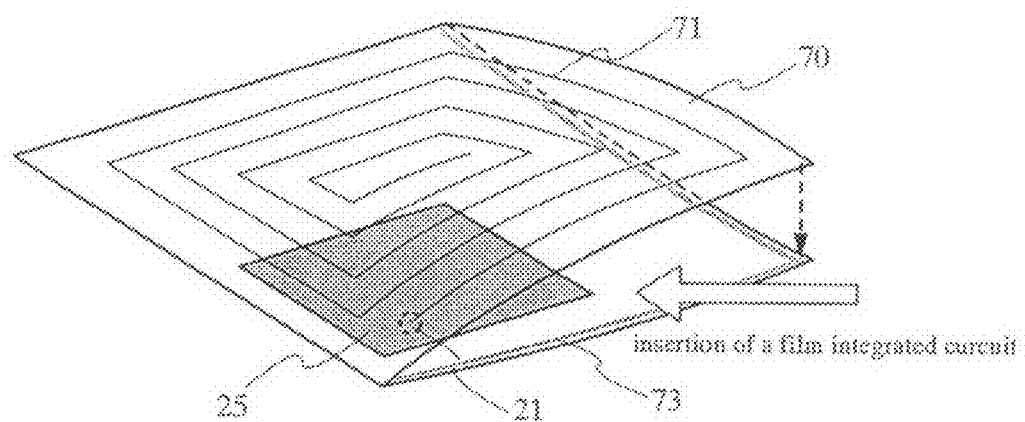
FIGS. 11A to 11C are diagrams for describing sealing methods of a thin film integrated circuit device according to the present invention (wrapping and envelope types)
Figure 11B:
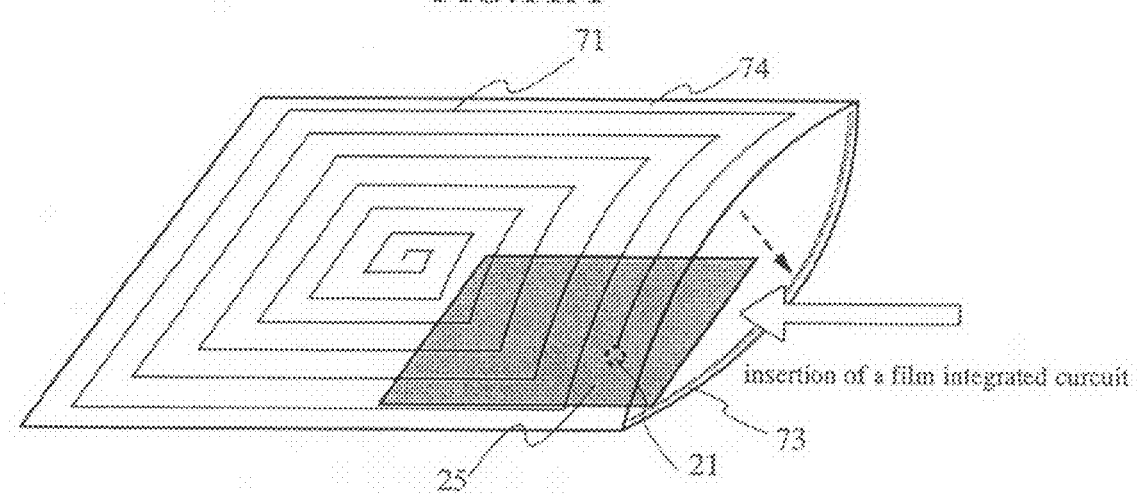
Figure 11C:
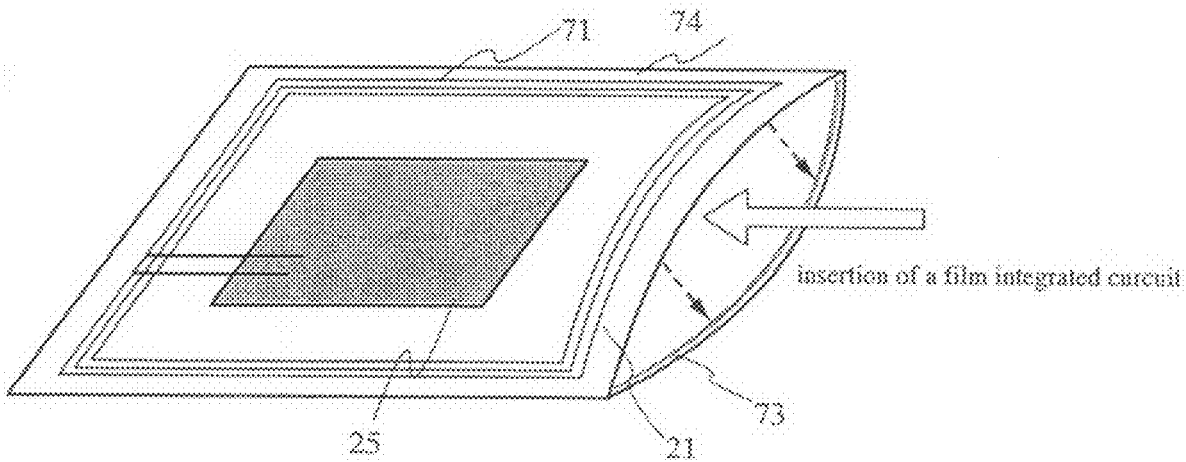

In a third method, as shown in FIG. 11A or 11B, an antenna 71 is formed on each outside surface of a flexible substrate 70 with two sides closed like a plastic wrap for wrapping food or flexible substrate 74 with three sides closed like an envelope, a thin film integrated circuit 25 is put between the outside surfaces, and sealing is performed with an adhesive material 73. A connecting portion 21 is opened so that the antennas can be connected to each other or the antenna is connected to the thin film integrated circuit. The IC chip may placed be with the use of, for example, small vacuum tweezers. The antenna may be formed on each inside surface of the substrate.

Figure 12A:
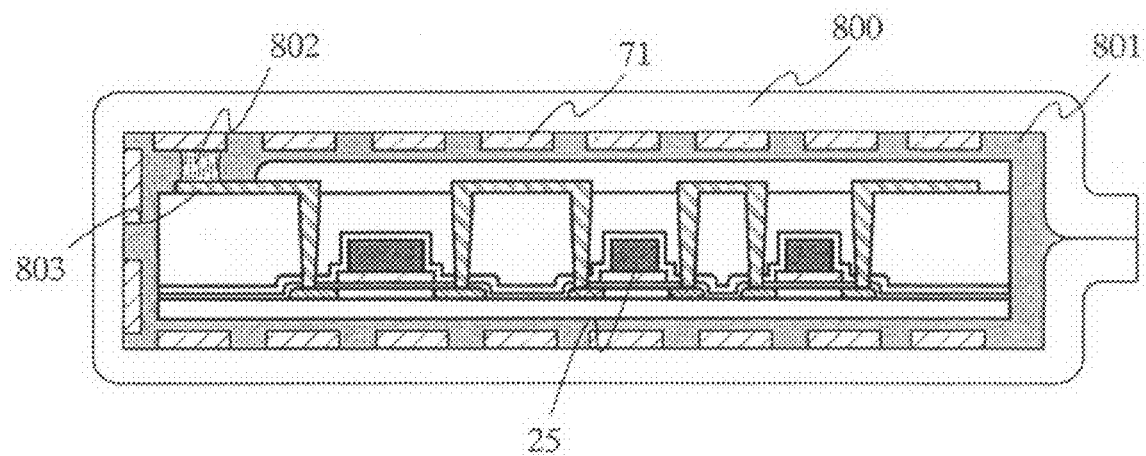
FIGS. 12A and 12B are diagrams for describing sealing methods of the thin film integrated circuit device according to the present invention (wrapping and envelope types)
Figure 12B:
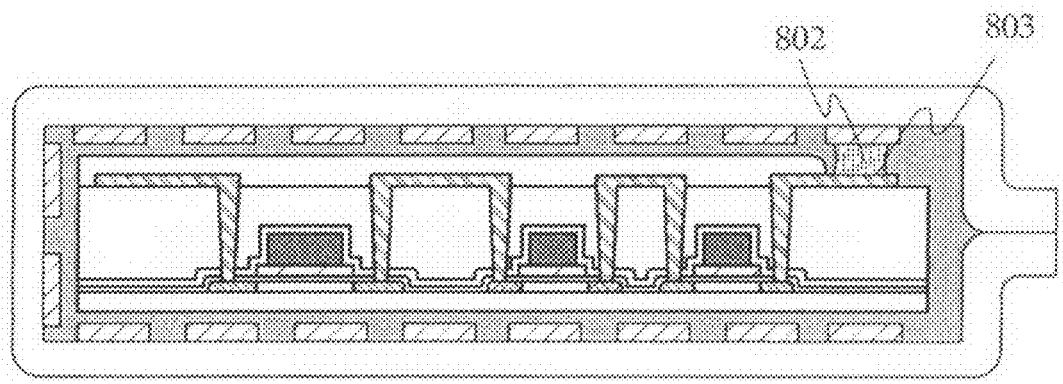

FIGS. 12A and 12B are cross-sectional views of states after sealing. A connecting terminal 803 for connecting the thin film integrated circuit 25 to an antenna 71 can be provided at a desired position as exemplified in FIGS. 12A and 12B. As a connection method, in addition to a method using an anisotropic conductive film 802 shown in the figure, known methods such as COG, wire bonding, and TAB can be used.

The method of manufacturing a thin film integrated circuit device, described in the present embodiment mode, is suitable particularly for a case where an antenna substrate and a thin film integrated circuit (IC chip) are formed separately by different manufacturers to be distributed as an intermediate product (part).

Embodiment Mode 5

Figure 24A:
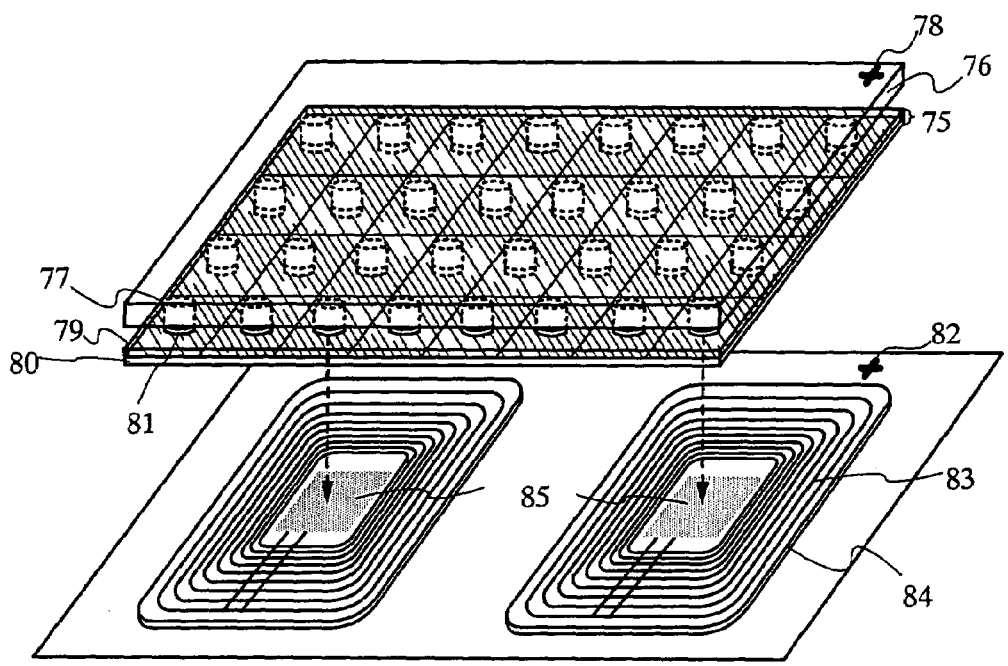
FIGS. 24A to 24C are diagrams for describing a manufacturing process of a thin film integrated circuit device according to the present invention (selective UV light irradiation)
Figure 24B:
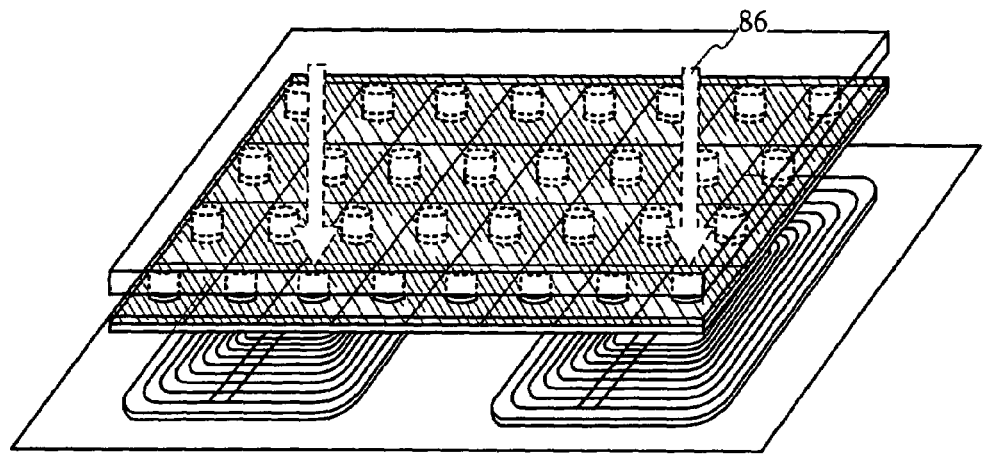
Figure 24C:
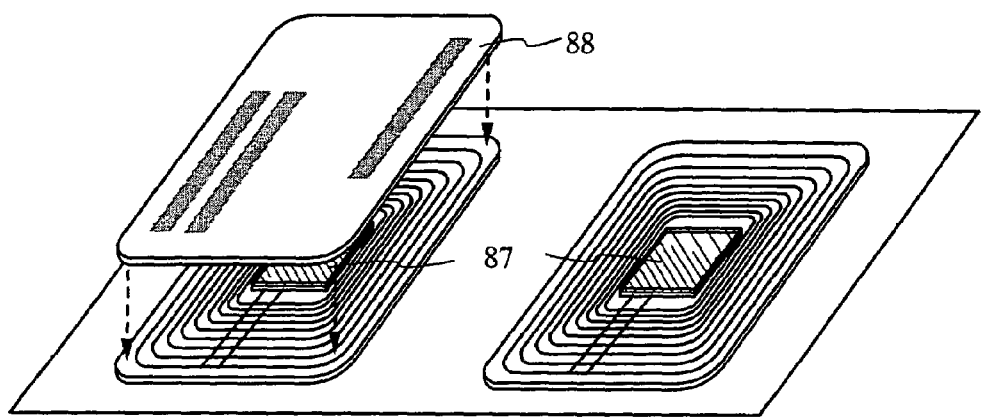

In the present embodiment mode, a method of bonding to a commercial product 84 or the like without removing a jig 76 temporarily bonded to an element substrate 75 will be described with reference to FIGS. 24A to 24C. First, in manner of Embodiment Modes 1 to 3, the element substrate 75 is formed, and the jig is attached with a temporary adhesive material 81. As the jig 76, a jig with projecting portions 77 is used as shown in FIGS. 24A and 24B. As the temporary adhesive material 81, a material that has adhesion to be reduced or lost by UV light irradiation is used here. In addition, an interlayer film 79 including an organic material or an inorganic material is provided in order to prevent damage to elements. Then, the devices are separated from each other by etching with halogen fluoride such as $ClF_3$.

Next, the elements with the jig 76 bonded temporarily are transferred and aligned with a stage on which the commercial product such as an ID card. In this case, alignment marks 78 and 82 provided with the jig and stage can be used as shown in FIG. 24A, and not shown in the figure, a mark formed on the commercial product 84 can be used. At a portion of the commercial product 84 on which the thin film integrated circuit device is to be formed, an adhesive material 85 is formed in advance, and a desired element is attached to a desired portion of the commercial product 84 by controlling the jig (FIG. 24A).

Next, the element to be attached to the commercial product 84 is irradiated selectively with UV light 86 through a mask to reduce or lose adhesion of the temporary adhesive material 81, and thereby the jig is separated from the element (FIG. 24B). This makes it possible to form a desired element (an integrated circuit 87) at a desired portion of the commercial product. After forming the element, the element is covered with, for example, a cover 88 (FIG. 24C). Although a case of forming an antenna 83 in the commercial product 84 is shown here, an antenna may be formed in the device.

By using the method described in the present embodiment mode according to the present invention, a desired element can be formed at a desired portion without allowing the devices to separate discretely when the elements are separated from each other by etching with halogen fluoride such as $ClF_3$.

Embodiment 1

In the present embodiment, a specific method of manufacturing an integrated circuit portion of a thin film integrated circuit device will be described with reference to FIGS. 13A to 13E and FIG. 14A to FIG. 14E. For simplification, a method of manufacturing a CPU and a memory will be described here, where each of the CPU and the memory has an n-channel TFT and a p-channel TFT.

Figure 13A:
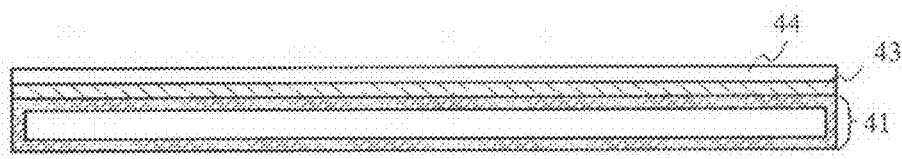
FIGS. 13A to 13E are diagrams for describing a manufacturing process of a semiconductor element included in a thin film integrated circuit device according to the present invention.

First, a peel-off layer 43 and a base film 44 are formed on a thermally oxidized silicon substrate 41 (FIG. 13A). As materials and method for forming the thermally oxidized silicon substrate 41, the peel-off layer 43, and the base film 44, the materials and methods described in the above embodiment modes can be employed.

Figure 13B:
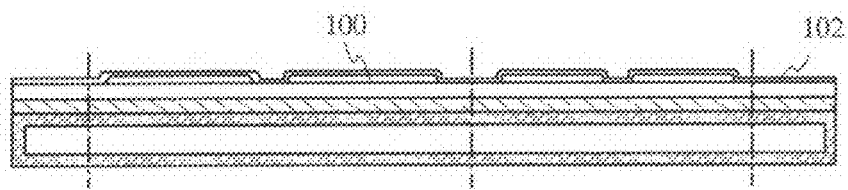

Next, island-shaped semiconductor films 100 are formed on the base film 44 FIG. 13B). The island-shaped semiconductor films 100 are formed to include an amorphous semiconductor, a crystalline semiconductor, or a semi-amorphous semiconductor. In any case, it is possible to use a semiconductor film including silicon, silicon-germanium (SiGe), or the like as its main component.

In the present embodiment, amorphous silicon with a film thickness of 70 nm is formed, a treatment with a solution including nickel is further given to the surface of the amorphous silicon, then, a crystalline silicon semiconductor film is obtained by a thermal crystallization process at 500 to 750° C., and laser crystallization is further performed to improve crystallinity. As a method for deposition, a method such as plasma CVD, sputtering, or LPCVD may be used. As a method for crystallization, a method such as laser crystallization, thermal crystallization, or thermal crystallization using another catalyst (such as Fe, Ru, Rh, Pd, Os, Ir, Pt, Cu, or Au) may be used, or the above-mentioned methods may be used alternatively more than once.

For crystallization of a semiconductor film with an amorphous structure, a continuous-wave laser may be used. In order to obtain a large-grain crystal by crystallization, it is preferable to use a continuous-wave solid laser and apply any of the second to fourth harmonics of the fundamental wave. Typically, the second harmonic (532 nm) or third harmonic (355 nm) of Nd:YVO$_4$ laser (fundamental wave: 1064 nm) may be used. In the case of using a continuous-wave laser, laser light emitted from continuous-wave YVO$_4$ laser (output: 10 W) is converted into a harmonic by a non-linear optical element. There is also a method in which an YVO$_4$ crystal and a non-linear optical element are put in which in a resonator to emit a harmonic. Then, rectangular or elliptic laser light is preferably formed at a surface to be irradiated by an optical system to irradiate a processed object. In this case, an energy density of approximately 0.01 to 100 MW/cm$^2$ (preferably, 0.1 to 10 MW/cm$^2$) is necessary. The semiconductor film may be moved at a speed of approximately 10 to 2000 cm/s relatively with respect to the laser light.

After obtaining the crystalline silicon semiconductor film according to the method described above, an amorphous silicon film for gettering of the metal catalyst is formed over the semiconductor film with an oxide film interposed therebetween, and gettering is conducted by a thermal treatment at 500 to 750° C. Further, in order to control a threshold voltage of a TFT, the crystalline silicon semiconductor film is doped with boron ions of a dose amount on the order of 10$^{13}$/cm$^2$. After that, the island-shaped semiconductor films 100 are formed by etching with a resist as a mask.

When the crystalline semiconductor film is formed, disilane (Si$_2$H$_6$) and germanium fluoride (GeF$_4$) may be used as a raw gas to form a polycrystalline semiconductor film directly by LPCVD (Low Pressure CVD) so that a crystalline semiconductor film can be obtained. In this case, the gas flow rate may be Si$_2$H$_6$/GeF$_4$=20/0.9, the deposition temperature may be 400 to 500° C., and He or Ar may be used as a carrier gas. However, the conditions are not limited to these.

Next, a gate insulating film 102 is formed on the island-shaped semiconductor films (FIG. 13B). It is preferable that a method for forming a thin film such as plasma CVD or sputtering is used to form a single layer or laminated layers of a layer including silicon nitride, silicon oxide, silicon oxynitride silicon, or silicon nitride oxide as the gate insulating film. In the case of the laminated layers, for example, a three-layered structure of, from the substrate side, a silicon oxide film, a silicon nitride film, and a silicon oxide film may be preferably employed.

Figure 13C:
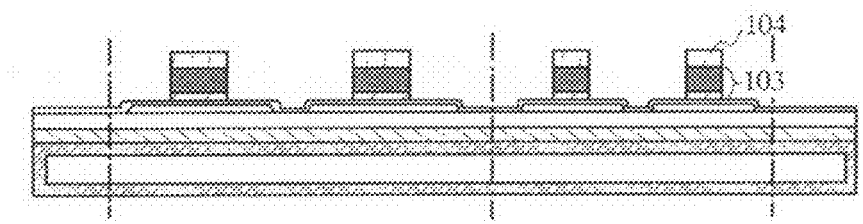

Next, gate electrode layers 103 are formed (FIG. 13C). By etching with a resist 104 as a mask after forming and laminating TaN (tantalum nitride) with a film thickness of 30-nm and W (tungsten) with a film thickness of 370 nm by sputtering, the gate electrode layer 103s are formed. Instead of the resist mask, a mask such as SiOx may be used. In this case, a process of forming a mask such as SiOx or SiON (referred to as a hard mask) by patterning is added. However, since the thickness of the mask is less reduced during etching than the resist, a gate electrode layer with a desired width can be formed. Of course, the materials, structures, or manufacturing method of the gate electrode layers 103 are not limited to these, and can be selected appropriately. For example, without using the resist 104, droplet discharge may be used to form the gate electrode layers 103 selectively.

As conductive materials, various materials can be selected depending on the function of a conductive film. Typically, silver (Ag), copper (Cu), gold (Au), nickel (Ni), platinum (Pt), chromium (Cr), tin (Sn), palladium (Pd), iridium (Ir), rhodium (Rh), ruthenium (Ru), rhenium (Re), tungsten (W), aluminum (Al), tantalum (Ta), indium (In), tellurium (Te), molybdenum (Mo), cadmium (Cd), zinc (Zn), iron (Fe), titanium (Ti), silicon (Si), germanium (Ge), zirconium (Zr), barium (Ba), antimony lead, tin oxide-antimony, fluorine-doped zinc oxide, carbon, graphite, glassy carbon, lithium, beryllium, sodium, magnesium, potassium, calcium, scandium, manganese, gallium, niobium, a sodium-potassium alloy, mixtures such as a magnesium/copper mixture, a magnesium/silver mixture, a magnesium/aluminum mixture, a magnesium/indium mixture, an aluminum/aluminum oxide mixture, and a lithium/aluminum mixture, particles or dispersed nanoparticles of silver halide, and indium tin oxide (ITO), ITSO (ITO including silicon or silicon oxide), zinc oxide (ZnO), gallium-doped zinc oxide (GZO), indium zinc oxide (IZO) of indium oxide mixed with zinc oxide at 2 to 20%, an organic indium compound, an organic tin compound, and titanium nitride, which are used as a transparent conductive film, can be appropriately employed.

As an etching gas in the case of forming the gate electrode layers by etching, a mixed gas of CF$_4$/Cl$_2$/O$_2$ or a Cl$_2$ gas is used. However, the etching gas is not limited these.

Figure 13D:
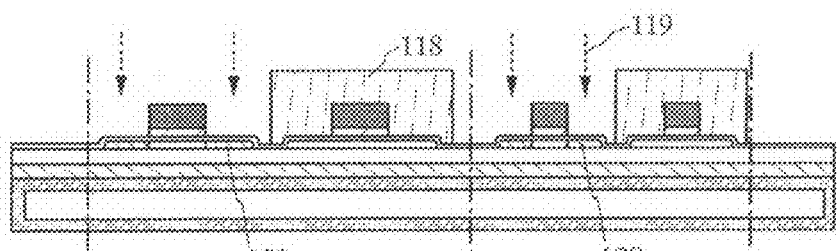

Next, portions to be p-channel TFTs 109 and 111 are covered with a resist 118, and the island-shaped semiconductor films to be n-channel TFTs 108 and 110 are doped with an impurity element 119 (typically, P (phosphorus) or As (arsenic)) imparting n-type conductivity at a lower concentration with the gate electrode layers as masks (first doping process shown in FIG. 13D). The conditions of the first doping process are as follows: dose amount: $1\times10^{13}$ to $6\times10^{13}$/cm$^2$; and accelerating voltage: 50 to 70 keV. However, the conditions are not limited to these. This first doping process makes through-doping through the gate insulating film 102 to form pairs of lower concentration impurity regions 120. The first doping process may be applied all over the area without covering the p-channel TFT regions with the resist.

Figure 13E:
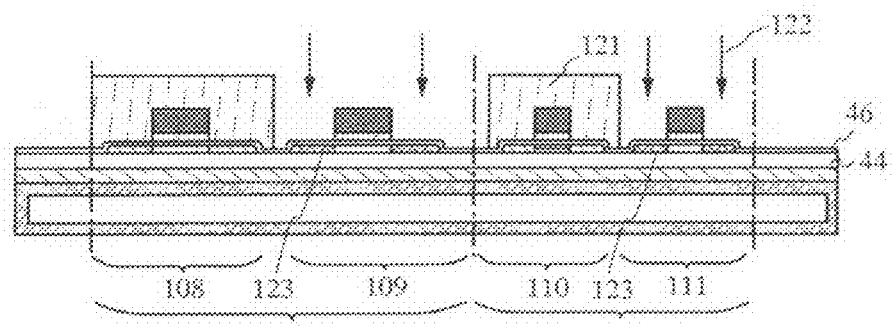

Next, after removing the resist 118 by a method such as ashing, a resist 121 is newly formed to cover n-channel TFT regions, and the island-shaped semiconductor films to be the p-channel TFTs 109 and 111 are doped with an impurity element 122 (typically, B (boron)) imparting p-type conductivity at a higher concentration with the gate electrode layers as masks (second doping process shown in FIG. 13E). The second doping process is performed under conditions as follows: dose amount: $1\times10^{16}$ to $3\times10^{16}/cm^2$; and accelerating voltage: 20 to 40 keV This second doping process makes through-doping through the gate insulating film 102 to form pairs of higher concentration p-type impurity regions 123.

Figure 14A:
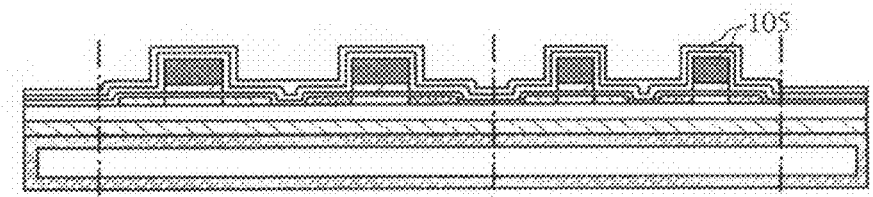
FIGS. 14A to 14E are diagrams for describing the manufacturing process of a semiconductor device element included in the thin film integrated circuit device according to the present invention.

Next, after removing the resist 121 by a method such as ashing, an insulating film 105 is formed over the substrate (FIG. 14A). A two-layered structure of a SiON (oxynitride silicon) that is silicon oxide including nitrogen) film with a film thickness of 100 nm and a LTO (Low Temperature Oxide) film with a film thickness of 200 nm is employed here, where the SiON film is formed by plasma CVD, and a $SiO_2$ film is formed by low pressure CVD as the LTO film. After that, not shown in the figure, the side of the substrate where the TFTs are formed is covered with a resist, and an insulating film formed on the backside is removed by etching (backside treatment).

Figure 14B:
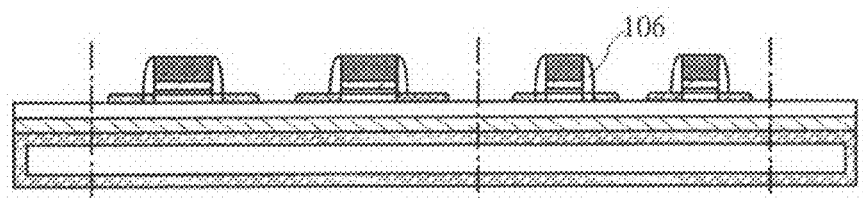

Next, with the resist left, the resist and the insulating film 105 are etched and removed by etch back to form sidewalls (side walls) 106 in a self-aligning manner (FIG. 14B). As an etching gas, a mixed gas of $CHF_3$ and He is used. The process of forming the sidewalls is not limited to these.

Figure 14C:
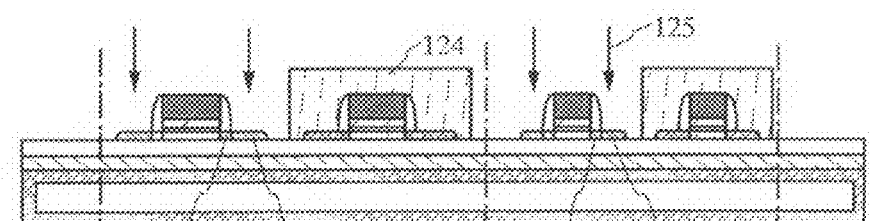

Next, a resist 124 is newly formed to cover the p-channel TFT regions, and with the gate electrode layers 103 and the sidewalls 106 as masks, doping at a higher concentration is performed with an impurity element 125 imparting n-type conductivity (third doping process shown in FIG. 14C). The third doping process is performed under conditions as follows: dose amount: $1\times10^{13}$ to $5\times10^{15}/cm^2$ and accelerating voltage: 60 to 100 keV. This third doping process makes through-doping through the gate insulating film 102 to form pairs of higher concentration n-type impurity regions 126.

Although not shown in the figure, the impurity regions may be thermally activated after removing the resist 124 by ashing or the like. For example, a heat treatment may be performed at 500° C. for 4 hours under a nitrogen atmosphere after forming a SiON film (oxynitride silicon film) of 50 nm. In addition, by a heat treatment at 410° C. for 1 hour under a nitrogen atmosphere after forming a SiNx film including hydrogen to have a film thickness of 100 nm, defects of the crystalline semiconductor film can be improved. This is a process, for example, for terminating dangling bonds existing in crystalline silicon, and is referred to as a hydrogenation treatment process. Further, after that, a SiON film with a film thickness of 600 nm is formed as a cap insulating film protecting the TFTs. The hydrogenation treatment process may be performed after forming the SiON film. In this case, the SiNx, SiON film (the film is laminated on the SiON film in this order) can be formed continuously. In this way, the insulating films of the three layers SiON, SiNx, SiON (in this order) are formed on the TFTs. However, the structures or materials of the insulating films are not limited to these. These insulating films, which also have a function of protecting the TFTs, are preferably formed.

Figure 14D:
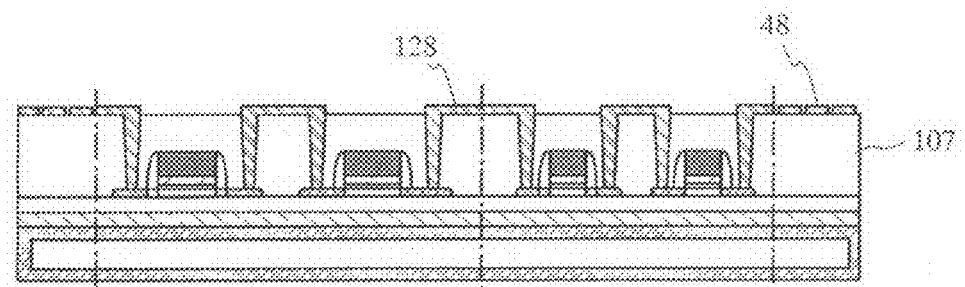

Next, an interlayer film 107 is formed over the TFTs (FIG. 14D). Polyimide, acrylic, polyamide, or heat-resistant organic resins such as siloxane can be used to form a film as the interlayer film 107. As a forming method thereof, a method such as spin coating, dipping, spraying, or droplet discharge, a doctor knife, a roll coater, a curtain coater, or a knife coater can be employed depending on the material. Also, inorganic materials may be used, and in this case, a film including a material such as PSG, BPSG, or alumina can be used. These insulating films may be laminated to form the interlayer film 107.

Next, after forming a resist, contact holes are formed by etching, and then a wiring 128 and an antenna 48 are formed (FIG. 14D). As a gas to be used for etching when the contact holes are formed, a mixed gas of $CHF_3$ and He is used. However, the gas to be used for etching is not limited to this mixed gas. The wiring 128 and the antenna 48 may be formed at the same time by using the same material, or may be formed separately. The wiring 128 connected to the TFT has a five-layered structure of Ti, TiN, Al—Si, Ti, TiN (the wiring is laminated in this oder) here, which is formed by patterning after forming by sputtering.

By mixing Si in the Al layer, a hillock can be prevented from being generated in resist baking of the patterning of a wiring. Instead of Si, Cu may be mixed in at approximately 0.5%. In addition, by sandwiching the Al—Si layer between Ti and TiN, the hillock-resistant property is further improved. During the patterning, it is preferable to use the above-mentioned hard mask including a material such as SiON. The materials or forming method of the wring are not limited to these. The above-mentioned materials to be used for the gate insulating layers may be employed. When the antenna 48 is formed, the various materials and methods described in the above embodiment modes can be used. The wiring and the antenna may be formed at the same time, or after forming one of the wiring and the antenna first, the other may be formed to overlap.

Figure 14E:
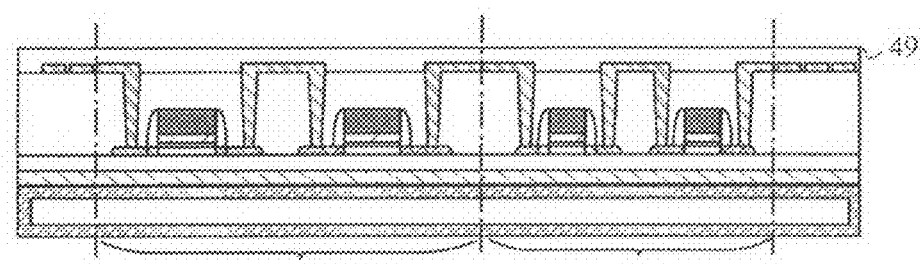

Next, a protective film 49 is formed on the wiring and the antenna to complete a CPU 33 and a memory 34 (FIG. 14E). As the protective film 49, a film including carbon such as DLC (diamond-like carbon) or carbon nitride (CN), silicon nitride, or a silicon oxynitride film, for example, can be used. As a forming method thereof, a method such as plasma CVD or atmospheric plasma can be used.

Alternatively, photosensitive or non-photosensitive organic materials such as polyimide, acrylic, polyamide, resist and benzocyclobutene and heat-resistant organic resins such as siloxane can be used to form a film as the protective film 49. As a forming method thereof, a method such as spin coating, dipping, spraying, or droplet discharge, a doctor knife, a roll coater, a curtain coater, or a knife coater can be employed depending on the material. Alternatively, a SOG film (for example, a SiOx film including an alkyl group) obtained by coating can also be used. Also, inorganic materials may be used, and in this case, a film including a material such as silicon oxide, silicon nitride, silicon oxynitride, PSG, BPSG, or alumina can be used. These insulating films may be laminated to form the protective film 49.

After that, in manner of the above embodiment mode, the plurality of TFTs manufactured according the present embodiment can be separated each IC chips, which can be incorporated commercial products. Although the TFTs have a top-gate structure in the present embodiment, a bottom-gate structure may be employed. The present embodiment can be freely combined with any of the other embodiment modes and embodiments.

Embodiment 2

In the present embodiment, a case of employing high-temperature polysilicon (HPS) in the process of Embodiment 1 will be described. In general, a semiconductor process including a crystallization process at the upper temperature limit (about 600° C.) of a glass substrate or more is referred to as a high-temperature process.

After forming a semiconductor film, the above-mentioned catalyst such as Ni is added to the semiconductor film, and then a heat treatment is performed in a LPCVD furnace. At about 700° C. or more, a crystal nucleus is generated in the semiconductor film to promote crystallization.

After that, a gate insulating film is formed by LPCVD after forming island-shaped semiconductor films. For example, gas of a silane-based gas mixed with $N_2$ or $O_2$ is used to form a HTO (High Temperature Oxide) film at a high temperature of 900° C. or more.

Next, by depositing polysilicon (p-Si) including an n-type impurity such as phosphorus to be a film thickness of 150 nm, gate electrode layers are formed. Further, W—Si (tungsten silicide) may deposited to be a film thickness of 150 nm. As a forming method thereof, a method such as sputtering or CVD can be appropriately employed. Doping processes thereafter can be performed in the same way as in Embodiment 1.

After the doping processes, thermal activation at 950° C. for 30 minutes is performed to activate impurity regions. Further, BPSG (borophosohposilicate glass) is used for reflow, and planarization is conducted by etch back with a resist. Furthermore, hydrogenation annealing at 350° C. is performed to recover plasma damage.

The other processes can be performed in the same way as in Embodiment 1. Although the TFTs have a top-gate structure in the present embodiment, a bottom-gate structure (inversely staggered structure) may be employed. The present embodiment can be freely combined with any of the other embodiment modes and embodiments.

Embodiment 3

In the present embodiment, a case of employing SAS (Semi-Amorphous Silicon) for the island-shaped semiconductor films 100 in the process of Embodiment 1 will be described. The SAS can be obtained by glow discharge decomposition of silicide gas. $SiH_4$ is a typical silicide gas, and in addition, it is also possible to use gasses such as $Si_2H_6$, $SiH_2Cl_2$, $SiHCl_3$, $SiCl_4$, and $SiF_4$. When this silicide gas is used after being diluted with one or more rare gas elements selected from the group consisting of hydrogen, hydrogen and helium, argon, krypton, and neon, the SAS can be easily formed. It is preferable to dilute the silicide gas at a dilution ration in the range of 10 to 1000 times. Of course, under reduced pressure, which may be in the range of approximately 0.1 Pa to 133 Pa, a film is formed by glow discharge decomposition. In order to generate glow discharge, electric power from 1 to 120 MHz, preferably high-frequency power from 13 to 60 MHz may be supplied. The substrate heating temperature is preferably 300° C. or less, and a substrate heating temperature from 100 to 200° C. is recommended.

In addition, a carbide gas such as $CH_4$ or $C_2H_6$ or a germanide gas such as $GeH_4$ or $GeF_4$ may be mixed in the silicide gas to control the energy band width to be 1.5 to 2.4 eV or 0.9 to 1.1 eV.

The SAS shows a weak n-type electric conduction property when no impurity element is added purposefully for valence electron control. This is because oxygen is easily mixed in the semiconductor film due to glow discharge at a higher electric power than in the case of depositing an amorphous semiconductor. Consequently, by doping the semiconductor film, in which a channel forming region of a TFT is provided, with an impurity element imparting p-type conductivity at the same time as this deposition or after the deposition, it becomes possible to control a threshold voltage. As the impurity element imparting p-type conductivity, boron is common, and an impurity gas such as $B_2H_6$ or $BF_3$ may be mixed in the silicate gas at a ratio of 1 to 1000 ppm. For example, in the case of using boron as the impurity element imparting p-type conductivity, the concentration of the boron may be controlled to be $1\times10^{14}$ to $6\times10^{16}$ atoms/cm$^3$. By using the SAS to form a channel forming region, a field effect mobility of 1 to 10 cm$^2$/V·sec can be obtained. The present embodiment can be freely combined with any of the other embodiment modes and embodiments.

Embodiment 4

In the present embodiment, structures that are different from the structure of the integrated circuit portion shown in Embodiment 1 will be described with reference to FIG. 15A to 15C.

Figure 15A:
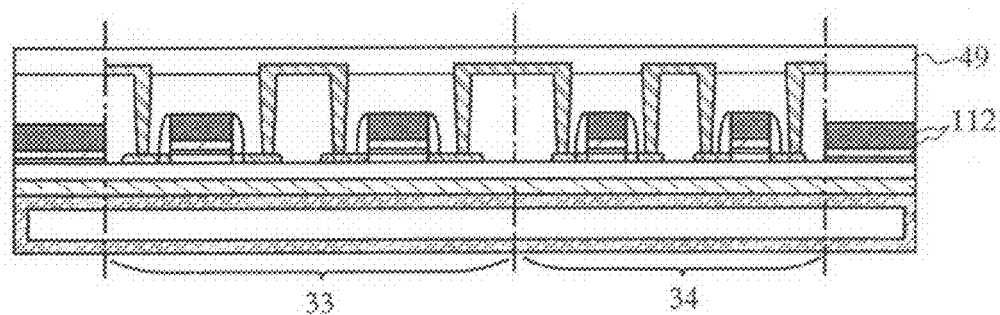
FIGS. 15A to 15C are diagrams for describing manufacturing processes of a semiconductor device element included in a thin film integrated circuit device according to the present invention.

FIG. 15A illustrates an example in which an antenna 112 and gate electrode layers 103 are formed in the same layer. In other words, with the use of the material of the gate electrode, the antenna 112 can be formed by etching into a desired shape at the same time as the formation of the gate electrode layers, by printing with the use of a conductive paste (specifically a Ag, Au, Cu, or Al paste), or by forming a depression in a gate insulating film and pouring an antenna material in the depression.

Figure 15B:
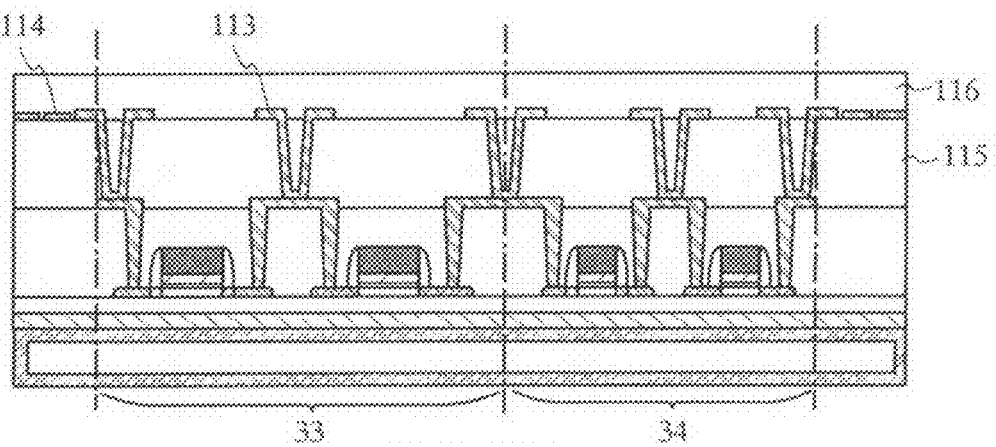

FIG. 15B illustrates an example in which, in the case of forming an antenna 114 and a protective film 116 on an interlayer film 115, the antenna 114 is connected to a TFT through an upper wiring 113. As a material for the upper wiring 113, the materials mentioned in Embodiment 1 can be appropriately employed. By forming the wiring heightwise in this way, an element can be reduced in size.

Figure 15C:
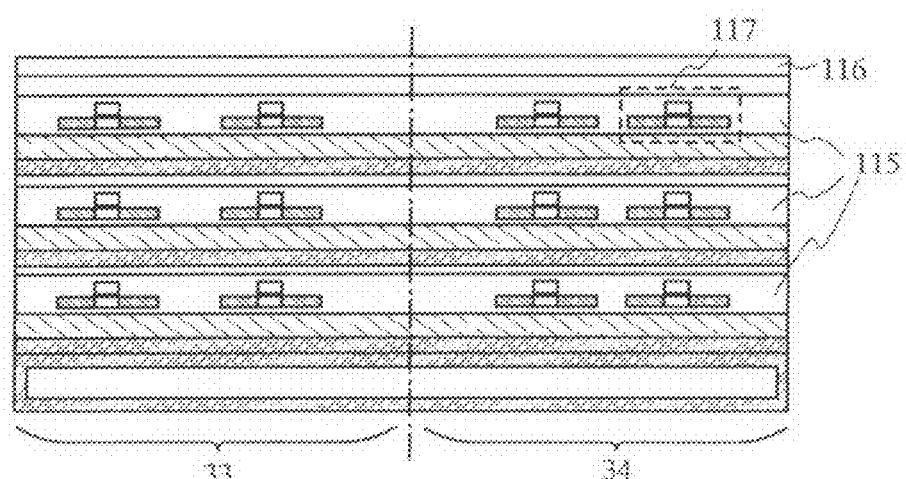

FIG. 15C illustrates a structure in which thin film integrated circuits such as a CPU 33 and a memory 34 are stacked. In this case, it is desirable that an insulating film 115 formed on each thin film transistor 117 is formed to include a highly elastic organic material. For example, photosensitive or non-photosensitive organic materials such as polyimide, acrylic, polyamide, resist and benzocyclobutene and heat-resistant organic resins such as siloxane can be used. As a forming method thereof, a method such as spin coating, dipping, spraying, or droplet discharge (for example, inkjet, screen printing, or offset printing), a doctor knife, a roll coater, a curtain coater, or a knife coater can be employed depending on the material. This concentrates stress due to a deformation on the insulating films including the organic material and a protective film, and then these films are mainly deformed. Therefore, stress applied on the thin film transistors is reduced. The present embodiment can be freely combined with any of the other embodiment modes and embodiments.

Embodiment 5

Figure 22A:
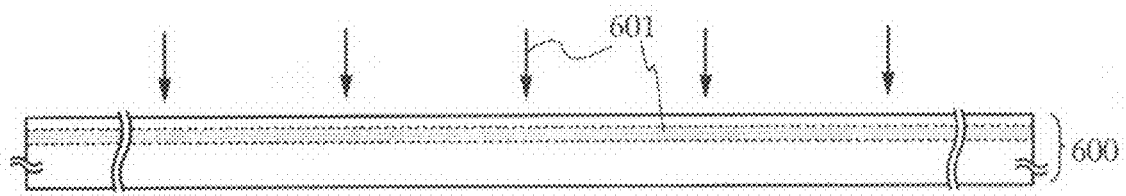
FIGS. 22A to 22D are diagrams for describing a manufacturing process of a thin film integrated circuit device according to the present invention (SIMOX substrate)
Figure 22B:
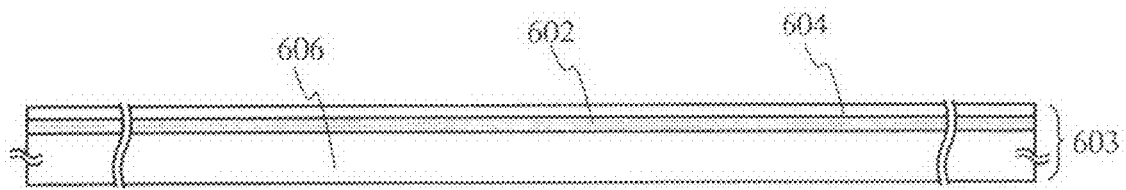

In the present embodiment, a method of manufacturing a thin film integrated circuit device with the used of a SIMOX substrate will be described with reference to FIGS. 22A to 22D and FIGS. 23A to 23C. First, a silicon wafer 600 is prepared, and oxygen ions 601 are injected by doping (FIG. 22A). Then, a buried oxide film 602 is formed by a heat treatment at 900 to 1200° C. (FIG. 22B). This heat treatment temperature is not limited to this. However, since the heat treatment also has a role of improving the degree of crystallinity of a single-crystal silicon (c-Si) layer 604 damaged by doping as well as the role of forming the buried oxide film, it is necessary to control the heating temperature in consideration of these roles. Thus, a SIMOX substrate 603 comprising a single-crystal silicon (c-Si) substrate 606 (lower single-crystal silicon layer), the buried oxide film 602, and the single-crystal silicon (c-Si) layer 604 (upper single-crystal silicon layer) is obtained.

Instead of oxygen ions, nitrogen ions may be injected by doping to obtain a SOI substrate. Although not shown in the figure, a polished substrate (a so-called laminated substrate) may be used, which has a device wafer on which an oxide film is formed (a Si substrate on the side of a device to be formed) and a handle wafer (a Si substrate) bonded to each other so that the oxide film is disposed in the center.

Figure 22C:
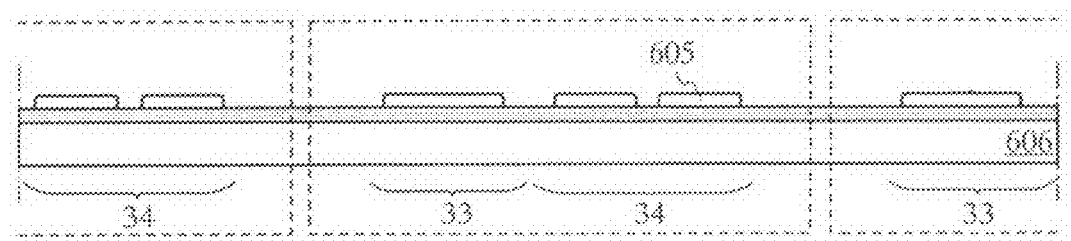
Figure 22D:
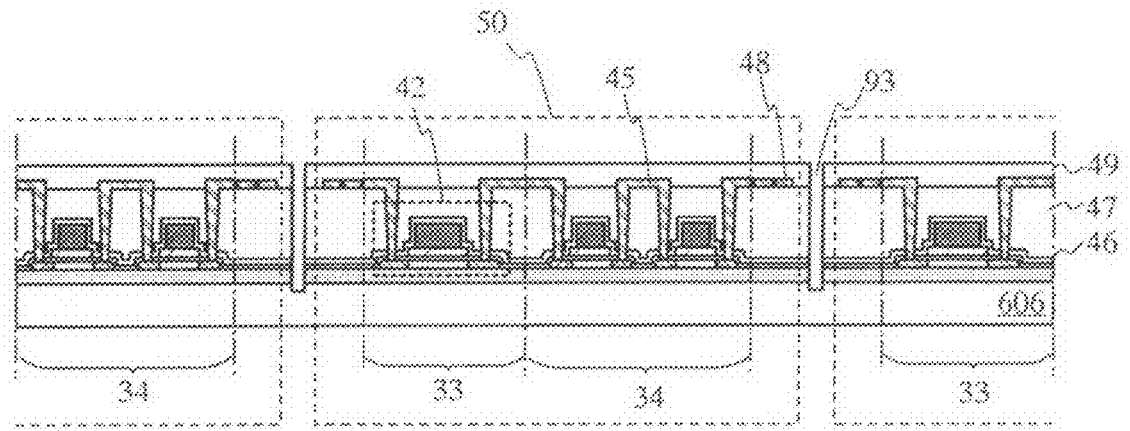

Next, island-shaped c-Si layers 605 are formed by etching the c-Si layer 604 with a material such as a resist as a mask (FIG. 22C). Then, semiconductor elements 42 such as a TFT, an organic TFT, or a thin film diode are formed on the SIMOX substrate 603 (over the c-Si substrate 606) (FIG. 22D). These semiconductor elements form a thin film integrated circuit, for example, a CPU and a memory. A thin film integrated circuit such as a CPU and memory using a TFT may be manufactured in accordance with, for example, Embodiment 1. The thin film integrated circuit device includes a power supply circuit, an input/output circuit, a logic circuit, a CPU, and a memory, as shown in FIG. 18. However, only a CPU 33 and memory 34 using TFTs are shown in the figure here.

After forming a plurality of thin film integrated circuit devices 50 over the c-Si substrate 606, a groove 93 is formed in a boundary region between thin film integrated circuit devices 50 by dicing (FIG. 22D). In this case, a blade dicing method using a dicing system (dicer) is commonly used. The blade is a grinding stone into which a diamond abrasive is implanted, which has a width of about 30 to 50 µm. By rapidly spinning this blade, the thin film integrated circuit devices are separated from each other. A necessary area for dicing is referred to as a street, which preferably has a width of 80 to 150 µM in consideration of damage to the elements.

In addition to dicing, a method such as scribing or etching with the use of a mask can be employed. In the case of scribing, a method such as diamond scribing or laser scribing is used. In the case of etching, after forming a mask pattern according to processes of exposure and development, the elements can be separated from each other by etching such as dry etching or wet etching. In dry etching, an atmospheric plasma method may be used.

In the case of forming the groove, the groove may have a depth to the point that at least a surface of the peel-off layer is exposed, and it is preferable that the method such as dicing is appropriately controlled in order not to scratch the substrate so that the thermally oxidized silicon substrate can be used repeatedly.

Figure 23A:
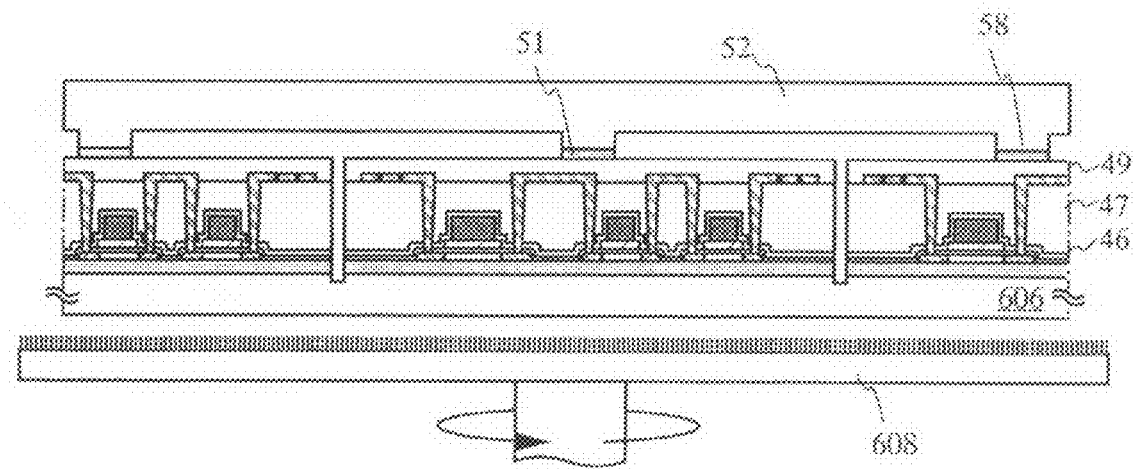
FIGS. 23A to 23C are diagrams for describing the manufacturing process of a thin film integrated circuit device according to the present invention (SIMOX substrate)

Next, a jig 52 with projecting portions 58 is attached in the same manner as in any of the embodiment modes and embodiments. After that, a grinder 608 is used to polish the backside of the c-Si substrate 606 (backgrinding) (FIG. 23A). This makes it possible to make the c-Si substrate 606 thinner and makes it easier to separate the c-Si substrate 606 by a halogen fluoride gas. In the case where it is desired to use the c-Si substrate 606 again, the backgrinding can be omitted.

Figure 23B:
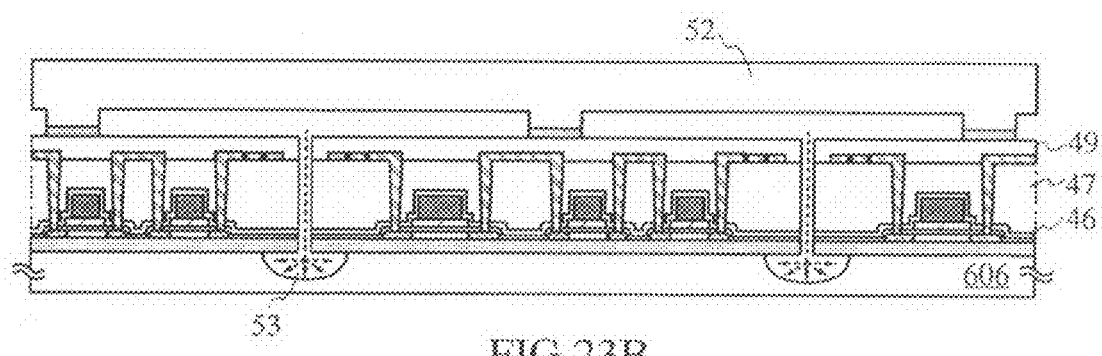

Next, by introducing halogen fluoride gas into the groove 93, at least a surface of the c-Si substrate 606 near the thin film integrated circuit devices is etched and removed (FIG. 23B). The low pressure CVD system shown in FIG. 26 is used for etching under conditions, Gas: ClF$_3$, Temperature: 350° C., Flow: 300 sccm, Pressure: 6 Torr, Time: 3 hours. However, the conditions are not limited to these. Alternatively, ClF$_3$ gas mixed with nitrogen may be used, where the flow ratio of the both can be appropriately determined.

Since the thickness of the c-Si substrate 606 is much thicker as compared to the size of the thin film integrated circuit device portion, a large part of the c-Si substrate 606 is left without being etched even when the thin film integrated circuit devices are separated by etching with halogen fluoride gas. Therefore, this used substrate can be used again by polishing or planarization in accordance with the method described in Embodiment Mode 3, which leads to reduction in cost (refer to FIGS. 5A and 5B and FIGS. 6A to 6C). In the case of reuse, the used substrate can be used again as a thermally oxidized silicon substrate as described in Embodiment Mode 1, or as a SIMOX substrate or a laminated substrate as described in the present embodiment.

Figure 23C:
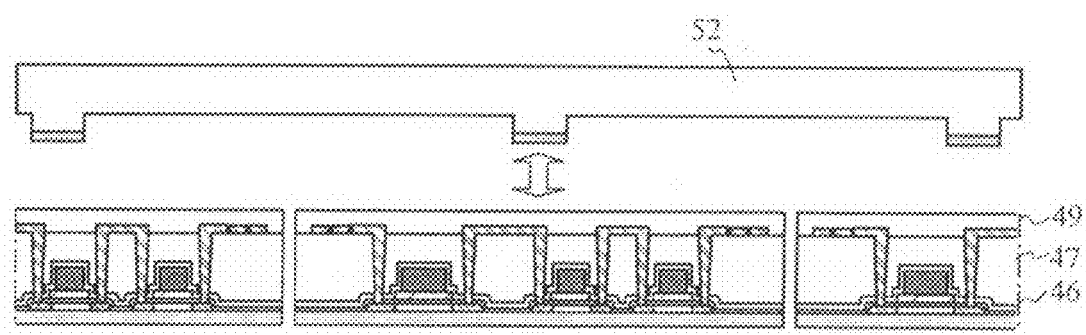

Next, the adhesion of a temporary adhesive material 51 is reduced or lost by UV light irradiation to separate the jig from the thin film integrated circuit devices (FIG. 23C). This makes it possible to mass-produce thin film integrated circuit devices. It is preferable to use the jig again for reduction in cost.

The thin film integrated circuit device 50 manufactured according to the method described above can be carried with the use of, for example, small vacuum tweezers 13, and attached to desired products, as shown in FIGS. 3A and 3B. An ID label 15 is completed by attaching the thin film integrated circuit device 50 to a label 11 with the small vacuum tweezers 13, and then sealing with an adhesive material 14. Further, the ID label 15 is attached to a commercial product 10 to complete a commercial product with information that can be recognized, updated, and managed by, for example, a reader/writer.

Alternatively, the thin film integrated circuit device 50 manufactured according to the method described above may be encapsulated by a cover 800 with an adhesive material 801, for example, as shown in FIG. 10A. FIG. 10B shows a perspective view of the encapsulation state.

Embodiment 6

In the present embodiment, a thin film integrated circuit device and manufacturing method thereof according to the present invention will be described with reference to FIGS. 34A and 34B and FIG. 35. The method has no temporary adhesive bonding with the use of a jig. First, the state of FIG. 1C is made in the same way as in Embodiment Mode 1.

Next, in the state of FIG. 1C, a plurality of thermally oxidized silicon substrates 41 or SOI substrates such as SIMOX substrates, on which thin film integrated circuit devices are formed, are put with their faces down in a furnace (bell jar; refer to FIG. 26) of a low pressure CVD system, which is equipped with a 703 tray, and fixed. The substrate and the tray may be put at the same time. This is similar also in the case where low pressure CVD is not used. Then, when halogen fluoride such as ClF$_3$ is used to etch a peel-off layer, the separated thin film integrated circuit devices are made to fall into the tray 703 (FIG. 34A). However, in order to prevent the substrate on which the thin film integrated circuit devices used to be formed from falling down, the substrate needs to be fixed by, for example, a frame located in the furnace.

The distance between the tray and the thin film integrated circuit device is preferably 0.5 to 1 mm in order to prevent the separated thin film integrated circuit devices from separating discretely and easily supply halogen fluoride such as ClF$_3$. Further, in order to prevent the separated thin film integrated circuit devices from separating discretely, it is preferable to form projecting portions in the tray 703 depending on the size of the thin film integrated circuit device (FIG. 34A).

After separating the devices, the thin film integrated circuit device on the tray is carried with the use of a microscopic pin 701 or small vacuum tweezers and transferred to a desired product (FIG. 34B).

Figure 35:
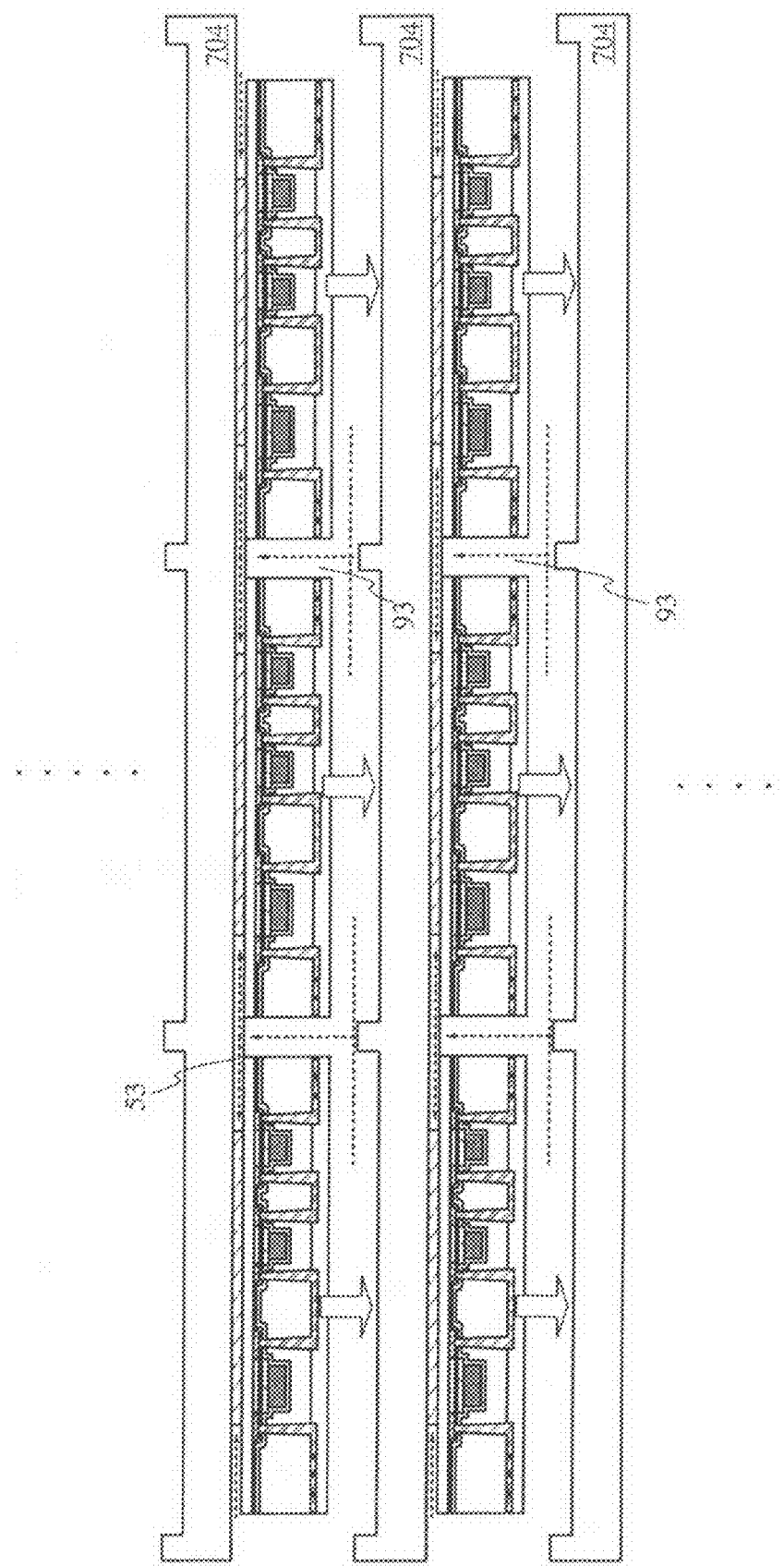
FIG. 35 is a diagram for describing a manufacturing process of a thin film integrated circuit device according to the present invention (using a substrate to be used also as a tray).

FIG. 35 is a diagram for describing a method in which a substrate 704 that also serves as the tray is used as a substrate on which thin film integrated circuit devices are formed prior to separation of the thin film integrated circuit devices. For example, a plurality of substrates are put in a furnace of a low pressure CVD system, and fixed (refer to FIG. 26). This is similar also in the case where low pressure CVD is not used. Then, when halogen fluoride such as $ClF_3$ is used to etch a peel-off layer, upper thin film integrated circuit devices fall into the backside (where projecting portions are preferably formed) of a substrate 704 on which lower thin film integrated circuit devices used to be formed, as shown in FIG. 35.

As the tray 703 or the substrate that serves also as the tray, various substrates, for example, a thermally oxidized silicon substrate, a SOI substrate such as a SIMOX substrate, a glass substrate, a quartz substrate, a SUS substrate, an alumina substrate, and a heat-resistant flexible substrate (plastic substrate), can be used. However, it is preferable to be resistant to halogen fluoride and heat.

The use of the method described above makes it possible to mass-produce thin film integrated circuit devices without using a jig. The present embodiment can be freely combined with any of the other embodiment modes and embodiments.

Embodiment 7

Figure 25A:
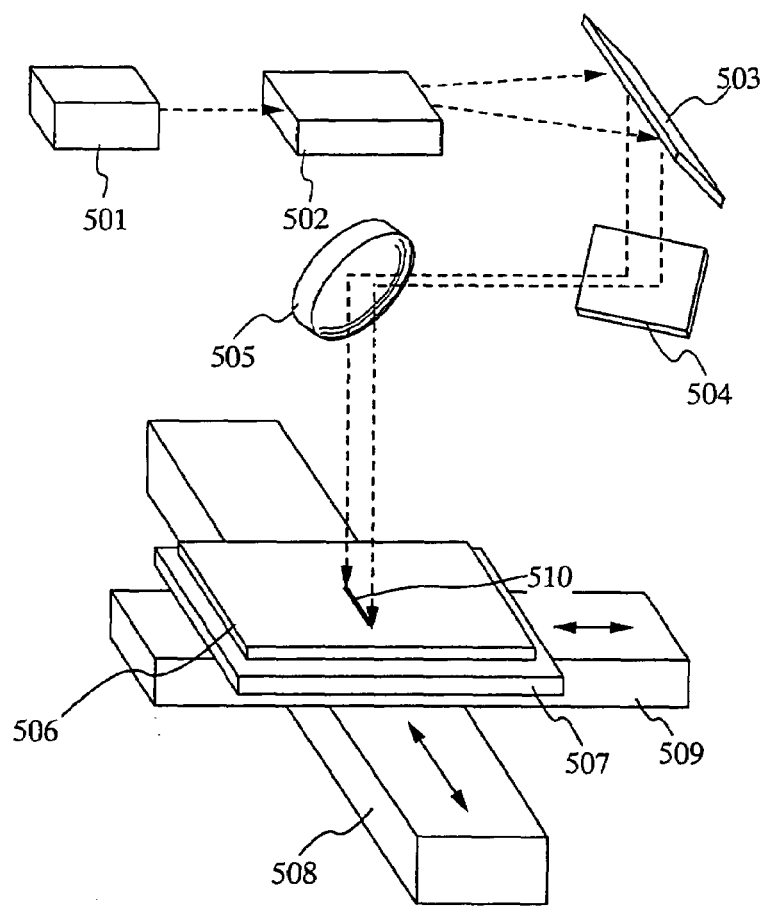
FIGS. 25A and 25B are schematic diagrams of a linear laser irradiation system that is used in the present invention.
Figure 25B:
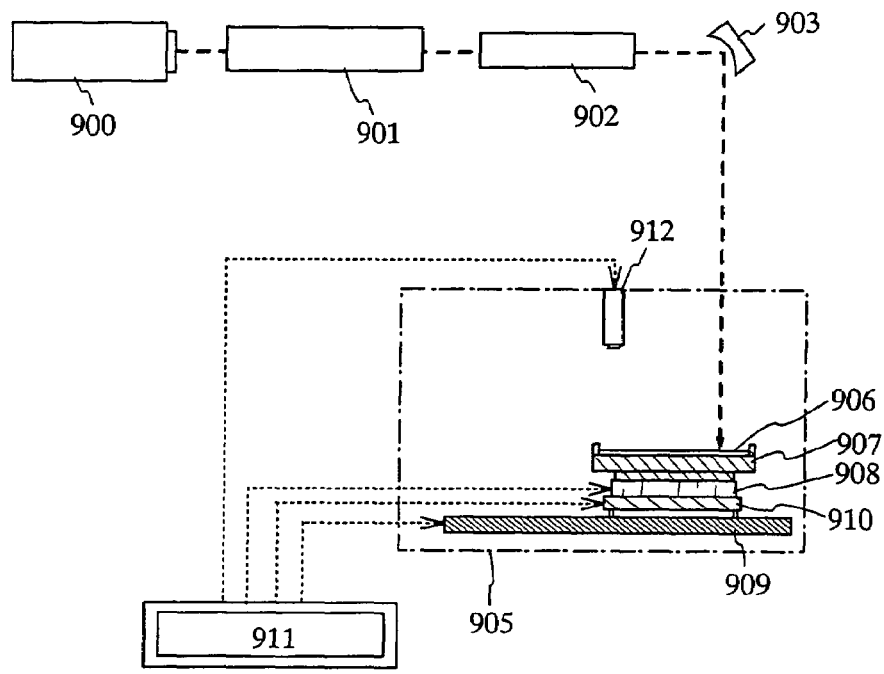

In the present embodiment, a method of manufacturing a thin film integrated circuit device by using a linear laser system will be described with reference to FIGS. 25A and 25B. FIG. 25A shows a laser apparatus, which has a laser oscillator 501 including an excitation source, a laser medium, and a non-linear optical element, an optical system 502 including a cylindrical lens array, a first reflector 503, a second reflector 504, a condenser 505 that condenses both of a fundamental wave and the second harmonic, a stage 507 for fixing an irradiated object 506, and an uniaxial robot 508 for X axis and uniaxial robot 509 for Y axis that are means for moving the stage.

The laser apparatus shown in FIG. 26A can be used when a groove is formed between a plurality of thin film integrated circuit devices or when a semiconductor film of a semiconductor element included in a thin film integrated circuit device is crystallized.

In the present embodiment, a case of an internal conversion type laser system in which the non-linear optical element is incorporated in the laser oscillator will be described. However, an external conversion type laser system in which the non-linear optical element is provided outside the laser oscillator may be employed. The optical system 502 includes a homogenizer structured by a cylindrical lens or the like. The first and second reflectors 503 and 504 and the condenser 505 may be respectively provided in predetermined positions as appropriate.

Since the condenser 505 is required to condense both of a fundamental wave and the second harmonic, an achromat lens without chromatic aberration can be used, for example. Alternatively, a reflector with a curved surface, for example, a concave mirror, may be used for cost reduction. In the case of using a concave mirror, without depending on the wavelength, laser light is all reflected without chromatic aberration so that the laser light can be condensed on a surface to be irradiated. In FIG. 25A, laser light may be made incident into the condenser 505 directly from the optical system 502 to irradiate an irradiated object with linear laser.

Namely, the optical system 502 and the condenser 505 correspond to a means for processing laser light into linear laser at a surface to be irradiated. Alternatively, laser light can be processed into linear laser by locating a plurality of cylindrical lenses or combining any of a convex lens and a concave lens.

From the laser oscillator 501, that is, pulse oscillation laser of oscillation power of 200 to 300 W, for example, Nd:YAG laser, a fundamental wave of an oscillation wavelength of 1064 nm and the second harmonic of an oscillation wavelength of 532 nm are emitted without separating from each other. When more appropriate, the fundamental wave is emitted from the laser oscillator 501 and converted into the (second?) harmonic, and then, laser light with the both wavelengths is emitted. In this case, the frequency of the fundamental wave and the second harmonic is approximately 1 kHz, and the pulse width thereof is approximately 120 ns.

It is preferable that the laser light has a $TEM_{00}$ mode (single mode) obtained from a stable oscillator. In the case of the $TEM_{00}$ mode, laser light has an intensity distribution like Gaussian distribution and is highly condensed so that a beam spot can be processed easily.

The shape of the beam spot of the laser light is processed by the optical system 502 so that the laser light is shaped at a surface of an irradiated object (a surface to be irradiated) to have a uniform energy distribution. As appropriate, the laser light is reflected by the first reflector 503 and the second reflector 504 to change the traveling direction thereof. Then, the irradiated object 506 is irradiated with the laser light through the condenser 505. As the first and second reflectors 503 and 504, mirrors can be used.

In particular, by transmitting the laser light through the condenser 505, the laser light can be condensed into linear laser 510 at the surface to be irradiated. The beam spot at the surface to be irradiated has a liner shape, for example, like the linear laser 510 with a length of 100 nm and a width of 20 μm. This linear shape makes it possible to improve throughput of laser annealing. Further, large area processing is possible by processing into the linear laser.

In the present embodiment, a substrate over which a thin film integrated circuit device is formed as the irradiated object 506 is located parallel to the horizontal plane. A semiconductor film is formed over the glass substrate 0.7 mm thick. In order to prevent the substrate from falling during laser irradiation, the stage 507 has an adsorption mechanism provided to fix the substrate. The adsorption mechanism makes it possible to fix the substrate so as to reduce deflection of the substrate. Further, laser processing can be performed with the substrate curved in a predetermined shape.

The stage 507 can be moved in the X and Y directions in a plane parallel to the surface to be irradiated by the uniaxial robot 508 for X axis and the uniaxial robot 509 for Y axis. Namely, the uniaxial robot 508 for X axis and the uniaxial robot 509 for Y axis correspond to a means for relatively moving the irradiated object 506 with respect to the laser light.

The laser irradiation apparatus like this is used to perform laser scribing at a substrate passing pitch of about 1 to 30 μm per pulse.

A case of using the laser system for crystallization of a semiconductor film will be described below. In the case where the processed object is a semiconductor film and the whole area of the semiconductor film is irradiated with laser light, the uniaxial robot 509 for Y axis is used to perform scanning in one direction, and then, the uniaxial robot 508 for Y axis is used to slide the linear laser 510 in a direction perpendicular to the scanning direction of the uniaxial robot 509 for Y axis. By repeating scanning by the uniaxial robot 509 for Y axis and scanning by the uniaxial robot 508 for Y axis one after the other, the whole area of the irradiated object 506 can be irradiated with the laser light.

The region irradiated with the laser light, in which a crystal grain grown in the scanning direction, is remarkably superior in crystallinity. Therefore, when this region is used for a channel forming region of a TFT, an extremely high electrical mobility and ON current can be expected. However, in the case where there is a portion of the crystalline semiconductor film, which is not required to have such high crystallinity, the laser irradiation is arranged so that the portion is not irradiated with the laser light. Alternatively, the irradiation of the laser light may be performed under the condition, for example, at an increased scanning speed, in order not to obtain high crystallinity. By partly increasing the scanning speed, the throughput can be further enhanced.

For both laser scribing and crystallization, as for scanning of the laser light, there are a method of moving an irradiation position of laser light while fixing a substrate as a processed object (a type of moving an irradiation system), a method of moving the substrate while fixing the irradiation position of laser light (a type of moving a processed object), and a combined method of the above-mentioned two methods. In the case of the laser irradiation apparatus of the present embodiment, the type of moving a processed object is suitable since the optical system can be made to have the simplest configuration. However, the laser irradiation apparatus is not limited to this type. It is not impossible to employ the type of moving an irradiation system or combine the type of moving a processed object and the type of moving an irradiation system by contriving an optical system. In any case, it is only necessary to control the relative moving direction of a beam spot to a semiconductor film.

In this way, a fundamental wave and the harmonic from one oscillator are used for irradiation without separating from each other. Therefore, the required number of oscillators is only one, and the running cost of the oscillator is lower. Further, since it is unnecessary to emit laser light including a fundamental wave and laser light including the harmonic from separate oscillators and combine the fundamental wave and the harmonic at a surface to be irradiated, the optical adjustment is easier. Furthermore, since processing into linear laser is performed in the same optical system, the optical system is simpler.

In the present embodiment, by laser annealing with the use of combined light of laser light including a fundamental wave and laser light including a wavelength which is shorter than visible light, a high-quality crystalline semiconductor film can be obtained. Consequently, a high-performance thin film transistor and a semiconductor device including the thin film transistor can be manufactures at low cost with high throughput.

As shown in the present embodiment, a solid laser using a solid as a laser medium is maintenance-free, and the output thereof is stable. In particular, in the case of using the solid laser as a pulse laser, it is believed that the solid laser is more mass productive than excimer laser from the viewpoint of being capable of repeated oscillations.

The optical system in the laser irradiation apparatus is not limited to the configuration described in the present embodiment. Although in the present embodiment, a case of using pulse oscillation laser is described, continuous wave laser may be used.

Next, a whole system for a laser irradiation apparatus will be described. FIG. 25B illustrates a whole system for a laser irradiation apparatus. In the present embodiment, laser light including a fundamental wave and a wavelength shorter than the fundamental wave by pulse oscillation is emitted from a laser oscillator 900.

The laser light emitted from the laser oscillator 900, which has the fundamental wave and the second harmonic into which the fundamental wave is converted by a non-linear optical element, is made to incident to a beam expander 901. The expanse of the incident laser light is suppressed by the beam expander 901 to control the shape of cross-section of the beam.

The laser light emitted from the beam expander 901 is processed in a cylindrical lens 902 so that the cross-section of the beam has a rectangular, elliptic, or linear shape. Then, the laser light is reflected by a concave mirror 903 corresponding to a condenser and condensed in a linear shape to irradiate an irradiated object 906 in a laser irradiation chamber 905.

In the laser irradiation chamber 905, the irradiated object 906 is arranged on a stage 907, and the position of the stage 907 is controlled by three uniaxial robots 908 to 910 that serve as position control means. Specifically, the stage 907 can be rotated in a horizontal plane and inclined to the horizontal plane by the uniaxial robot 908 for $\phi$ axis. The stage 907 can also be moved in the direction of the X axis by the uniaxial robot 909 for X axis. Further, the stage 907 can also be moved in the direction of the Y axis by the uniaxial robot 910 for Y axis. The operation of each position control means is controlled by a central processor 911.

As in the present embodiment, a monitor 912 using a light-receiving element such as CCD may be provided to make it possible to grasp the position of the irradiated object 906 accurately.

By using this system for a laser irradiation system, laser irradiation can be performed based on accurate position control. Further, the stage can be fixed to keep an irradiated object horizontal or inclined so that laser irradiation can be performed from a vertical direction or an oblique direction.

Embodiment 8

Figure 32:
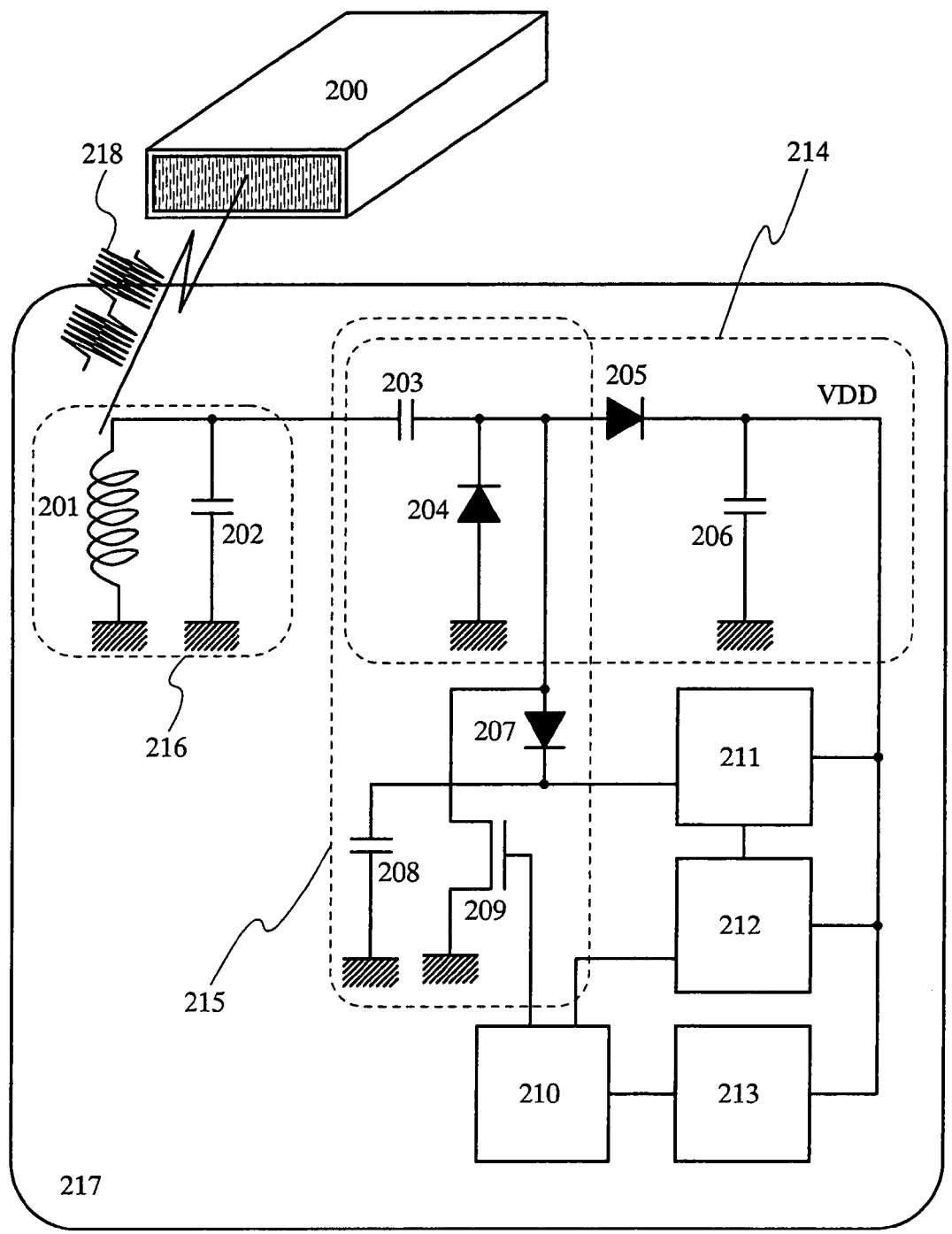
FIG. 32 is a circuit diagram of a non-contact type thin film integrated circuit device according to the present invention.

In the present embodiment, a structure of an ID chip that has a thin film integrated circuit device according to the present invention will be described with reference to FIGS. 32, 33A and 33B. FIG. 32 shows schematic diagram of an ID chip 217, which includes a power supply circuit 214, an input/output circuit 215, an antenna circuit 216, a logic circuit 210, an amplifier 211, a clock generation circuit and decoder 212, and a memory 213. The antenna circuit 216 has an antenna wiring 201 and an antenna capacitor 202.

The ID chip 217 operates without its own power supply since electric power is supplied by receiving an electromagnetic wave 218 emitted from a reader/writer 200. When the antenna circuit 216 receives the electromagnetic wave 218 from the reader/writer 200, a signal as a detected output signal is detected by the input/output circuit 215 including a first capacitor means 203, a first diode 204, a third diode 207, and a third capacitor means 208. This signal is amplified by the amplifier 211 to have a sufficiently large amplitude, and then, separated into a clock with data and an instruction by the clock generation circuit and decoder 212. The transmitted instruction is decoded by the logic circuit 210 to make a reply of data in the memory 213 and write necessary information in the memory, for example.

The reply is made by on/off of a switching element 209 in accordance with the output of the logic circuit 210. This changes the impedance of the antenna circuit 216 to result in a change in reflectivity of the antenna circuit 216. The reader/writer 200 reads information of the ID chip by monitoring the change in reflectivity of the antenna circuit 216.

The electric power to be consumed by the respective circuits in the ID chip is supplied from a direct-current power source VDD generated by detecting and smoothing the electromagnetic wave 218 received by the power supply circuit 214. The power supply circuit 214 has, like the input/output circuit 215, the first diode 204, the first capacitor means 203, a second diode 205, and a second capacitor means 206, where the second capacitor means 206 is settled to have sufficiently large value in order to supply electric power to the respective circuits.

Figure 33:
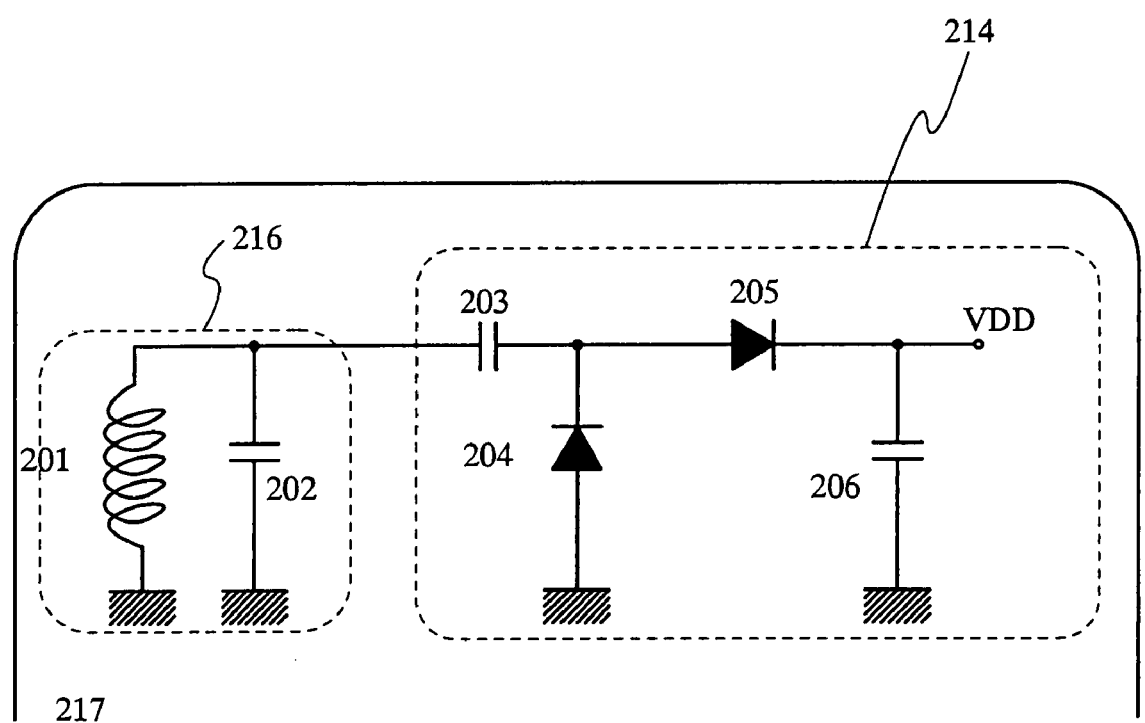
FIG. 33 is a diagram illustrating an antenna circuit diagram and power supply circuit diagram of the non-contact type thin film integrated circuit device according to the present invention.

FIG. 33 shows the antenna circuit 216 and the power supply circuit 214 extracted from the circuits to be used in the ID chip 217. The antenna circuit 216 has the antenna wiring 201 and the antenna capacitor 202. The power supply circuit 214 has the first capacitor means 203, the first diode 204, the second diode 205, and the second capacitor means 206.

The operation without a battery can be one of features of the ID chip. However, as described above, the ID chip has a mechanism that: an electromagnetic wave emitted from the reader/writer 200 is taken in by the antenna circuit 216 and rectified by the power supply circuit 214 to generate a direct-current power source; and the circuits incorporated in the ID chip operate by the direct-current power source.

Embodiment 9

In the present embodiment, a method for the management of a commercial product carrying a thin film integrated circuit device (for example, an ID label or an ID tag) according to the present invention and flows of information and commercial products will be described with reference to FIGS. 16 to 18. A case of using a non-contact type thin film integrated circuit device will be described in the present embodiment.

Figure 16:
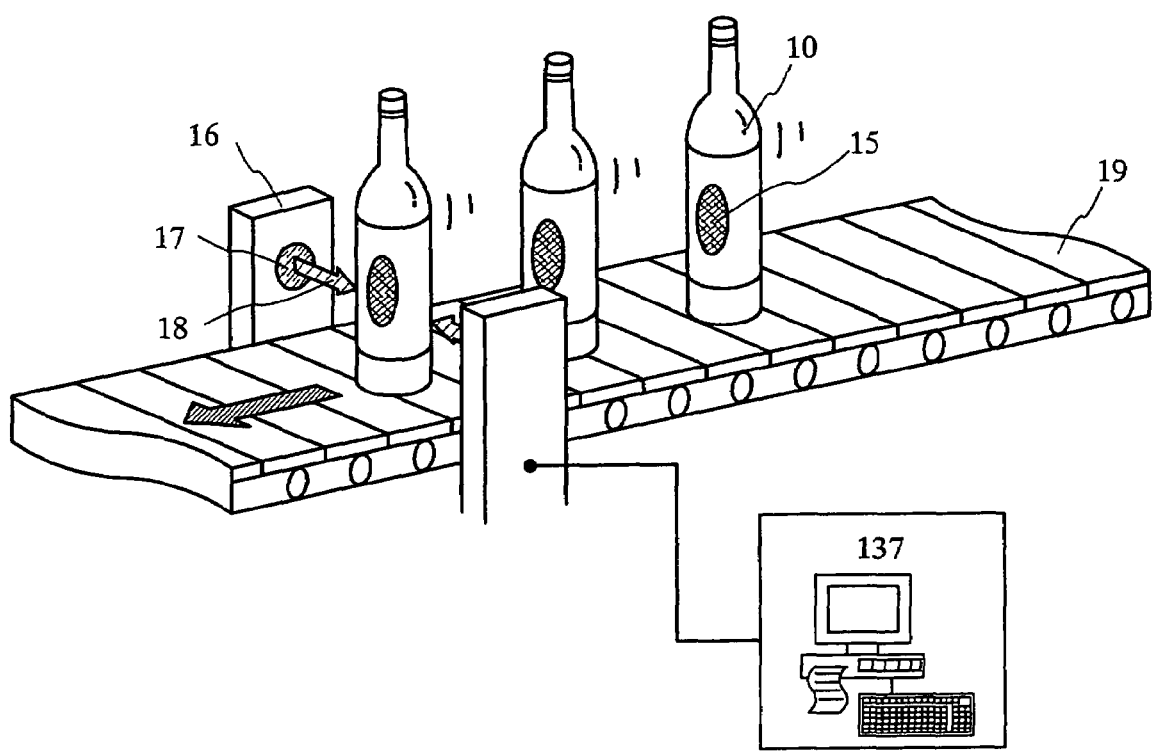
FIG. 16 is a diagram for describing reading and writing of information on a commercial product carrying a non-contact type thin film integrated circuit device according to the present invention.

As shown in FIG. 16, information that is necessary for managing commercial products is input into a host computer before shipping products from a manufacturer or before displaying commercial products by a seller. For example, a plurality of commercial products 10 (or boxes, cardboard boxes including the commercial products packed) carrying ID labels 15 are made to go through a reader/writer 16 by using a conveying means 19 such as a belt conveyor, each of the ID labels 15 receives a radio wave 18 emitted from a reader/writer antenna 17, and a radio wave returned from an antenna of each of the ID labels 15 is used to input information on the commercial product into a computer 137. In this case, the reader/writer may be directly connected to the computer.

A great deal of information on the commercial products, which is stored in the ID labels 15, can be input into the computer 137 instantly. Further, the computer has software that has a function of processing the information on the commercial products. Of course, hardware may be used for information processing. Accordingly, as compared with work of reading a bar-code one-by-one in the conventional way, time and labor for information processing and errors are reduced to reduce burden for management of the commercial product.

Now, a principle of communication with a non-contact type thin film integrated circuit device will be briefly described with reference to FIG. 18. For example, when a commercial product that has a non-contact type thin film integrated circuit device 132 is held over a reader/writer 136, an antenna circuit in the non-contact type thin film integrated circuit device 132 receives a radio wave transmitted from an antenna circuit of the reader/writer 136 to generate electromotive force due to resonance (such as electromagnetic induction) in a power supply circuit 26. Then, a thin film integrated circuit 25 (IC chip) in the non-contact type thin film integrated circuit device 132 is started to convert information in the chip to signals, and then, the signals are transmitted from the antenna circuit on the side of the chip. The signals are received by the antenna circuit of the reader/writer 136, and transmitted through a controller 135 to a host computer 137 for data processing. The host computer may have a means as a reader/writer. The antenna circuit portion of the thin film integrated circuit device 132) has a RF (Radio Frequency) interface 130 and a non-contact interface 131, and the antenna circuit portion of the reader/writer 136 has a non-contact interface 133 and an interface circuit 134. However, the antenna circuit portions are not limited to these structures.

For a memory 29, for example, a ROM (Read On Memory), a RAM (Random Access Memory), a PROM, an EPROM or an EEPROM (Electronically Erasable and Programable Read Only Memory), or a FRAM (FeRAM; Ferroelectric Random Access Memory) is used. In the case of using a PROM or an EPROM, writing is not possible except when a card is issued, while rewriting is possible in the case of an EEPROM. These memories may be selected depending on the application.

The power supply circuit 29 may have, for example, a diode and a capacitor, which has a function of converting alternating-current frequency waves to direct-current frequency waves.

It is a feature of a non-contact type at electric power is supplied by electromagnetic induction (electromagnetic induction type), mutual induction (electromagnetic coupling type), or induction due to static electricity (static coupling type) of a coiled antenna. By controlling the number of windings of this antenna, the frequency to be received can be selected.

Although not shown in the figure, an instruction execution unit referred to as a coprocessor, which is used exclusively for code processing, may be connected to a CPU. This enables code processing that is necessary for applications such assettlements.

Figure 17:
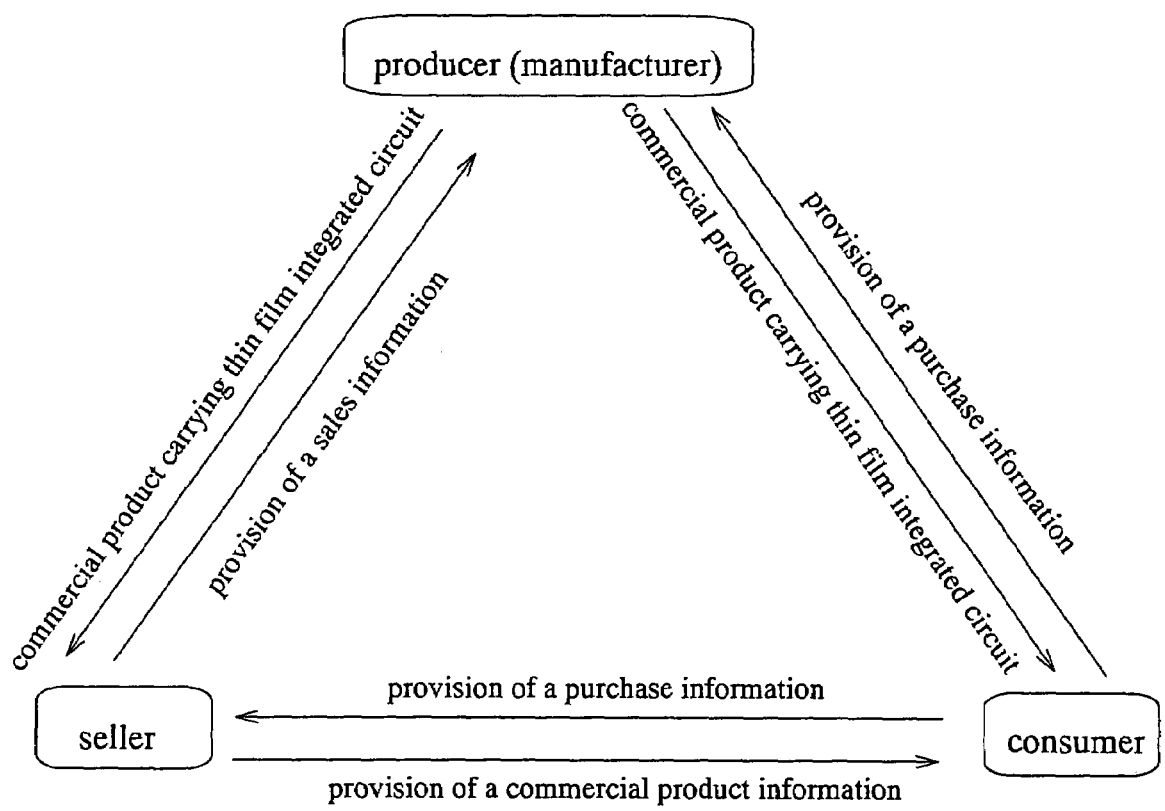
FIG. 17 is a diagram showing the relationship among a producer (manufacturer), a seller, and a consumer.

In addition, FIG. 17 shows flows of information and commercial products among a producer (manufacturer), a seller, and a consumer. The producer (manufacturer) provides a commercial product carrying a thin film integrated circuit device to the seller (such as a retailer or a distributor) or the consumer. Then, the seller can provide sales information such as price information, the number of sold commercial products, and time of the sales to the producer (manufacturer) on settlement of the consumer, for example. On the other hand, the consumer can provide purchase information such as personal information. For example, by using a credit card carrying a thin film integrated circuit device or a personal reader, or the like, the purchase information can be provided through the Internet to the seller and the producer (manufacturer). Further, the seller can provide commercial product information to the consumer by using the thin film integrated circuit device while the seller can obtain the purchase information from the consumer. These sales information and purchase information, or the like is valuable information, and useful for future marketing strategy.

As a means for providing the wide variety of information, there is a method in which information read from the thin film integrated circuit device by a reader of the seller or the consumer is disclosed through a computer or a network to the producer (manufacturer), the seller, or the consumer. As described above, the wide variety of information can be provided through the thin film integrated circuit device to the party that needs the information, and the thin film integrated circuit device is also useful in commodity exchange and commodity management.

Embodiment 10

In the present embodiment, a method of reading information on a commercial product carrying a thin film integrated circuit device (for example, an ID label or an ID tag) according to the present invention will be described with reference to FIGS. 19A to 19C. A case of using a non-contact type thin film integrated circuit device will be described in the present embodiment.

Figure 19A:
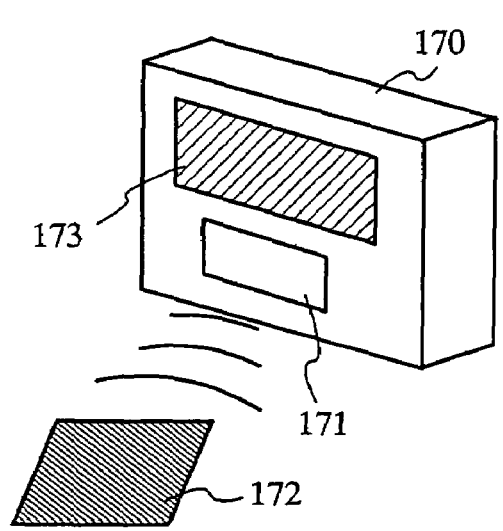
FIGS. 19A to 19C are diagrams for describing examples of a reader/writer.

As shown in FIG. 19A, a commercial product 172 carrying an ID label is held over a sensor portion 171 of a main body 170 of a reader/writer. Then, raw materials of the commercial product, the place of origin thereof, a test result per production (manufacturing) process thereof, and the history of a distribution process thereof, for example, are displayed on a display portion 173, and further, information on the commercial product such as a description of the commercial product is displayed. Of course, it is not always necessary that the reader/writer have the display portion, which may be provided separately. This reader/writer may be placed at a shelf where the commercial product is displayed.

Figure 19B:
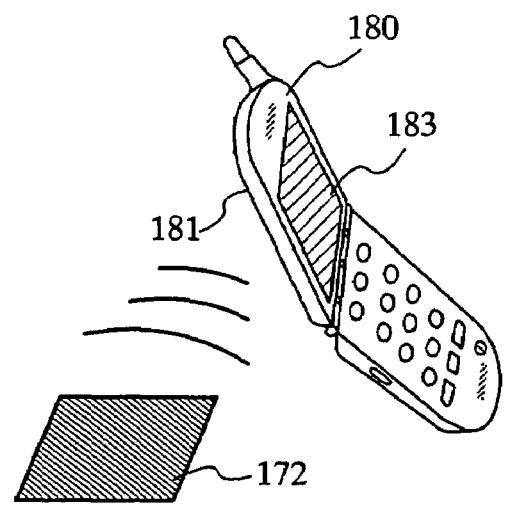

As shown in FIG. 19B, a personal potable information terminal, for example, a main body of a cellular phone 180 is mounted with a function as a reader/writer, and a commercial product 172 carrying an ID label is held over a sensor portion 181 provided in a portion of the main body to display information on a display portion 183. Then, information on the commercial product is displayed in the same way.

Figure 19C:
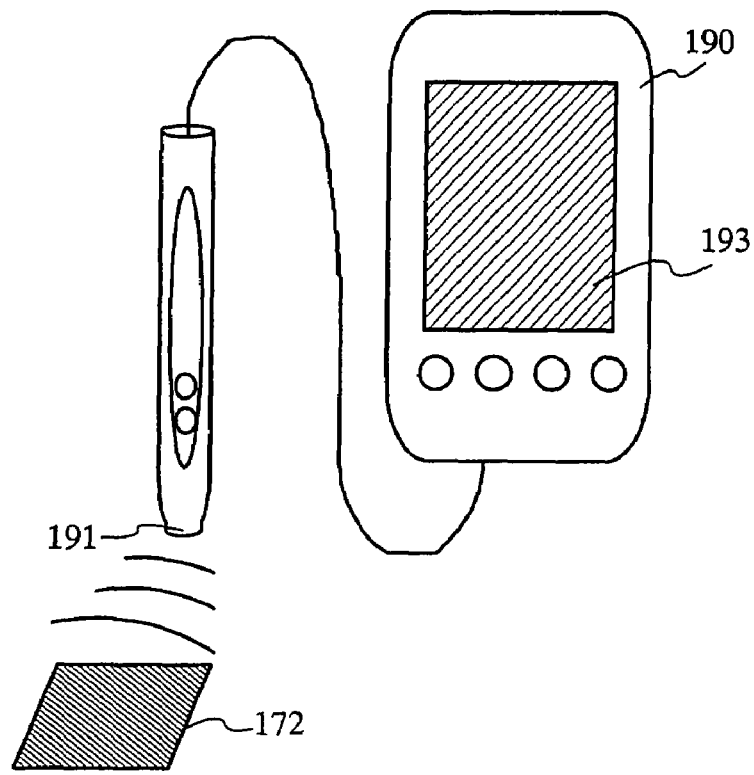

As shown in FIG. 19C, a commercial product 172 carrying an ID label is held over a sensor portion 191 connected to a main body 190 of a personal mobile reader/writer, information is provided on a display portion 193. Then, information on the commercial product is displayed in the same way.

Although the non-contact type reader/writer is described in the present embodiment, information may be displayed on a display portion also in the case of a contact type. A display portion may be provided in a commercial product itself carrying a non-contact type or contact type thin film integrated circuit device to display information.

In this way, as compared with information provided from a conventional radio frequency tag or the like, a consumer can obtain a lot of information on a commercial product freely. Of course, commercial products can be managed quickly and accurately by using a thin film integrated circuit device.

The non-contact type thin film integrated circuit device according to the present invention may be 2 m or less away from the card reader/writer (reader/writer?) (remote type), 70 cm or less away (adjacent type), 10 cm or less away (close type), or several centimeters away (very close type). In consideration of work of a production field or manufacturing floor, the close type or the very close type is preferable.

The frequency to be generally used is 2.45 GHz (microwave) in the remote type, 13.56 MHz in the adjacent type and the close type, or 4.91 MHz or 125 kHz in the very close type. By increasing the frequency to make the wavelength shorter, the number of windings of an antenna can be reduced.

As compared with a contact type thin film integrated circuit device, the non-contact type thin film integrated circuit device is not made to come in contact with the reader/writer, and supply of power source and communication of information are conducted without contact. Therefore, the non-contact type thin film integrated circuit device is not destroyed to have higher ruggedness, it is unnecessary to worry about errors due to a cause such as static electricity. Further, it is easy to handle the thin film integrated circuit device, which may merely be held over the reader/writer with an uncomplicated structure.

Embodiment 11

In the present embodiment, examples of commercial product carrying a thin film integrated device or non-contact type thin film integrated circuit device (for example, an ID chip or an ID label) according to the present invention will be described with reference to FIGS. 20A to 20C and FIGS. 21A to 21C.

Figure 20A:
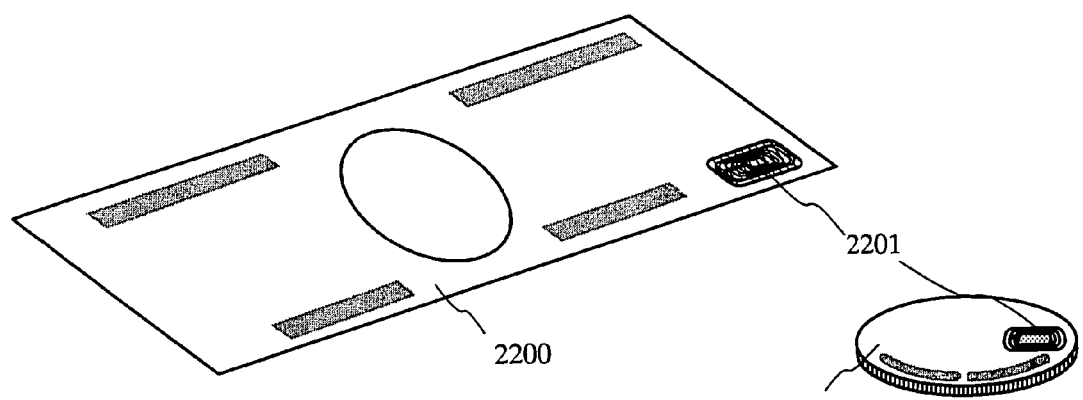
FIGS. 20A to 20C are diagrams for describing examples of a commercial product that has a thin film integrated circuit device according to the present invention.
Figure 20B:
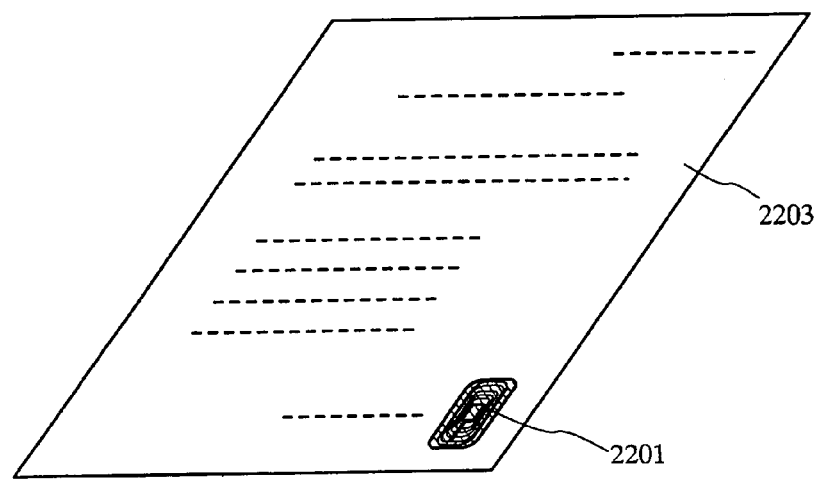
Figure 20C:
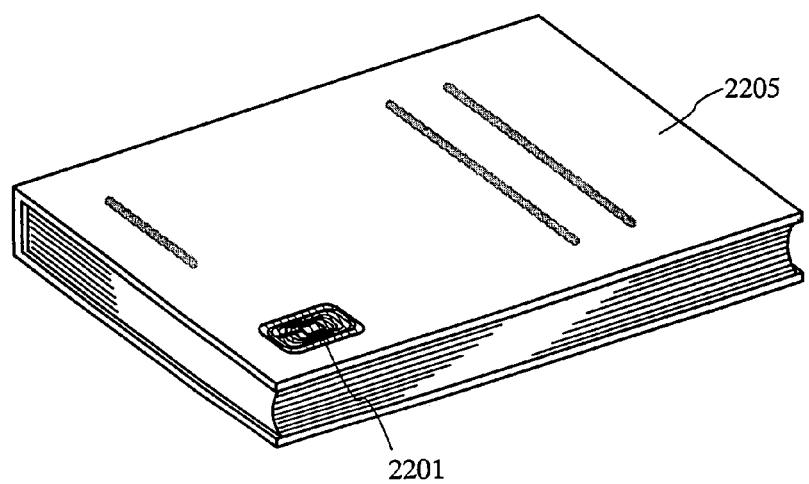

FIG. 20A shows a banknote 2200 (may be securities, a ticket, or a T/C (traveler's check) alternatively) and a coin 2202 (may be a medal, or the like alternatively), which have a thin film integrated circuit device 2201 incorporated. FIG. 20B shows a document 2203 such as a resistance certificate or a family register, which has a thin film integrated circuit device 2201 incorporated. FIG. 20C shows a book 2205, which has a thin film integrated circuit device 2201 incorporated in a book jacket thereof.

The non-contact type or contact type thin film integrated circuit device according to the present invention is quite thin. Therefore, even when the thin film integrated circuit device is incorporated into goods such as the banknote, coin, document, or book described above, the function or design is not damaged. Further, in the case of the non-contact type thin film integrated circuit device, an antenna can be integrated with an IC, and thus, it becomes easier to transfer the thin film integrated circuit device to a commercial product with a curved surface.

Figure 21A:
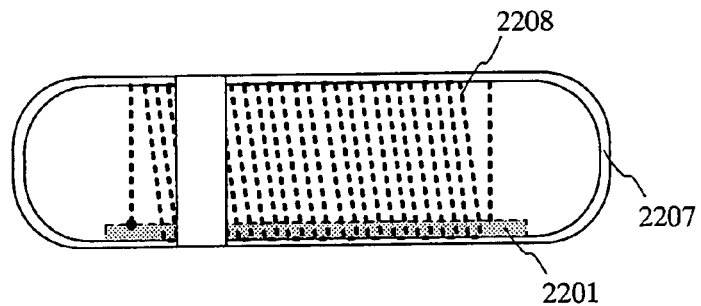
FIGS. 21A to 21D are diagrams for describing examples of a commercial product that has a thin film integrated circuit device according to the present invention.

FIG. 21A shows a capsule 2207, which has a thin film integrated circuit device 2201 incorporated. Inside the capsule 2207, a coiled antenna 2208 is formed, with which the thin film integrated circuit device 2201 can communicate with an external reader/writer. For example, by making a human being or an animal to take capsule 2207, information such as health condition of the human being or the animal can be obtained instantly.

Figure 21B:
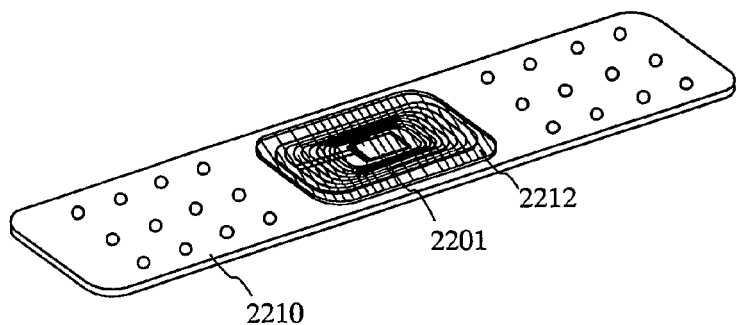

FIG. 21B shows a plaster 2210, which has a thin film integrated circuit device 2201 incorporated. It makes the use as a common plaster possible to provide the thin film integrated circuit device 2201 on the backside of a cover 2212 (as a gauze). In this way, the present invention can be applied to various medical instruments.

Figure 21C:
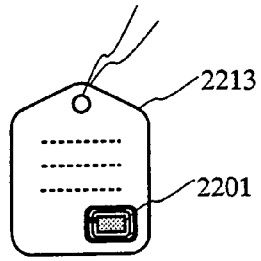

FIG. 21C shows an ID tag 2213, which has a thin film integrated circuit device 2201 incorporated. By mounting the ID tag 2213 on commercial products, the management of the commercial products becomes easier. For example, in the case where the commercial product is stolen, the thief can be figured out quickly by tracing the pathway of the commercial product. In this way, by providing the ID tag, commercial products that are superior in so-called traceability (in the case where a problem is caused at each step of complicated manufacturing or distribution, making an arrangement to figure out the cause quickly by tracing the pathway) can be distributed.

Figure 21D:
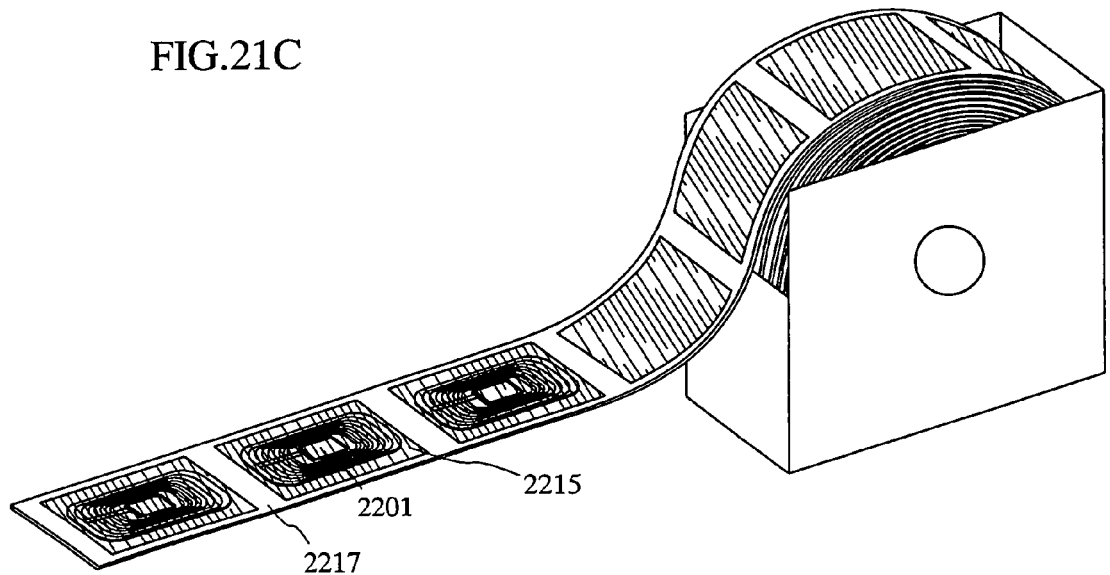

FIG. 21D shows an ID label 2215, which has thin film integrated circuit device 2201 mounted on a label board 2217 and incorporated. On the ID label, information on a commercial product or service (for example, an name of article, a brand, a trademark, a trademark owner, a seller, and a manufacturer) is written, while an ID number that is unique to the commercial product (or the kind of the commercial product) is assigned to the incorporated thin film integrated circuit device to make it possible to easily figure out forgery, infringement of intellectual property rights such as a patent and a trademark, and illegality such as unfair competition. In addition, a lot of information that is too much to write clearly on a container of the commercial product or the label, for example, the production area, selling area, quality, raw material, efficacy, use, quantity, shape, price, production method, directions for use, time of the production, time of the use, expiration date, and instructions of the commercial product, and information on the intellectual property of the commercial product, can be input in the thin film integrated circuit device so that a transactor and a consumer can access the information by using a simple reader. While the producer can also easily rewrite or delete the information, or the like, a transactor or consumer is not allowed to rewrite or delete the information, either.

Although not shown in the figure, it is also possible to manufacture a thin film integrated circuit device by using a metal, or the like that is not harmful for a human body or an animal and mix the thin film integrated circuit device in food to control diet, for example.

In addition to the commercial products described above, the thin film integrated circuit or non-contact thin film integrated circuit device can be used for all kinds of commercial products.

Embodiment 12

In the present invention, a configuration of a non-contact type ID card that has a display device will be described with reference to FIGS. 27A and 27B and FIG. 28.

Figure 27A:
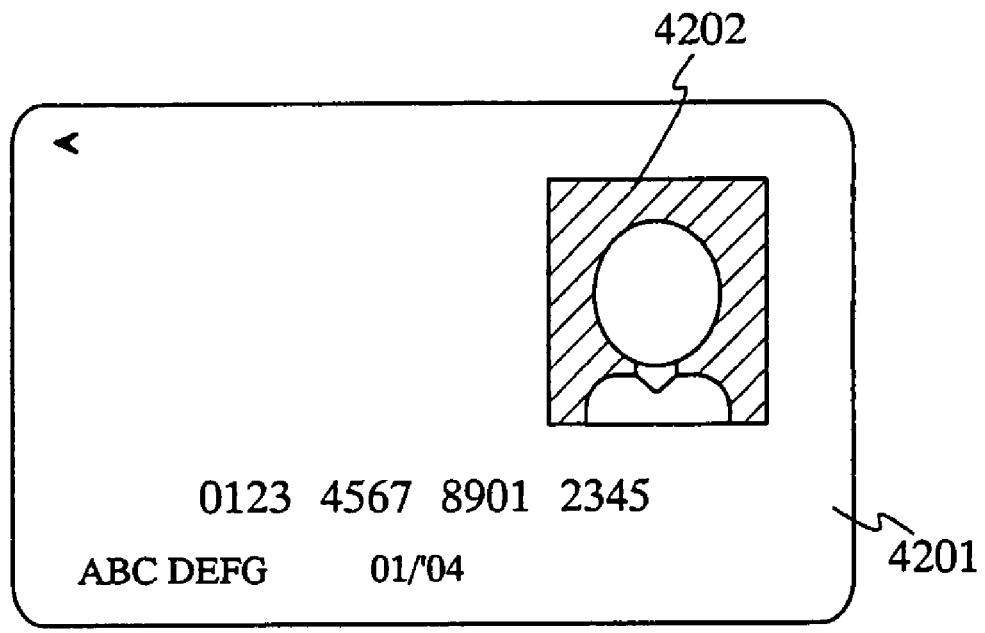
FIGS. 27A and 27B are diagrams illustrating an appearance and internal structure of a non-contact type ID card according to the present invention.

FIG. 27A shows a configuration of an ID card according to the present invention. The ID card shown in FIG. 27A is a non-contact type ID card transmitting and receiving data, without contact, to and from a reader/writer that is a terminal device. Reference numeral 4201 denotes a card body, and reference numeral 4202 corresponds to a pixel portion of a display device mounted on the card body 4201.

Figure 27B:
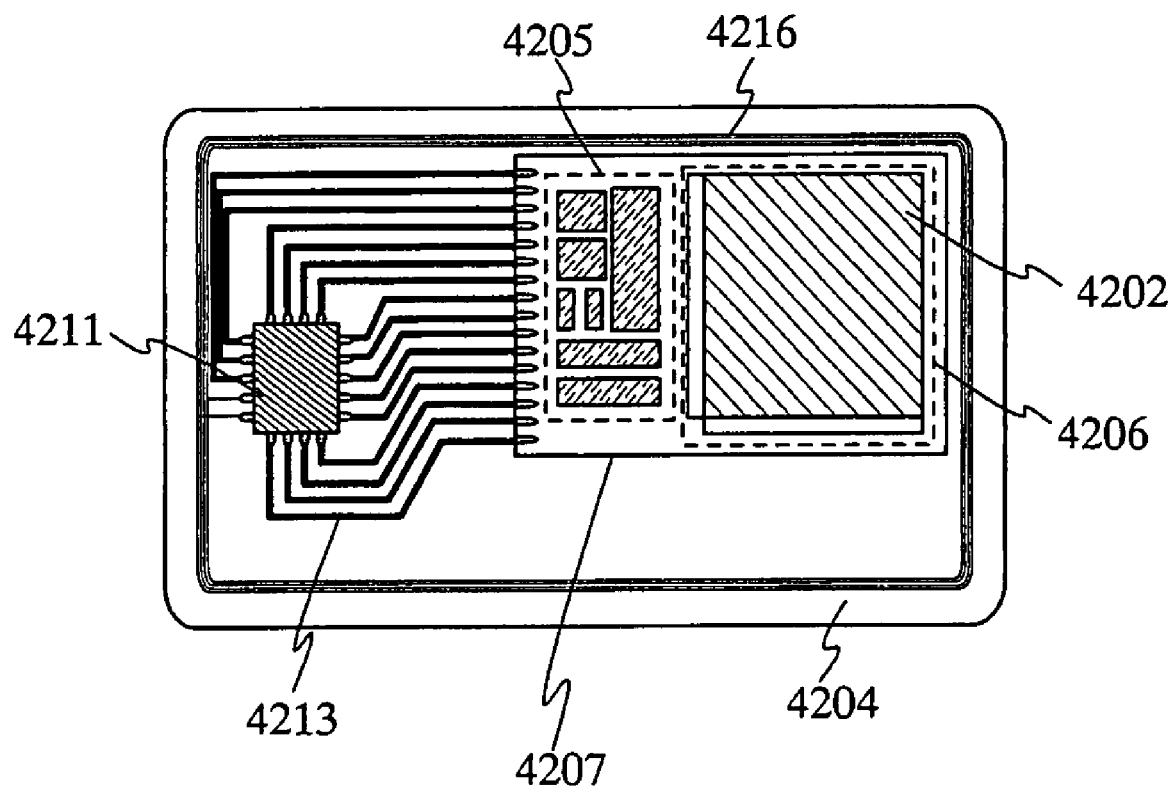

FIG. 27B shows a structure of a card substrate 4204 included in the card body 4201 shown in FIG. 27A. A thin film integrated circuit 4205 formed by using a semiconductor film of a thin film and a display device 4206 are attached to the card substrate 4204. The thin film integrated circuit 4205 and the display device 4206 are both formed on a substrate prepared separately, and then, transferred to the card substrate 4204. As a transfer method, there are a method of forming a plurality of thin film integrated circuit devices according to the present invention and attaching the thin film integrated circuit devices with small vacuum tweezers or a pin and a method of attaching thin film integrated circuit devices selectively by using UV light irradiation. In addition, the pixel portion 4202 and a driver circuit portion in the display device can also be attached after being manufactured according to the present invention. In the specification, a portion including the thin film integrated circuit 4205 and the display device 4206, which is formed by using a semiconductor film of a thin film and transferred to the card substrate after the formation, is referred to as a thin film portion 4207.

Further, an IC chip 4211 using a single-crystal semiconductor is mounted on the card substrate 4204. In the IC chip 4211, an integrated circuit is formed. As for how to mount the IC chip 4211, there is no particular limitation, and a method such as a known COG, wire bonding, or TAB can be used. In the specification, in order to distinguish from the thin film integrated circuit 4205, the integrated circuit formed in the IC chip 4211 is referred to as a single-crystal integrated circuit.

The IC chip 4211 is electrically connected to the thin film portion 4207 through a wiring 4213 formed on the card substrate 4204.

In addition, an antenna coil 4216 electrically connected to the IC chip 4211 is formed on the card substrate 4204. The antenna coil 4216 makes it possible to transmit and receive data to and from a terminal device without contact by using electromagnetic induction. Therefore, the non-contact type ID card is unlikely to be damaged due to physical wear as compared with a contact type ID card. Further, the non-contact type ID card can also be used as a tag for managing information without contact (a radio-frequency tag). In the case of the non-contact ID card, a manageable amount of information is remarkably large as compared with a bar-code from which information can be read similarly without contact. In addition, the distance between the ID card and a terminal device that is able to read information can be made longer as compared with a case of using a car-code.

In the example shown in FIG. 27B, the antenna coil 4216 is formed on the card substrate 4204. However, a separately manufactured antenna coil may be mounted on the cards substrate 4204. For example, a copper wire winded in a coiled shape and interposed between two plastic films with a thickness on the order of about 100 μm, which is pressed, can be used as an antenna coil. Alternatively, an antenna coil may be formed in the thin film integrated circuit 4205. Although only one antenna coil 4216 is used for one ID card in FIG. 27B, a plurality of antenna coils 4216 may be used.

In addition, although FIG. 27 shows the configuration of the ID card carrying the display device, the ID card is not limited to this structure. It is not always necessary to provide a display device. However, providing a display device makes it possible to display data of a facial photograph on the display device, and can make it difficult to switch facial photographs as compared with a case of using printing. Further, information other than a facial photograph can be displayed to make it possible to realize a high-performance ID card.

For the card substrate 4204, a flexible plastic substrate can be used. As the plastic substrate, ARTON comprising a norbornene resin with a polar group (manufactured by JSR) can be used. In addition, plastic substrates such as polyethylene terephthalate (PET), polyether sulphone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT), and polyimide can be used.

In the present embodiment, the electrical connection between the IC chip 4211 and the thin film integrated circuit 4205 is not limited to the configuration shown in FIG. 27B. For example, instead of the connection through the wiring 4213 formed on the card substrate 4204, a terminal of the IC chip 4211 and a terminal of the thin film integrated circuit 4205 may be connected directly with a material such as an anisotropic conductive resin or solder.

In addition, in FIG. 27B, the thin film integrated circuit 4205 and the wiring 4213 formed on the card substrate 4204 may be connected by wire bonding or flip chip bonding with the use of solder ball, may be directly connected with an anisotropic conductive resin or solder, or may be connected by using another method.

Next, functional configurations of an IC chip and thin film integrated circuit in a non-contact type ID card will be described as an example. FIG. 28 shows a block diagram of a non-contact type ID card.

Reference numeral 400 denotes antenna coils for input, and reference numeral 401 denotes antenna coils for output. In addition, reference numeral 402 denotes an interface for input, and reference numeral 403 denotes an interface for output. The number of the various antenna coils is not limited to the number shown in FIG. 28. Alternating-current power supply voltage and various signals input from a terminal device by the antenna coils 400 for input are demodulated or converted into a direct-current in the interface 402 for input, and then, supplied to various circuits such as a CPU 404, a ROM 405, a RAM 406, an EEPROM 407, a coprocessor 408, and a controller 409. Then, signals processed or generated in the above-mentioned various circuits are modulated in the interface 403 for output, and transmitted to the terminal device by the antenna coils 401 for output.

In the interface 402 for the input, a rectifier circuit 420 and a demodulator circuit 421 are provided. The alternating-current power supply voltage input from the antenna coils 400 for input is rectified in the rectifier circuit 420 and supplied to the above-mentioned various circuits as a direct current power supply voltage. In addition, the various alternating-current signals input from the antenna coils 400 for input are demodulated in the demodulator circuit 421. Then, the various signals with waveforms shaped by the demodulation are supplied through a path 429 to the various circuits.

In the interface 403 for output, a modulation circuit 423 and an amplifier 424 are provided. The various signals input from the various circuits to the interface 403 for output are modulated in the modulation circuit 423 and amplified or buffer-amplified, and then, transmitted from the antenna coils 401 for output to the terminal device.

Figure 28:
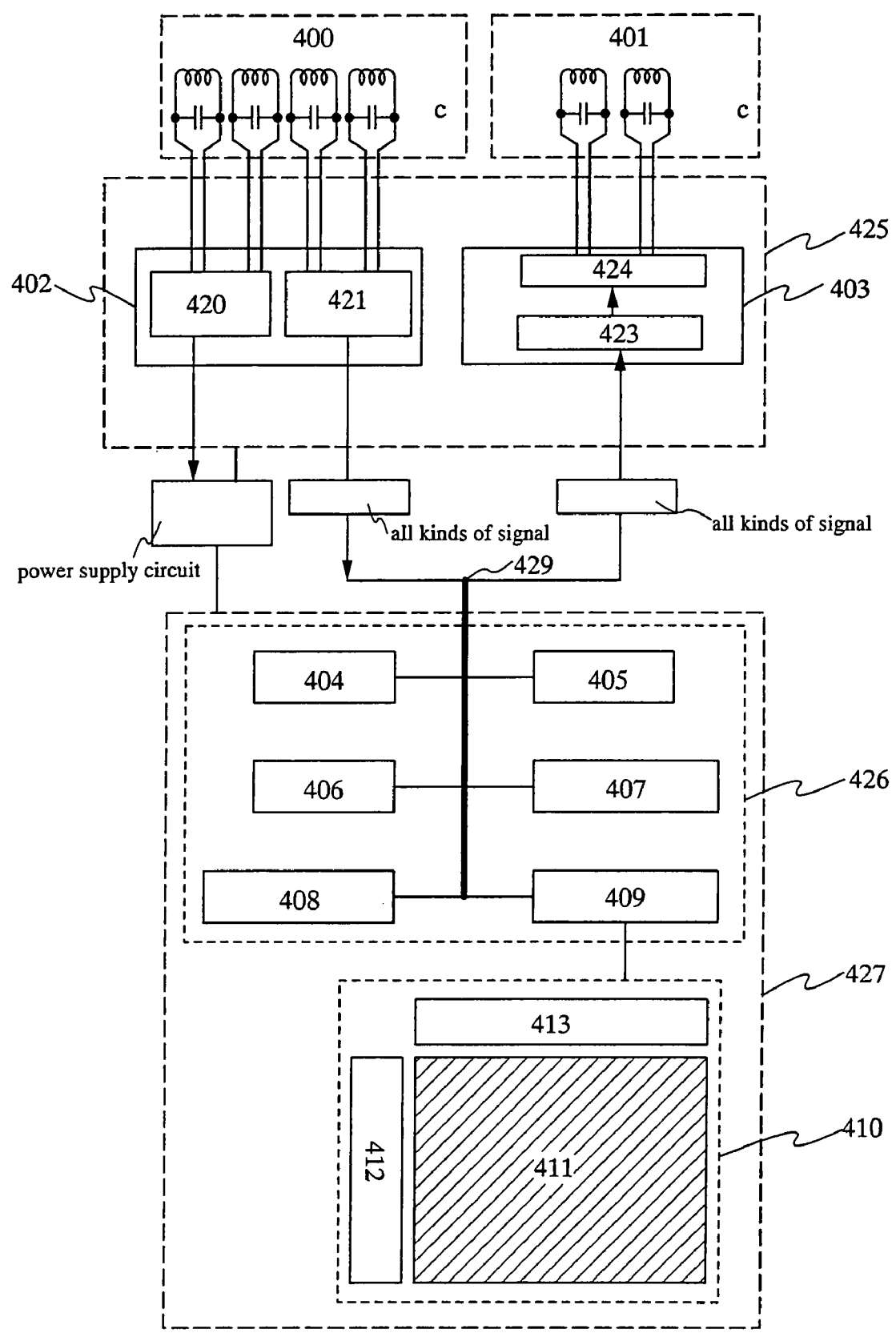
FIG. 28 is a block diagram illustrating a structure of a non-contact type ID card.

The various circuits shown in FIG. 28 are just one example of configurations according to the present invention. The various circuit mounted on the ID card is not limited to the above-mentioned circuits.

In FIG. 28, all processes in the ID card are controlled by the CPU 404, and various programs to be used in the CPU 404 are stored in the ROM 405. The coprocessor 408 is an assistant processor that aids operation the CPU 404 as a main processor. The RAM 406 functions as a buffer during communicating with the terminal device, which is also used as an operation area during processing data. The EEPROM 407 stores data input as signals in a predetermined address.

Image data such as a facial photograph is stored in the EEPROM 407 in the case of storing in a rewritable state, or stored in the ROM 405 in the case of storing in an unrewritable state. Alternatively, a memory for storing image data may be prepared separately.

The controller 409 gives data processing to signals including image data in accordance with the specification of the display device 410 to supply the processed signals to the display device 410 as video signals. Further, the controller 409 generates a Hsync signal, a Vsync signal, a clock signal (CLK), an alternating-current voltage (AC Cont), olkthe power supply voltage and various signals input from the interface 402 for input to supply the generated signals to the display device 410.

In the display device 410, a pixel portion 411 including a display element provided in each pixel, a scan line driver circuit 412 that selects a pixel provided in the pixel portion 411, and a signal line driver circuit 413 that supplies a video signal to the selected pixel are provided.

FIG. 28 shows an example using antenna coils as the non-contact type ca rd. However, the non-contact type ID card is not limited to this example. Light-emitting device (element?) or a optical sensor may be used to transmit and receive data with light.

In FIG. 28, the interface 402 for input and the interface 403 for output, which include an analog circuit such as the rectifier circuit 420, the demodulator circuit 421, or the modulation circuit 423, are formed in an IC chip 425. In addition, the various circuits such as the CPU 404, the ROM 405, the RAM 406, the EEPROM 407, the coprocessor 408, and the controller 409 are formed in a thin film integrated circuit 426, and the thin film integrated circuit 426 and the display device 410 are formed in a thin film portion 427. The configuration described above is just one example, and the present invention is not limited to this configuration. For example, the configuration may have a function such as GPS (Global Positioning System). Although the display device 410 needs to have a function of displaying images, any of active and passive display devices may be employed. For example, small-sized liquid crystal displays (LCD), EL displays, plasma displays, or the like may be manufactured according to a known method and separated from each other, and the display may be attached.

Figure 31:
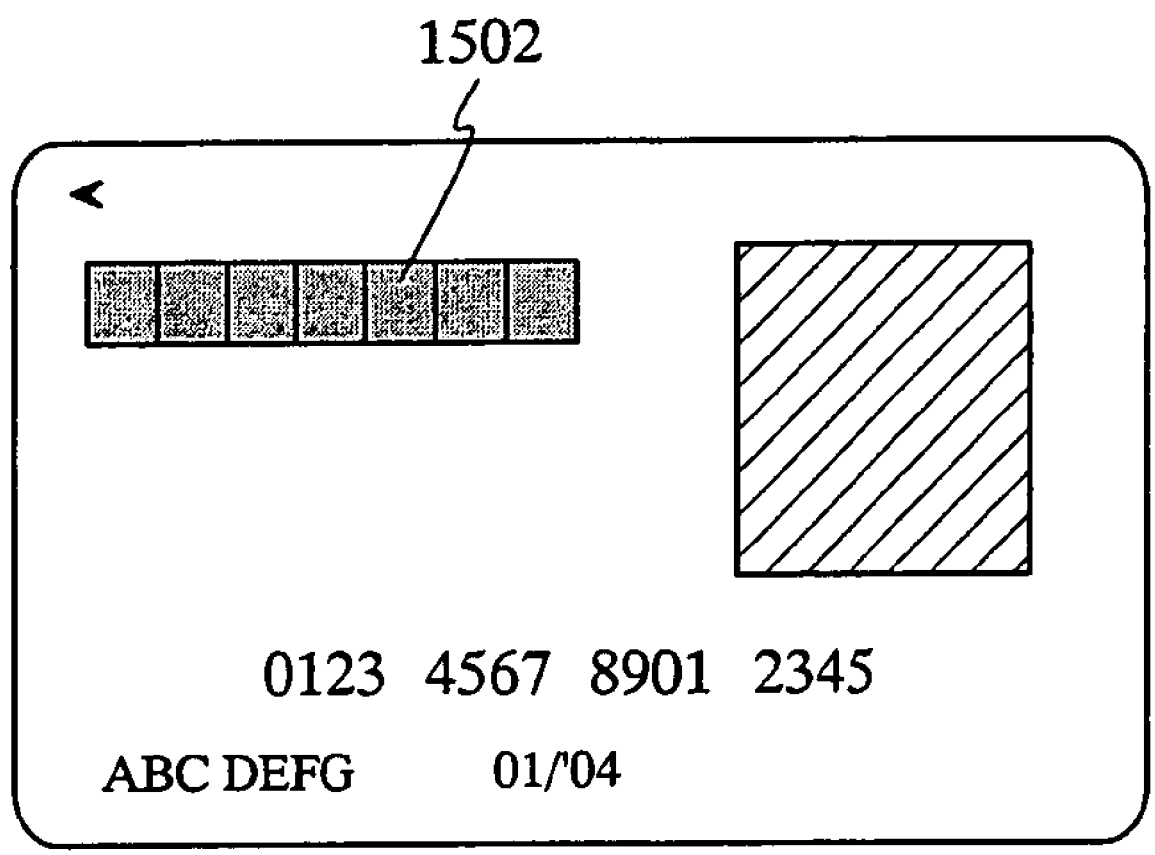
FIG. 31 is an appearance diagram of an ID card carrying a solar cell.

FIG. 28 shows an example of supplying a power supply voltage from a reader/writer of a terminal device. However, the present invention is not limited to this configuration. For example, as shown in FIG. 31, a solar cell 1502 may be provided in an ID card. Alternatively, an extremely thin battery such as a lithium battery may be incorporated.

Embodiment 13

In the present embodiment, a configuration of a contact ID card that has a display device will be described with reference to FIGS. 29A to 29E and FIG. 30.

Figure 29A:
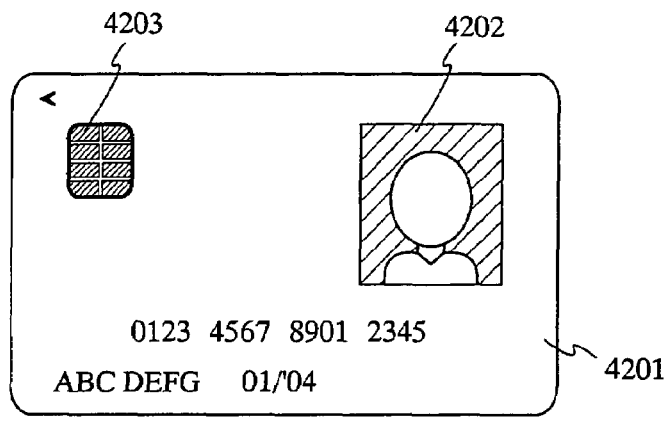
FIGS. 29A to 29E are diagrams illustrating an appearance and internal structure of a contact type ID card according to the present invention.

An ID card shown in FIG. 29A is a contact ID card that transmits and receives data by connecting electrically a connecting terminal provided in the ID card and a reader/writer of a terminal device.

Reference numeral 4201 denotes a card body, and reference numerals 4202 and 4203 respectively correspond to a pixel portion of a display device mounted on the card body 4201 and a connecting terminal of a thin film integrated circuit mounted on the card body 4201. The connecting terminal 4203 is directly connected to a reader/writer of a terminal device for transmitting and receiving between the terminal device and the ID card.

Figure 29B:
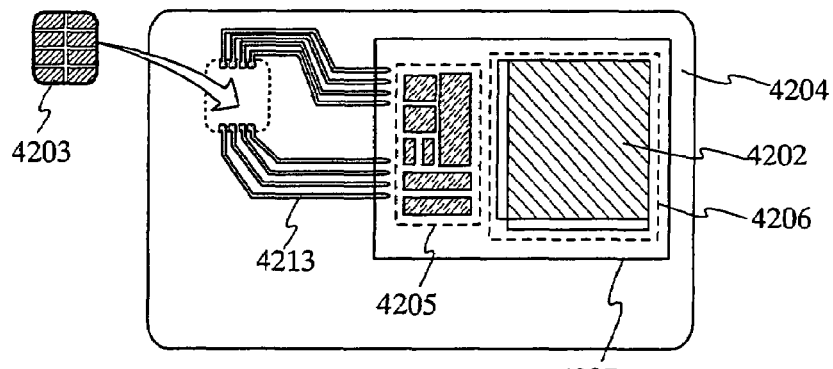

FIG. 29B shows a structure of the card substrate 4204 included in the card body 4201 shown in FIG. 29A. As in FIG. 27B, a thin film integrated circuit 4205 formed by using a semiconductor film of a thin film and a display device 4206 are attached to the card substrate 4204. The thin film integrated circuit 4205 and the display device 4206 are both formed on a substrate prepared separately, and then, transferred to the card substrate 4204. For example, there are a method of forming a plurality of thin film integrated circuit devices according to the present invention and attaching the thin film integrated circuit devices with small vacuum tweezers or a pin and a method of attaching thin film integrated circuit devices selectively by using UV light irradiation. In the specification, the thin film integrated circuit 4205 and the display device 4206 correspond to a thin film portion 4207.

Figures 29C, 29D:
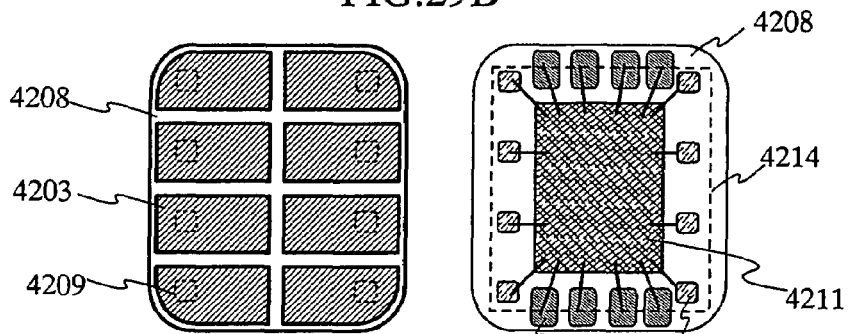

FIG. 29C shows an enlarged view of the connecting terminal 4203 shown in FIGS. 29A and 29B. In addition, FIG. 29D shows an enlarged view of the backside of a printed wiring board 4208 on which the connecting terminal 4203 is formed as shown in FIG. 29C. The connecting terminal 4203 is formed on the printed wiring board 4208, and connected through a contact hole 4209 formed in the printed wiring board 4208 to a terminal 4210 formed on the backside of the printed wiring board 4208. FIG. 29C shows an example of eight connecting terminals 4203 provided. Of course, the number of connecting terminals is not limited to this.

On the backside of the printed wiring board 4208 on which the connecting terminal 4203 is formed, an IC chip 4211 in which a single-crystal integrated circuit is formed is provided. The IC chip 4211 is electrically connected to the terminal 4210. Further, on the backside of the printed wiring board 4208 on which the connecting terminal 4203 is formed, a terminal 4212 for electrically connecting the IC chip 4211 and the thin film integrated circuit 4205 is formed.

FIG. 29D shows a configuration in which the IC chip 4211 is connected to the terminal 4210 and the terminal 4212 by using wire bonding. However, the present invention is not limited to this configuration. Instead of wire bonding, flip chip with the use of solder ball may be used for the connection, or another method may be used for the connection.

As shown in FIG. 29B, the terminal 4212 can be connected to a wiring 4213 formed on the card substrate 4204 by bonding the backside of the printed wiring board 4208 to the card substrate 4204. The IC chip 4211 is electrically connected through the wiring 4213 to the thin film portion 4207.

Figure 29E:
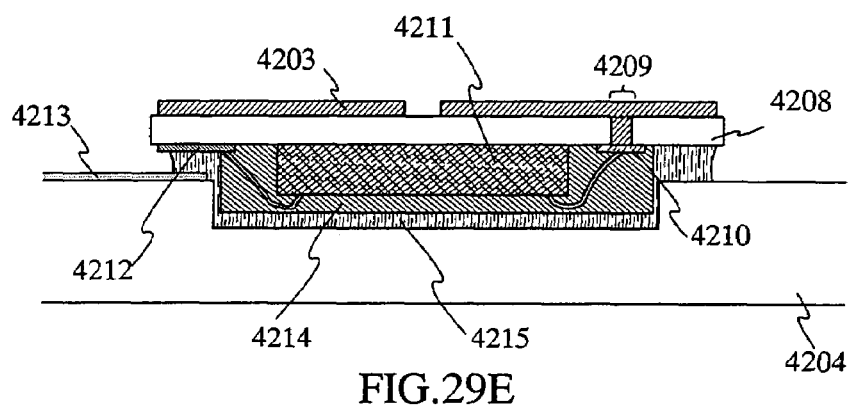

FIG. 29E is a cross-sectional view illustrating a state of the backside of the printed wiring board 4208 bonded to the card substrate 4204. As shown in FIG. 29E, the connecting terminal 4203 and the terminal 4210 are electrically connected through the contact hole 4209, and the IC chip 4211 is electrically connected to the terminal 4210 and the terminal 4212. Further, a mold 4214 including a material such as resin is formed to cover the IC chip 4211 and the terminal 4210. The terminal 4212 is not completely covered with the mold 4214 so that at least a portion of the terminal 4212 is exposed to the mold 4214. The terminal 4212 and the wiring 4213 are electrically connected with an anisotropic conductive resin 4215.

In the case of the contact type ID card, data can be transmitted and received to and from a terminal device through an electrical contact between a reader/writer of the terminal device and the connecting terminal. Therefore, electric power is stably supplied to the ID card as compared with a non-contact type ID card to carry less risk of causing trouble with communication along the way.

In the present embodiment, the electrical connection between the IC chip 4211 and the thin film integrated circuit 4205 is not limited to the configuration shown in FIG. 29B. For example, instead of the connection through the wiring 4213 formed on the card substrate 4204, a terminal of the IC chip 4211 and a terminal of the thin film integrated circuit 4205 may be connected directly with a material such as an anisotropic conductive resin, solder, or the like.

In addition, in FIG. 29B, the thin film integrated circuit 4205 and the wiring 4213 formed on the card substrate 4204 may be connected by wire bonding or flip chip with the use of solder ball, may be directly connected with an anisotropic conductive resin, solder, or the like or may be connected by using another method.

Figure 30:
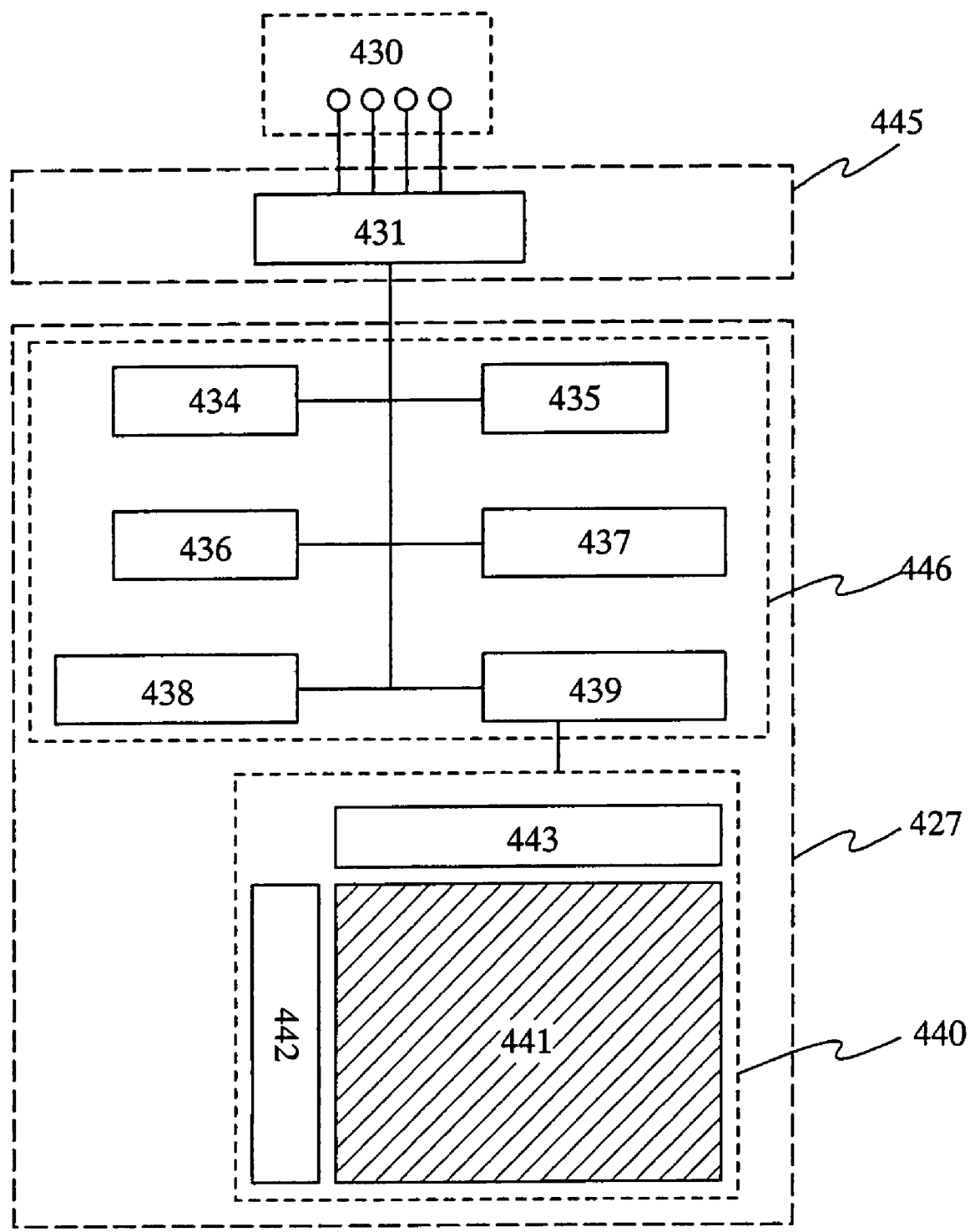
FIG. 30 is a block diagram illustrating a structure of the non-contact type ID card.

Next, functional configurations of an IC chip and thin film integrated circuit in a contact type ID card will be described as an example. FIG. 30 shows a block diagram of a contact type ID card.

Reference numeral 430 denoted connecting terminals, and reference numeral 431 denotes an interface. The number of the various connecting terminals 540 coils is not limited to the number shown in FIG. 30. Power supply voltage and various signals input from the connecting terminal 430 are buffer-amplified in the interface 431, and then, supplied to various circuits such as a CPU 434, a ROM 435, a RAM 436, an EEPROM 437, a coprocessor 438, and a controller 439. Then, signals processed or generated in the above-mentioned various circuits are buffer-amplified in the interface 431, and transmitted to a terminal device. In a display device 440, a pixel portion 441 including a display element provided in each pixel, a scan line driver circuit 442 that selects a pixel provided in the pixel portion 441, and a signal line driver circuit 413 that supplies a video signal to the selected pixel are provided.

The various circuits shown in FIG. 30 are just one example of configurations according to the present invention. The various circuits mounted on the ID card is not limited to the above-mentioned circuits.

In FIG. 30, for example, the interface 431 is formed in an IC chip 445, and the various circuits such as the CPU 434, the ROM 435, the RAM 436, the EEPROM 437, the coprocessor 438, and the controller 439 are formed in a thin film integrated circuit 446. In the case of requiring a higher-capacity memory, one or more of the ROM 435, the RAM 436, and the EEPROM 437 may be formed in the IC chip 445.

The configuration shown in FIG. 30, which includes the IC Chip 445, the thin film integrated circuit 446, and the display device 440, is just one example, and the present invention is not limited to this configuration. For example, the configuration may have a function such as GPS (Global Positioning System). Although the display device 440 needs to have a function of displaying images, any of active and passive display devices may be employed. For example, small-sized liquid crystal displays (LCD), EL displays, or plasma displays may be manufactured according to a known method and separated from each other, and the display may be attached.

As described above, by forming circuits mounted as the IC chip separately from circuits mounted as the thin film integrated circuit, the yield of a total thin film integrated circuit device can be enhanced, and the cost can be reduced. Further, a high-performance ID card can be realized while reducing the size of the IC chip.

FIG. 30 shows an example of supplying a power supply voltage from a reader/writer of a terminal device. However, the present invention is not limited to this configuration. For example, as shown in FIG. 31, a solar cell 1502 may be provided in an ID card. Alternatively, an extremely thin battery such as a lithium battery may be incorporated.

What is claimed is:

1. A method of manufacturing a thin film integrated circuit device comprising:
   forming a plurality of thin film integrated circuit devices on a SOI substrate including an upper single-crystal silicon layer, a layer including one of silicon oxide and silicon nitride, and a lower single-crystal silicon layer;
   forming a groove in a boundary region between the plurality of thin film integrated circuit devices; and
   separating the plurality of thin film integrated circuit devices by introducing one of a gas and a liquid including halogen fluoride into the groove to etch at least a surface of the lower single-crystal silicon layer near the thin film integrated circuit devices.

2. The method according to claim 1, wherein the groove is formed by one of linear laser scribing, dicing, and etching with an insulating film as a mask.

3. The method according to claim 1, wherein one of a heat-resistant insulating film and a heat-resistant tape is formed over the plurality of the thin film integrated circuit devices.

4. The method according to claim 3, wherein the heat-resistant insulating film comprises a material having a skeleton formed by a bond of silicon and oxygen and including at least hydrogen as a substituent or at least one selected from the group consisting of fluoride, an alkyl group, and aromatic hydrocarbon as the substituent.

5. The method according to claim 1, wherein the halogen fluoride is $ClF_3$ (chlorine trifluoride).

6. A method of manufacturing a thin film integrated circuit device comprising:
  forming a plurality of thin film integrated circuit devices on a SOI substrate including an upper single-crystal silicon layer, a layer including one of silicon oxide and silicon nitride, and a lower single-crystal silicon layer;
  forming a groove in a boundary between the plurality of thin film integrated circuit devices;
  temporarily bonding a jig to upper portions of the plurality of thin film integrated circuit devices;
  separating the plurality of thin film integrated circuit devices by introducing one of a gas and a liquid including halogen fluoride into the groove to etch at least a surface of the lower single-crystal silicon layer near the thin film integrated circuit devices; and
  removing the jig bonded to the plurality of thin film integrated circuit devices.

7. The method according to claim 6, wherein the jig is bonded with an adhesive material which has adhesive force to be reduced or lost by UV light.

8. The method according to claim 6, wherein the groove is formed by one of linear laser scribing, dicing, and etching with an insulating film as a mask.

9. The method according to claim 6, wherein one of a heat-resistant insulating film and a heat-resistant tape is formed over the plurality of the thin film integrated circuit devices.

10. The method according to claim 9, wherein the heat-resistant insulating film comprises a material having a skeleton formed by a bond of silicon and oxygen and including at least hydrogen as a substituent or at least one selected from the group consisting of fluoride, an alkyl group, and aromatic hydrocarbon as the substituent.

11. The method according to claim 6, wherein the halogen fluoride is $ClF_3$ (chlorine trifluoride).

12. A method of manufacturing a thin film integrated circuit device comprising:
  forming a plurality of thin film integrated circuit devices on a SOI substrate including an upper single-crystal silicon layer, a layer including one of silicon oxide and silicon nitride, and a lower single-crystal silicon layer;
  forming a groove in a boundary region between the plurality of thin film integrated circuit devices;
  thinning the lower single-crystal silicon layer by polishing;
  separating the plurality of thin film integrated circuit devices by introducing one of a gas and a liquid including halogen fluoride into the groove to etch at least a surface of the lower single-crystal silicon layer near the thin film integrated circuit devices.

13. The method according to claim 12, wherein the groove is formed by one of linear laser scribing, dicing, and etching with an insulating film as a mask.

14. The method according to claim 12, wherein one of a heat-resistant insulating film and a heat-resistant tape is formed over the plurality of the thin film integrated circuit devices.

15. The method according to claim 14, wherein the heat-resistant insulating film comprises a material having a skeleton formed by a bond of silicon and oxygen and including at least hydrogen as a substituent or at least one selected from the group consisting of fluoride, an alkyl group, and aromatic hydrocarbon as the substituent.

16. The method according to claim 12, wherein the halogen fluoride is $ClF_3$ (chlorine trifluoride).

17. A method of manufacturing a thin film integrated circuit device comprising:
  forming a plurality of thin film integrated circuit devices on a SOI substrate including an upper single-crystal silicon layer, a layer including one of silicon oxide and silicon nitride, and a lower single-crystal silicon layer;
  forming a groove in a boundary between the plurality of thin film integrated circuit devices;
  temporarily bonding a jig to upper portions of the plurality of thin film integrated circuit devices;
  thinning the lower single-crystal silicon layer by polishing;
  separating the plurality of thin film integrated circuit devices by introducing one of a gas and a liquid including halogen fluoride into the groove to etch at least a surface of the lower single-crystal silicon layer near the thin film integrated circuit devices; and
  removing the jig bonded to the plurality of thin film integrated circuit devices.

18. The method according to claim 17, wherein the jig is bonded with an adhesive material which has adhesive force to be reduced or lost by UV light.

19. The method according to claim 17, wherein the groove is formed by one of linear laser scribing, dicing, and etching with an insulating film as a mask.

20. The method according to claim 17, wherein one of a heat-resistant insulating film and a heat-resistant tape is formed over the plurality of the thin film integrated circuit devices.

21. The method according to claim 20, wherein the heat-resistant insulating film comprises a material having a skeleton formed by a bond of silicon and oxygen and including at least hydrogen as a substituent or at least one selected from the group consisting of fluoride, an alkyl group, and aromatic hydrocarbon as the substituent.

22. The method according to claim 17, wherein the halogen fluoride is $ClF_3$ (chlorine trifluoride).

23. A method of manufacturing a non-contact type thin film integrated circuit device comprising:
  forming a plurality of thin film integrated circuit devices on a SOI substrate including an upper single-crystal silicon layer, a layer including one of silicon oxide and silicon nitride, and a lower single-crystal silicon layer;
  forming a groove between the plurality of thin film integrated circuit devices;
  separating the plurality of thin film integrated circuit devices by introducing one of a gas and a liquid including halogen fluoride into the groove to etch at least a surface of the lower single-crystal silicon layer near the thin film integrated circuit devices; and
  forming an antenna around the separated thin film integrated circuit device.

24. The method according to claim 23, wherein the halogen fluoride is $ClF_3$ (chlorine trifluoride).

25. The method according to claim 23, wherein the antenna includes one element selected from of the group consisting of Ag, Au, Al, Cu, Zn, Sn, Ni, Cr, Fe, Co, and Ti.

26. The method according to claim 23, wherein the antenna is formed over a flexible substrate.

27. A non-contact type ID tag comprising the non-contact type thin film integrated circuit device according to claim 23.

28. A non-contact type ID card comprising the non-contact type thin film integrated circuit device according to claim 23.

* * * * *